(12) United States Patent
Nakayama et al.

(10) Patent No.: US 8,080,831 B2
(45) Date of Patent: Dec. 20, 2011

(54) SEMICONDUCTOR DEVICE AND MANUFACTURING THE SAME

(75) Inventors: Fumitaka Nakayama, Higashikurume (JP); Masatoshi Morikawa, Hanno (JP); Yutaka Hoshino, Akishima (JP); Tetsuo Uchiyama, Maebashi (JP)

(73) Assignees: Renesas Electronics Corporation, Kanagawa (JP); Renesas Eastern Japan Semiconductor, Inc., Tokyo (JP)

( * ) Notice: Subject to any disclaimer, the term of this patent is extended or adjusted under 35 U.S.C. 154(b) by 0 days.

(21) Appl. No.: 12/784,560

(22) Filed: May 21, 2010

(65) Prior Publication Data

US 2011/0127594 A1 Jun. 2, 2011

Related U.S. Application Data

(60) Continuation of application No. 12/644,968, filed on Dec. 22, 2009, now Pat. No. 7,741,656, which is a continuation of application No. 12/341,330, filed on Dec. 22, 2008, now Pat. No. 7,671,381, which is a division of application No. 11/783,779, filed on Apr. 12, 2007, now Pat. No. 7,479,681, which is a division of application No. 11/493,829, filed on Jul. 27, 2006, now Pat. No. 7,217,987, which is a continuation of application No. 10/670,258, filed on Sep. 26, 2003, now Pat. No. 7,087,977.

(30) Foreign Application Priority Data

Sep. 27, 2002 (JP) .................................. 2002-282366
Dec. 26, 2002 (JP) .................................. 2002-377030

(51) Int. Cl.
*H01L 21/02* (2006.01)

(52) U.S. Cl. ........................................ 257/157; 257/159
(58) Field of Classification Search ................... 257/157, 257/159, 528, 531, 532
See application file for complete search history.

(56) References Cited

U.S. PATENT DOCUMENTS

| | | | |
|---|---|---|---|
| 5,155,563 A | 10/1992 | Davies et al. |
| 5,770,970 A | 6/1998 | Ikeda et al. |
| 5,939,753 A | 8/1999 | Ma et al. |
| 6,037,649 A | 3/2000 | Liou |
| 6,133,079 A | 10/2000 | Zhu et al. |
| 6,355,970 B1 | 3/2002 | Fujii |

(Continued)

FOREIGN PATENT DOCUMENTS

JP 06-013590 1/1994

(Continued)

OTHER PUBLICATIONS

Office Action in JP 2002-377030, dated Jun. 22, 2010 (in Japanese) [3 pages].

*Primary Examiner* — Bradley K Smith
(74) *Attorney, Agent, or Firm* — Antonelli, Terry, Stout & Kraus, LLP.

(57) ABSTRACT

A semiconductor device including a MISFET formed in a well at a main surface of a substrate, a second MISFET formed at a main surface of the substrate, and a passive element formed over the main surface of the substrate and having two terminals. A conductive film is formed at a rear face of the semiconductor substrate. The conductive film is connected with a fixed potential and also electrically connected with the conductive film.

14 Claims, 51 Drawing Sheets

U.S. PATENT DOCUMENTS

| | | | |
|---|---|---|---|
| 6,486,534 | B1 | 11/2002 | Sridharan et al. |
| 6,667,491 | B2 | 12/2003 | Yoneda |
| 6,803,324 | B2 | 10/2004 | Ogawa et al. |
| 6,940,127 | B2 | 9/2005 | Yokogawa et al. |
| 2003/0116823 | A1* | 6/2003 | Yoneda .................. 257/577 |
| 2005/0176399 | A1 | 8/2005 | Aparin |

FOREIGN PATENT DOCUMENTS

| | | |
|---|---|---|
| JP | 7-283414 | 10/1995 |
| JP | 8-195434 | 7/1996 |
| JP | 8-316415 | 11/1996 |
| JP | 09-064758 | 3/1997 |
| JP | 11-243109 | 9/1999 |
| JP | 2000-323651 | 11/2000 |
| JP | 2000-332198 | 11/2000 |
| JP | 2000-340749 | 12/2000 |
| JP | 2001-267320 | 9/2001 |
| JP | 2002-111415 | 4/2002 |
| JP | 2003-188268 | 9/2003 |

* cited by examiner

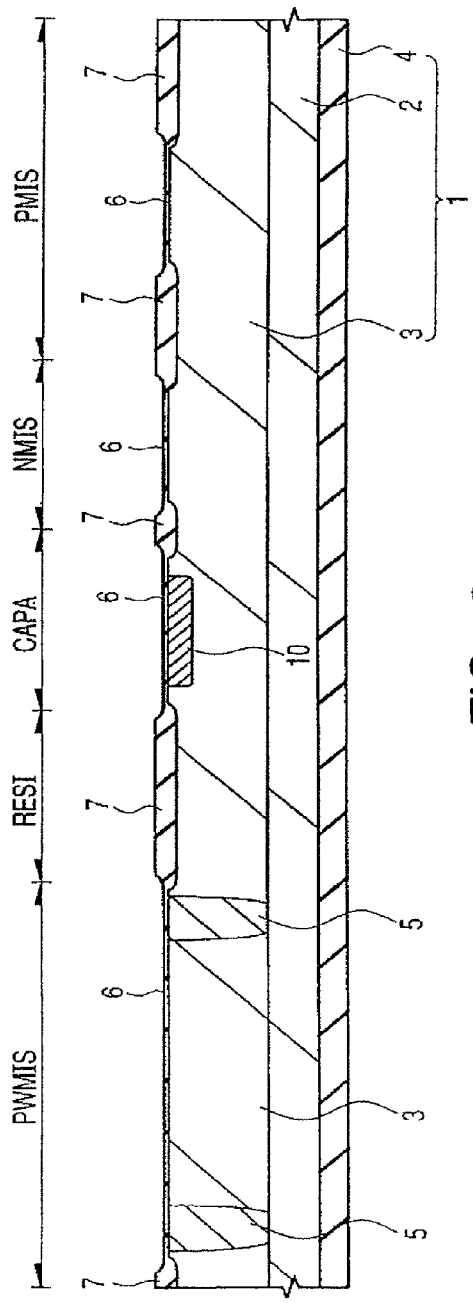
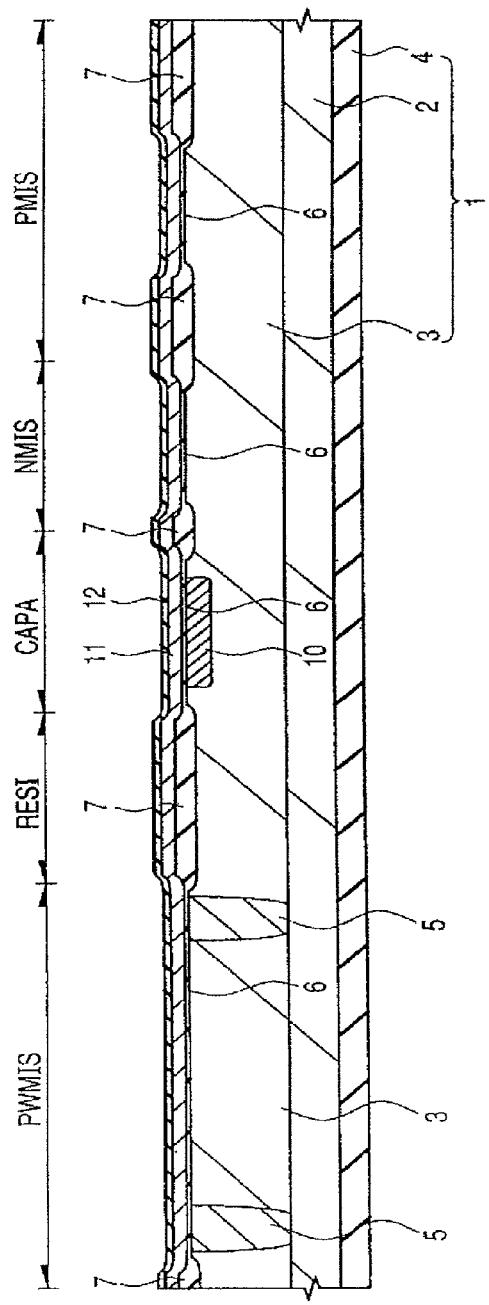

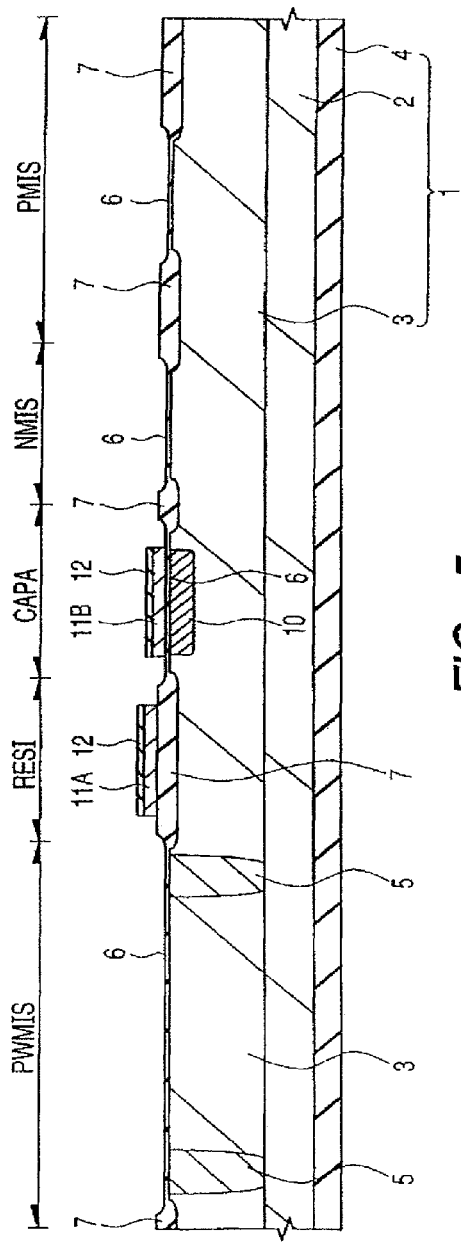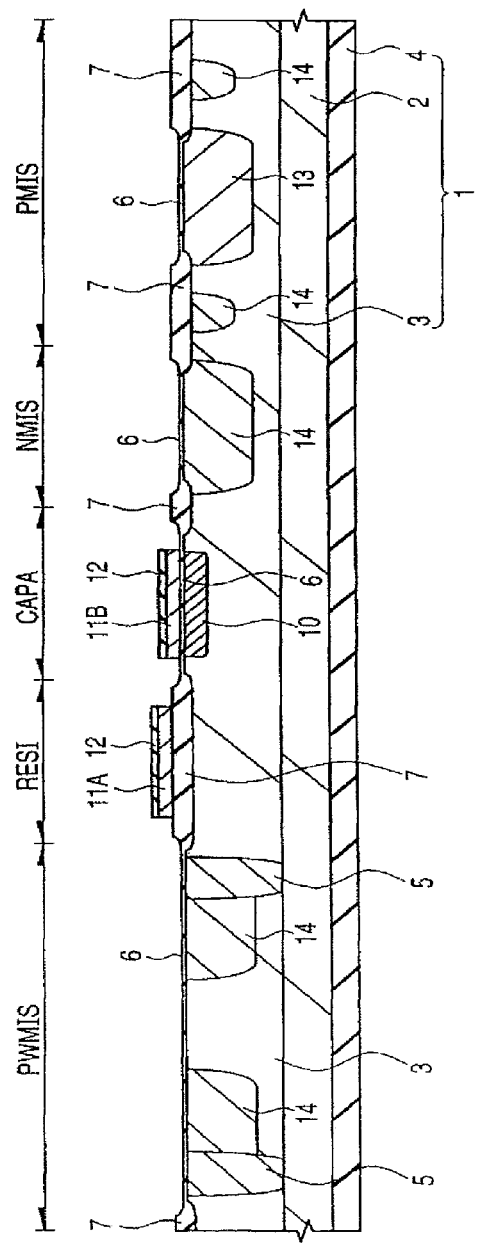

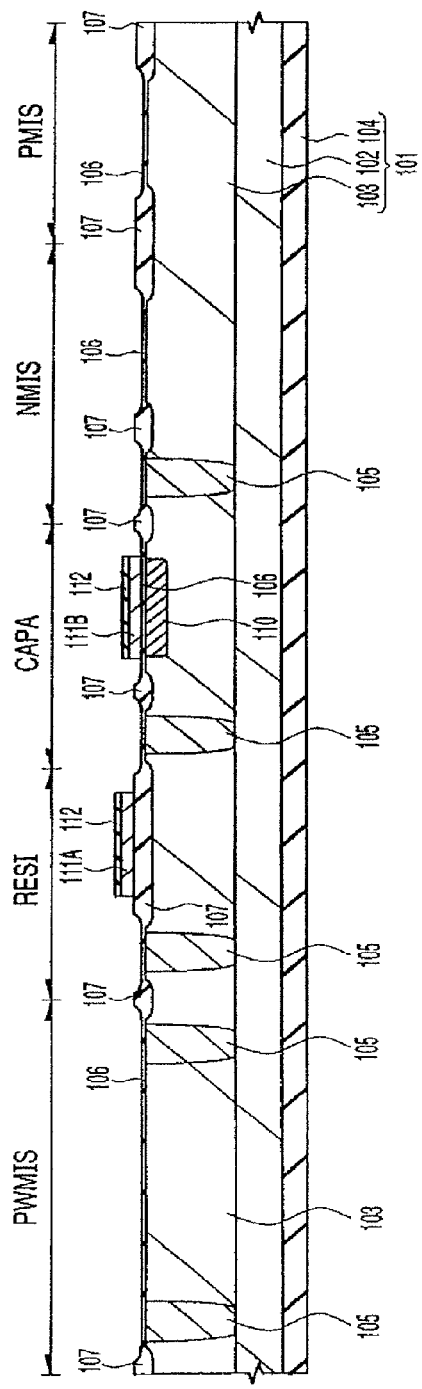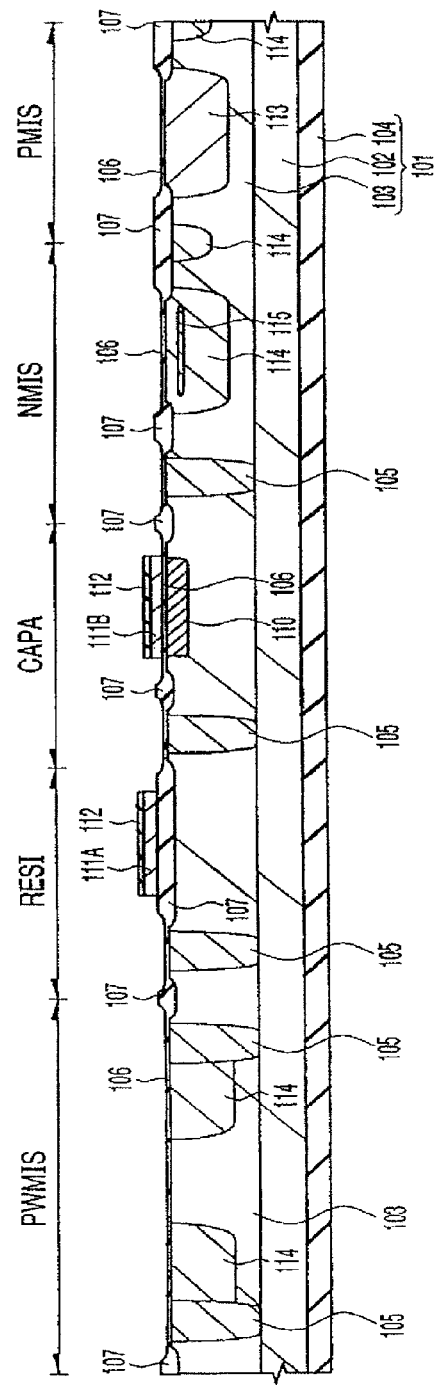

SEMICONDUCTOR DEVICE AND MANUFACTURING THE SAME

CROSS-REFERENCE TO RELATED APPLICATIONS

This application is a continuation of U.S. application Ser. No. 12/644,968, filed Dec. 22, 2009, now U.S. Pat. No. 7,741, 656 which, in turn, is a continuation of U.S. application Ser. No. 12/341,330, filed Dec. 22, 2008 (now U.S. Pat. No. 7,671, 381), which, in turn is a divisional of U.S. application Ser. No. 11/783,779, filed Apr. 12, 2007 (now U.S. Pat. No. 7,479, 681), which, in turn, is a divisional application of U.S. application Ser. No. 11/493,829, filed Jul. 27, 2006 (now U.S. Pat. No. 7,217,987), which, in turn, is a continuation of U.S. application Ser. No. 10/670,258, filed Sep. 26, 2003 (now U.S. Pat. No. 7,087,977), the entire contents of which are incorporated herein by reference.

BACKGROUND OF THE INVENTION

The present invention is directed to a technique for manufacturing a semiconductor device; and, more particularly, it relates to a technique which is effective when applied to the manufacture of a semiconductor device, including a power MISFET (Metal Insulator Semiconductor Field Effect Transistor).

In recent years, there has been a demand for reducing the size of mobile communication equipment, including portable telephones; and, along therewith, a study has been conducted for integrating the high frequency devices contained in mobile communication equipment (for example, refer to Patent Document 1).
[Patent Document 1]
Japanese Unexamined Patent Publication No. 2002-111415 (page 3)

SUMMARY OF THE INVENTION

A transmission power amplifier for amplification of high frequency power is an important component in a high frequency device included in mobile communication equipment. The present inventors now have under development a technique of forming power MISFETs (including a power MOSFET (Metal Oxide Semiconductor Field Effect Transistor) controlling CMOS (Complementary MOS) circuits, resistor elements and capacitor elements contained in a transmission power amplifier into one semiconductor chip (hereinafter simply referred to as a chip) with the aim of reducing the size of the transmission power amplifier. In the course of this development, for the purpose of suppressing an increase in the chip manufacturing cost, the present inventors have studied a technique for incorporating the manufacturing steps for fabrication of controlling CMOS circuits, resistor elements and capacitor elements into the existent manufacturing steps for a MISFET, without increasing the number of steps as much as possible.

In the transmission power amplifier in which plural amplification stages are connected in cascade, an inter-stage matching circuit is necessary for electrical matching between each of the stages. Thus, with an aim of further reducing the size of the transmission power amplifier, the present inventors have also studied a technique of forming the inter-stage matching circuit together with the MISFETs, the controlling CMOS circuits, the resistor elements and the capacitor elements in one chip.

The present invention intends to provide a technique capable of forming a power MISFET of desired characteristics, a controlling CMOS circuit, resistor elements and capacitor elements in one chip without increasing the number of manufacturing steps.

The foregoing and other objects and novel features of the present invention will become apparent from the descriptions of the present specification and from the accompanying drawings.

Among the features of the invention disclosed in the present application, an outline of typical aspects of the invention will be briefly described below.

That is, the present invention provides a method of manufacture of a semiconductor device comprising the steps of: forming a first silicon film over a semiconductor substrate and forming a first dielectric film over the first silicon film; patterning the first dielectric film and the first silicon film thereby forming, in the first region within the main surface of the semiconductor substrate, a lower electrode of a capacitor element comprising the first silicon film and a capacitor insulation film of the capacitor element comprising the first dielectric film and forming a resistor element comprising the first silicon film in the second region within the main surface of the semiconductor substrate; forming a first conductive film over the semiconductor substrate in the presence of the lower electrode and the capacitor insulation film of the capacitor element and the resistor element; and patterning the first conductive film thereby forming an upper electrode of the capacitor element comprising the first conductive film over the capacitor insulation film and forming a gate electrode of a power MISFET comprising the first conductive film in the third region on the main surface of the semiconductor substrate.

Further, the present invention provides a method of manufacture of a semiconductor device comprising the steps of: forming a first silicon film over a semiconductor substrate and forming a first dielectric film over the first silicon film; patterning the first dielectric film and the first silicon film thereby forming, in the first region within the main surface of the semiconductor substrate, a lower electrode of a capacitor element comprising the first silicon film and a capacitor insulation film of the capacitor element comprising the first dielectric film; forming a first conductive film over the semiconductor substrate in the presence of the lower electrode and the capacitor insulation film of the capacitor element; patterning the first conductive film thereby forming the upper electrode of the capacitor element comprising the first conductive film over the first portion of the lower electrode; forming a second dielectric film over the semiconductor substrate in the presence of the lower electrode, the capacitor insulation film and the upper electrode of the capacitor element; etching the second dielectric film and the capacitor insulation film using the upper electrode as an etching stopper thereby forming a first hole reaching the upper electrode and a second hole reaching a second portion of the lower electrode excepting for the first portion; forming plugs in the first hole and in the second hole; forming a second conductive film over the second dielectric film in the presence of the plugs; and patterning the second conductive film thereby forming a first wiring comprising the second conductive film and electrically connecting with the upper electrode and a second wirings comprising the second conductive film and electrically connecting with the lower electrode.

Further, the present invention provides a method of manufacture of a semiconductor device comprising the steps of: forming a first silicon film over a semiconductor substrate and forming a first dielectric film over the first silicon film; patterning the first dielectric film and the first silicon film thereby forming, in the first region within the main surface of the semiconductor substrate, a lower electrode of a capacitor element comprising the first silicon film and a capacitor insulation film of the capacitor element comprising the first dielectric film, and forming a resistor element comprising the first silicon film in the second region within the main surface of the semiconductor substrate; forming a first conductive film over the semiconductor substrate in the presence of the lower electrode and the capacitor insulation film of the capacitor element, and the resistor element; patterning the first conductive film, thereby forming the upper electrode of the capacitor element comprising the first conductive film over the capacitor insulation film, forming the gate electrode of a first conduction type power MISFET comprising the first conductive film in the third region on the main surface of the semiconductor substrate, forming the gate electrode of the first conduction type first MISFET comprising the first conductive film in the fourth region on the main surface of the semiconductor substrate, and forming the gate electrode of a second conduction type second MISFET comprising the first conductive film in the fifth region on the main surface of the semiconductor substrate; introducing second conduction type impurities into a region for preventing the short channel effect of the power MISFET; and introducing second conduction type impurities into a region for preventing the short channel effect of the first MISFET before the step (e) or after the step (e) in which the gate length of the gate electrode of the power MISFET is formed smaller than the gate length of the gate electrode of the second MISFET.

According to the present invention, (a) plural wiring layers are formed on a semiconductor substrate, and (b) active elements and inductors are formed on the semiconductor substrate in which the inductors are formed to the uppermost wiring layer among the plural wiring layers.

The present invention provides a semiconductor device described above in which (a) a first wiring layer and a second wiring layer above the first wiring layer are formed over a semiconductor substrate, (b) a first capacitor element having a first lower electrode and a first upper electrode, and a second capacitor element having a second lower electrode and a second upper electrode are formed over the semiconductor substrate wherein the first lower electrode and the second lower electrode are formed, respectively, to the first wiring layer and the second wiring layer, a first circuit operating in a first frequency band and a second circuit operating in a second frequency band are formed over the semiconductor substrate, the first capacitor element is included in the first circuit and the second capacitor element is included in the second circuit, and the frequency included in the first frequency band is lower than the frequency included in the second frequency band.

Further, the present invention provides a semiconductor device having, on a semiconductor substrate, (a) a MISFET formed of source, drain, and gate electrode, (b) resistor element, (c) a first capacitor element formed of a first lower electrode and a first upper electrode, (d) a second capacitor element formed of a second lower electrode and a second upper electrode, and (e) an inductor, wherein a first silicon layer and a second silicon layer disposed on the first silicon layer are formed over the semiconductor substrate, a first metal layer, a second metal layer disposed on the first metal layer and a third metal layer disposed on the second metal layer are formed over the semiconductor substrate, the first silicon layer forms the first lower electrode of the first capacitor element and the resistor element, the second silicon layer forms the first upper electrode of the first capacitor element and the gate electrode of the MISFET, and the first metal layer forms the second lower electrode of the second capacitor element, the second metal layer forms the second upper electrode of the second capacitor element, and the third metal layer forms the inductor.

Further, the present invention provides a semiconductor device in which (a) a passive element having two terminals is formed over the main surface of a semiconductor substrate, (b) a conductive film is formed to the rear face of the semiconductor substrate, (c) the conductive film is connected with a fixed potential and one of the terminals of the passive element is electrically connected with the conductive film.

Further, the present invention provides a semiconductor device including (a) a well formed to the main surface of the semiconductor substrate, and (b) a first MISFET having source, drain and gate disposed in the well over the main surface of the semiconductor substrate, the conductive film is formed to the rear face of the semiconductor substrate, the conductive film is connected with a fixed potential, and the well is electrically connected with the conductive film.

Further, the present invention provides a semiconductor device having a first circuit block and a second circuit block formed over a semiconductor substrate and a conductive film formed to the rear face of the semiconductor substrate and connected with a ground potential, wherein (a) the first circuit block and the second circuit block include one of a circuit amplifying high frequency power or a circuit controlling the circuit block amplifying high frequency power, (b) each of the first circuit block and the second circuit block has an impurity layer formed by introduction of impurities, and the first circuit block and (c) the second circuit block are electrically connected by way of the impurity layer with the conductive film.

Further, the present invention provides a method of manufacturing a semiconductor device including the steps of: forming a first insulation film over a semiconductor substrate, planarizing the surface of the first insulation film, forming a first conductive film on the first insulation film and patterning the first conductive film, forming a second insulation film on the first conductive film and patterning the second insulation film, and forming a second conductive film on the second insulation film and patterning the second conductive film, thereby forming a second capacitor element having the first conductive film as a lower electrode, the second insulation film as the capacitor dielectric film and the second conductive film as the upper electrode.

BRIEF DESCRIPTION OF THE DRAWINGS

FIG. 1 is a cross sectional view of a main portion of a semiconductor device illustrating a step in the method of manufacturing the semiconductor device as an embodiment of the present invention;

FIG. 2 is a cross sectional view of the main portion of the semiconductor device during a manufacturing step of the semiconductor device succeeding the step of FIG. 1;

FIG. 4 is a cross sectional view of the main portion of the semiconductor device during a manufacturing step succeeding to the step of FIG. 2;

FIG. 5 is a cross sectional view of the main portion of the semiconductor device during a manufacturing step succeeding the step of FIG. 4;

FIG. 31 is a cross sectional view of the main portion of the semiconductor device during a manufacturing step succeeding the step of FIG. 28;

FIG. 32 is a cross sectional view of the main portion of the semiconductor device during a manufacturing step succeeding the step FIG. 31;

DETAILED DESCRIPTION OF THE PREFERRED EMBODIMENTS

Figure 3:
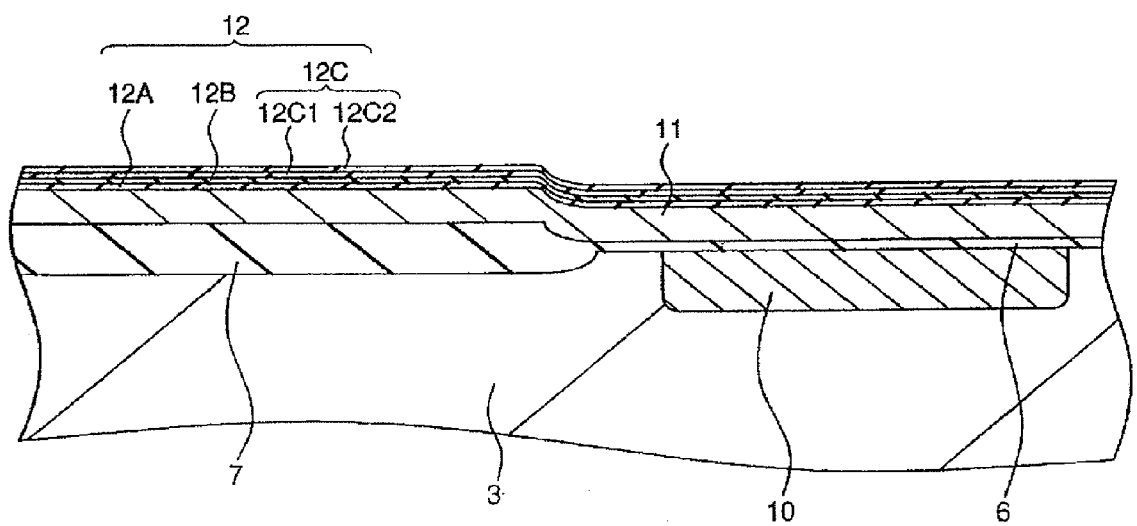
FIG. 3 is a cross sectional view of the main portion of the semiconductor device during manufacture of the semiconductor device as an embodiment of the invention.
Figure 6:
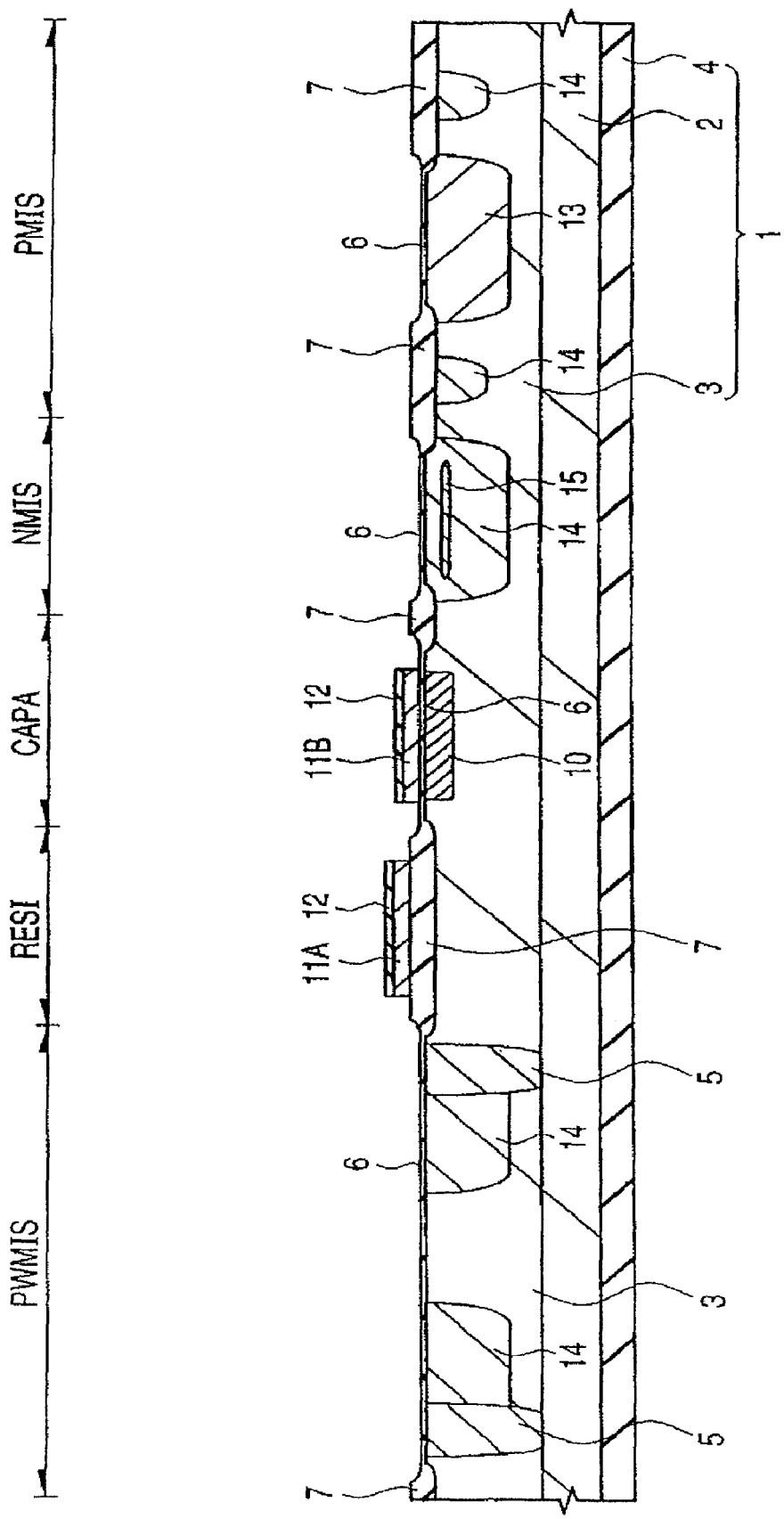
FIG. 6 is a cross sectional view of the main portion of the semiconductor device during a manufacturing step succeeding the step of FIG. 5.

The present invention will be described in detail by way of preferred embodiments with reference to the drawings. Throughout the drawings, components having same the functions are identified by the same reference numerals, and a duplicate description thereof is omitted. In the description of the preferred embodiments, hatchings may sometimes be applied also to plan views for easy understanding of the constitutions and positional relation thereof.

The semiconductor device of this embodiment is a chip comprising, for example, an n-channel type power MISFET, a resistor element, a capacitor element used in the circuit (first circuit) for a low frequency band (first frequency band (including 100 MHz)), a capacitor element used in the circuit (second circuit) for a high frequency band (second frequency band (including 800 MHz to 900 MHz or 1.8 GHz to 1.9 GHz)), an inductor, an n-channel type MISFET and a p-channel type MISFET serving as a switching element used in the circuit operating at the high frequency band, for amplifying high frequency power. Further, the resistor element, the capacitor element used in the circuit for the low frequency band and the n-channel type MISFET and the p-channel type MISFET serving as the switching element constitute a controlling CMOS circuit (analog circuit) serving as the circuit operating in the low frequency band. Manufacturing steps for fabrication of the semiconductor device of the embodiment described above will be explained with reference to FIG. 1 to FIG. 54.

Embodiment 1

At first, a substrate 1, as shown in FIG. 1, is provided. The substrate 1 comprises a semiconductor substrate 2 comprising single crystal silicon with a resistivity of about 3 mmΩ to 6 mmΩ, a single crystal silicon layer 3 epitaxially grown on the main surface of the semiconductor substrate 2 and a silicon oxide film 4 formed on the rear face of the semiconductor substrate 2. The single crystal silicon layer 3 is doped with impurities of a p-conduction type (for example, B (boron)) and has, for example, a resistivity of about 18 Ωcm to 23 Ωcm and a thickness of about 2.9 μm to 3.1 μm. The silicon oxide film 4 has a function of protecting the rear face of the semiconductor substrate 2 from contamination and damage. Further, the substrate is divided, for example, into a region formed with a protection diode in the succeeding step (not illustrated), a region (third region) formed with an n-channel (first conduction type) power MISFET PWMIS, a region (second region) formed with a resistor element RESI, a region (first region) formed with a capacitor element CAPA, a region (fourth region) formed with an n-channel MISFET (first MISFET) NMIS, and a region (fifth region) formed with a p-channel (second conduction type) MISFET (second MISFET) PMIS.

Then, impurity ions having a p-conduction type (for example, B) are introduced to the single crystal silicon layer 3 using a photoresist film (not illustrated) patterned by photolithography as a mask thereby forming a $p^{++}$ semiconductor region 5. Then, the photoresist film is removed.

Successively, a heat treatment is applied at about 850° C. to the substrate to form a thin silicon oxide film 6 of about 15 nm thickness to the surface of the single crystal silicon layer 3 and the $p^{++}$ semiconductor region 5. Then, a silicon nitride film of about 140 nm thickness (not illustrated) is deposited on the silicon oxide film 6 by a CVD method. Then, the silicon nitride film is patterned (etched) using a photoresist film (not illustrated) patterned by photolithography as a mask. Then, after removing the photoresist film, a heat treatment is applied to the substrate 1 by using steam at about 1050° C. for about 33 min to selectively increase the thickness of the silicon oxide film 6, thereby forming a field insulation film 7 of about 350 nm thickness. The region formed with the field insulation film 7 can be defined as a device isolation region and other regions can be defined as device forming region (active region). Successively, the silicon nitride film that remains on the silicon oxide film is removed by cleaning the substrate 1.

Then, impurity ions having a n-conduction type (for example As (arsenic)) are introduced to the region CAPA to be formed with a capacitor element by the subsequent step using a photoresist film patterned by photolithography as a mask, thereby forming an n-semiconductor region 10. The role of the n-semiconductor region 10 will be described specifically in connection with the process where the capacitor element is completed in the region CAPA.

Then, as shown in FIG. 2, an intrinsic polycrystal silicon film (first silicon film) 11 of about 150 nm is deposited over the substrate 1. Successively, an ONO film (first dielectric film) 12 is deposited on the polycrystal silicon film 11. The deposition step for the ONO film 12 will be described in detail with reference to FIG. 3.

FIG. 3 is a cross sectional view of a main portion showing the vicinity of the regions RES, and CAPA in an enlarged scale. After depositing the polycrystal silicon film 11, a heat treatment at about 800° C. is applied at first to the substrate 1, thereby forming a thin silicon oxide film (first silicon oxide film) 12A at about 4 to 5 nm on the surface of the polycrystal silicon film 11. Successively, impurity ions having a n-conduction type (for example, P (phosphorus)) are introduced into the polycrystal silicon film 11. The impurity ions introduced into the polycrystal silicon film 11 can be diffused favorably into the polycrystal silicon film 11 by the hysteresis of the heat treatment in the production steps after forming the resistance element, and the resistance element can be activated favorably upon forming the resistance element from the polycrystal silicon film 11 in the subsequent step.

Successively, a silicon nitride film (first silicon nitride film) 12B at about 20 nm thickness is deposited on the silicon oxide film 12A, for example, by a CVD method. Successively, the surface of the silicon nitride film 12B is oxidized by a heat treatment at about 1100° C. to form a silicon oxide film (second silicon oxide film) 12C1. Successively, a silicon oxide film (third silicon oxide film) 12C2 at about 15 nm thickness is deposited on the silicon oxide film 12C1 by a CVD method to form a silicon oxide film 12C comprising the silicon oxide films 12C1 and 12C2. The ONO film 12 can be formed from the silicon oxide film 12A, the silicon nitride film 12B, and the silicon oxide film 12C. The ONO film 12 is fabricated to a capacitor insulation film of the capacitor element in the subsequent step. Further, by stacking the silicon oxide film 12C2 on the silicon oxide film 12C1 upon forming the silicon oxide film 12C, the resistance of the ONO film 12 to the time dependent dielectric breakdown can be improved. This can improve the reliability of the capacitor element to be formed in the subsequent step.

Then, as shown in FIG. 4, the ONO film 12 and the polycrystal silicon film 11 are patterned by etching using a photoresist film (not illustrated) patterned by photolithography as a mask. Thus, a resistor element 11A comprising the polycrystal silicon film 11 is formed in the region RESI to be formed with the resistor element, and a lower electrode 11B for the capacitor element comprising the polycrystal silicon film 11 is formed in the region CAPA to be formed with the capacitor element. Further, a capacitor insulation film of the capacitor element comprising the patterned ONO film 12 can be formed in the region CAPA.

Then, after removing the photoresist film used for patterning the ONO film 12 and the polycrystal silicon film 11, impurity ions having n-conduction type (for example, P) are introduced into the single crystal silicon layer 3 of the region PMIS to be formed with the p-channel MISFET using another photoresist film (not illustrated) patterned by photolithography as a mask, as shown in FIG. 5.

Successively, after removing the photoresist film used for forming the n-channel 13, impurity ions having a p-conduction type (for example, B) are introduced by using another photoresist film (not illustrated) patterned by photolithography as a mask to form a p-well 14 to the polycrystal silicon layer 3 of the region PWMIS to be formed with the n-channel type power MISFET and a region NMIS to be formed with the n-channel type MISFET. Further, a p-well 14 is formed also to the single crystal silicon layer below the field insulation film 7 surrounding the active region in the region PMIS. The p-well 14 formed below the field insulation film 7 can function as a channel stopper after forming the p-channel type MISFET in the region PMIS.

Then, after removing the photoresist film used for forming the p-well 14, impurity ions having p-conduction type (for example, $BF_2$ (boron difluoride)) are introduced by using another photoresist film (not illustrated) newly patterned by photolithography, thereby forming a $p^-$-semiconductor region 15 in the region NMIS. By the formation of the $p^-$-semiconductor region 15, the threshold voltage for the n-channel type MISFET to be formed in the region NMIS by the subsequent step can be controlled. Further, since there may be a concern for the possible occurrence of punch through due to the short channel effect as the gate length is smaller in the MISFET, the $p^-$-semiconductor region 15 is formed to suppress the short channel effect.

Figure 7:
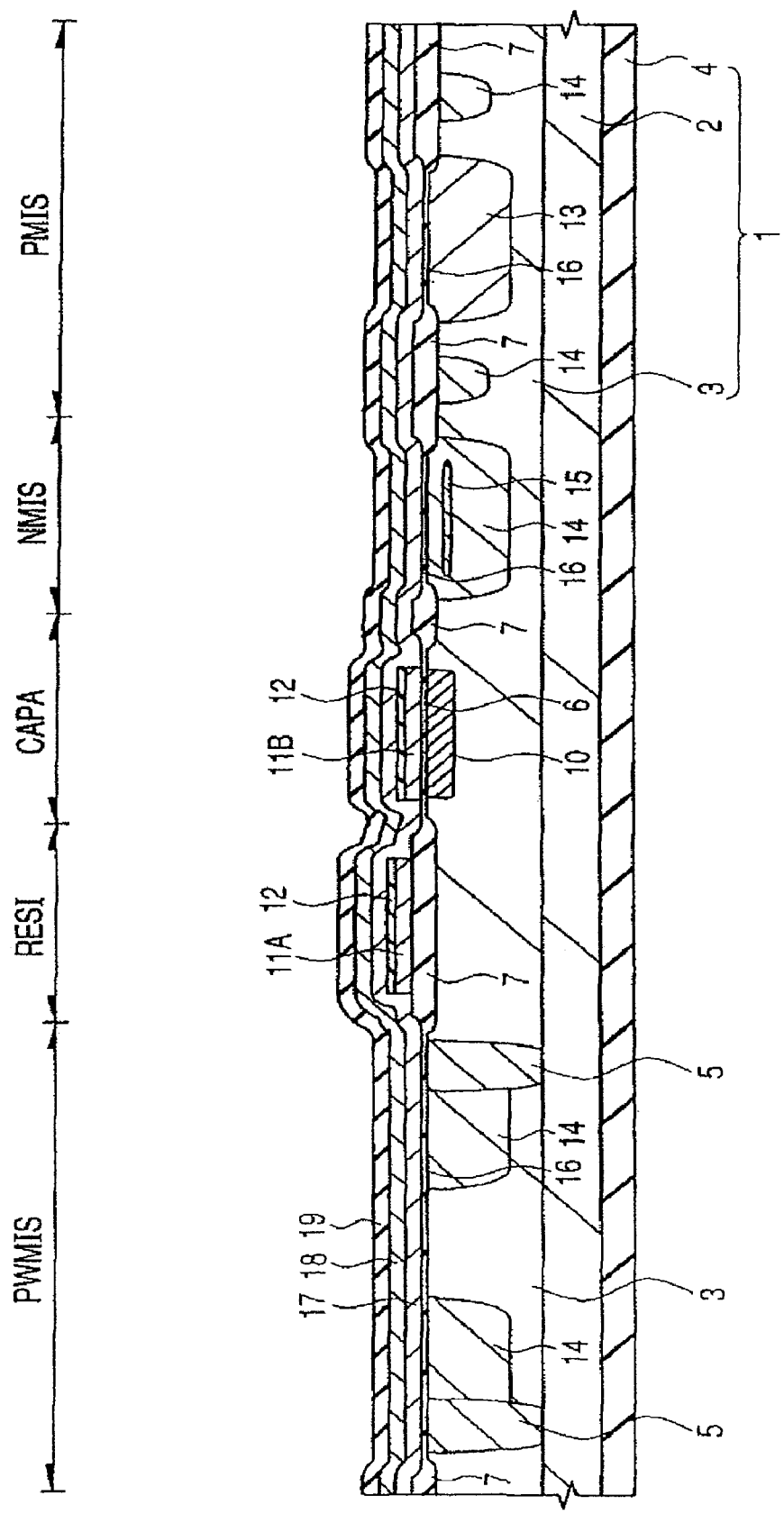
FIG. 7 is a cross sectional view of the main portion of the semiconductor device during a manufacturing step succeeding the step of FIG. 6.

Then, after removing the photoresist film used for forming the $p^+$-semiconductor region 15, the substrate 1 is cleaned, as shown in FIG. 7. Successively, a heat treatment at about 800° C. is applied to the substrate 1 to form a gate insulation film 16 to the surface of each of the active regions for the region PWMIS to be formed with an n-channel type power MISFET, a region NMIS to be formed with an n-channel type MISFET and a region PMIS to be formed with a p-channel type MISFET. Successively, a polycrystal silicon film (first conductive film, a second silicon film) 17 doped with impurity ions (for example, P or B), a WSi (tungsten silicide (first conductive film, refractory metal silicide film)) 18 and a silicon oxide film 19 are stacked successively from the lower layer over the substrate 1. The polycrystal silicon film 17, the WSi film 18 and the silicon oxide film 19 can be deposited, respectively, by a CVD method and the respective film thicknesses can be, for example, about 100 nm, 150 nm and 150 nm. Further, instead of depositing the WSi film 18, a barrier metal film, such as a titanium nitride film and a W (tungsten (refractory metal film)) film, may be stacked successively from the lower layer.

Figure 8:
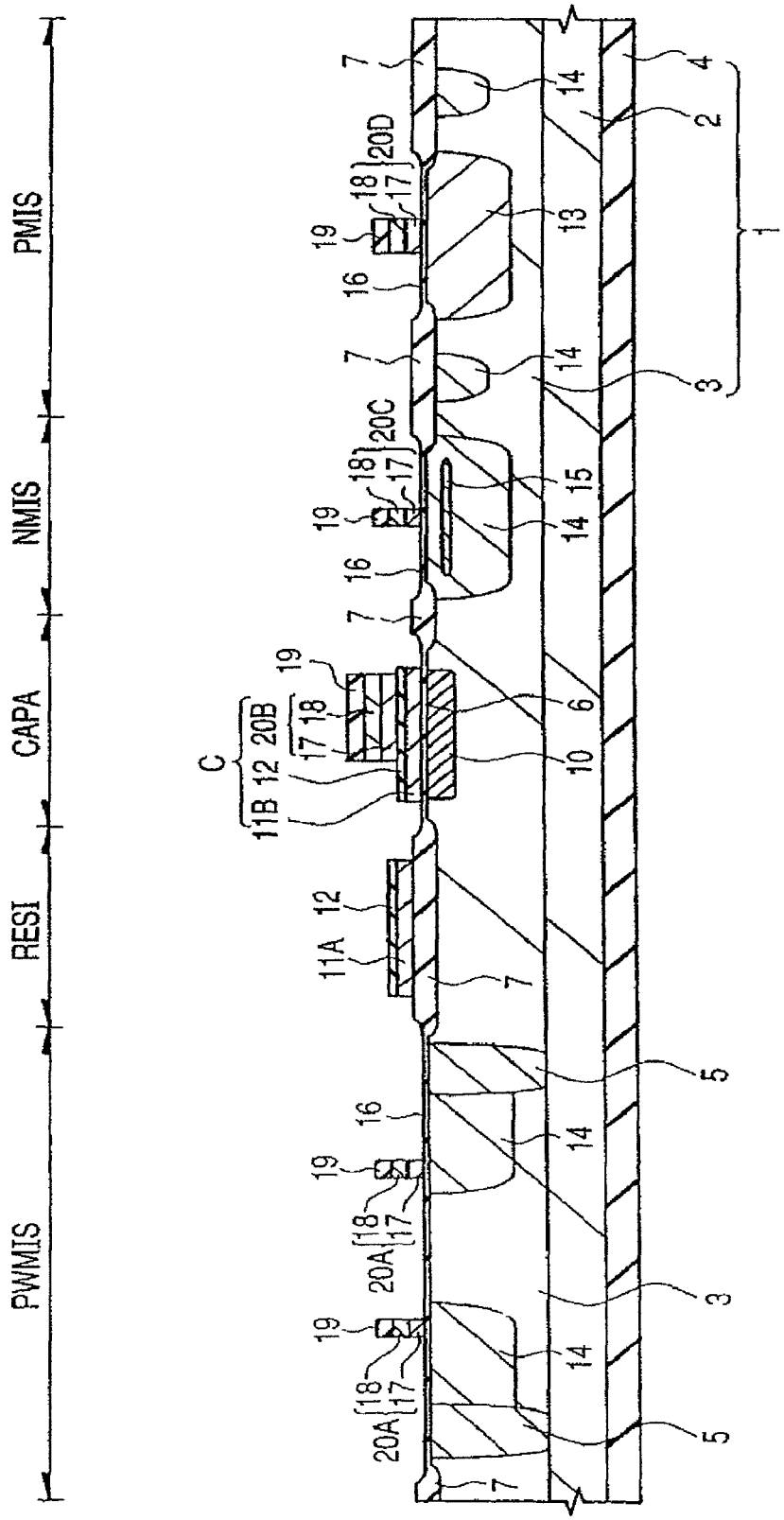
FIG. 8 is a cross sectional view of the main portion of the semiconductor device during a manufacturing step succeeding the step of FIG. 7.

Then, as shown in FIG. 8, the silicon oxide film 19, the WSi film 18 and the polycrystal silicon film 17 are patterned by etching using a photoresist film (not illustrated) patterned by photolithography as a mask. Thus, it is possible to form a gate electrode 20A comprising the polycrystal silicon film 17 and the WSi film 18 in the region PWMIS, to form an upper electrode 20B of a capacitor element comprising the polycrystal silicon film 17 and the WSi film 18 to a region (first portion) above the lower electrode 11B in the region CAPA, and to form gate electrodes 20C and 20D each comprising the polycrystal silicon film 17 and the WSi film 18 in the regions NMIS and PMIS, respectively. Since the gate electrodes 20A, 20C, and 20D are in a structure formed of stacking the polycrystal silicon film 17 and the WSi film 18, the wiring resistance of the gate electrodes 20A, 20C, and 20D can be decreased. Further, by the steps described so far, a capacitor element C comprising the lower electrode 11, the ONO film 12 as a capacitor insulation film, and the upper electrode 20B can be formed in the region CAPA.

Upon patterning the silicon oxide film 19, the WSi film 18, and the polycrystal silicon film 17, the silicon nitride film 12B (refer to FIG. 3) forming the ONO film 12 can be used as an etching stopper to protect the lower electrode 11B from over etching in the region CAPA.

As described above, in this embodiment, while the gate electrodes 20A, 20C, and 20D are formed, each comprising the polycrystal silicon film 17 and the WSi film 18, it may be considered to form the gate electrodes 20A, 20C, and 20D from the polycrystal silicon film 11 like the resistor element 11A and the lower electrode 11B of the capacitor element C. However, in a case of forming the gate electrodes 20A, 20C, and 20D from the polycrystal silicon film 11, it may be a concern that the side wall of the gate electrodes 20A, 20C, and 20D will be etched upon patterning the silicon oxide film 19, the WSi film 18, and the polycrystal silicon film 17 in the subsequent steps, thereby to make the size of the gate electrodes 20A, 20C, and 20D different from the design values. Accordingly, it is preferred that the gate electrodes 20A, 20C, and 20D are formed of the polycrystal silicon film 17 and the WSi film 18 as in this embodiment.

In a case where the capacitor element C is constituted as an MOS type element, the capacitance value of the capacitor element C depends on the voltage value applied to the capacitor element C; however, this tends to cause a disadvantage in that the capacitance value is lowered as the voltage lowers. Such a disadvantage can be prevented by constituting the capacitor element C such that the polycrystal silicon film 11 (refer to FIG. 2) is used for the lower electrode 11B, the ONO film 12 is used for the capacitor insulation film and the polycrystal silicon film 17 and the WSi film 18 are used as the upper electrode 20B.

In this embodiment, the resistor element 11A is formed of the polycrystal silicon film 11, but it may be considered to form the element from the polycrystal silicon film 17. In a case where the resistor element 11A is formed of the polycrystal silicon 17, it is necessary to form the gate electrodes 20A, 20C, and 20D from the polycrystal silicon film 11. This is because the value of the resistance of the gate electrodes 20A, 20C, and 20D has to be different from that of the resistor element 11A. A case is assumed here, for example, of forming the gate electrodes 20A, 20C, and 20D comprising the polycrystal silicon film 11 and then forming a semiconductor region as the source/drain for each of the n-channel type power MISFET, the n-channel type MISFET and the p-channel type MISFET as a switching element. After forming the semiconductor region, the polycrystal silicon film 17 doped with impurity ions are deposited over the substrate 1 and a heat treatment is applied to the substrate 1 to favorably diffuse the impurity ions contained in the polycrystal silicon film 17. The heat treatment can preferably activate the resistor element 11A when the resistor element 11A is formed from the polycrystal silicon film 17. However, the heat treatment enlarges the semiconductor region as the source/drain for each of the n-channel type power MISFET, the n-channel type MISFET, and the p-channel MISFET as the switching element, and there may be a concern that the characteristics of the MISFETs are different from the design values. On the other hand, when the temperature for the heat treatment and the time required for the heat treatment are reduced in order to prevent enlargement of the semiconductor region, the impurity ions contained in the polycrystal silicon film 17 can no longer be diffused favorably, and there may be a concern that the resistor element 11a can no longer be activated favorably. Accordingly, it is preferred as in this embodiment to adopt a method of forming the resistor element 11a from the polycrystal silicon film 11 and diffusing impurity ions introduced into the polycrystal silicon film 11 into the resistance element 11A (polycrystal silicon film 11) by the hysteresis of the heat treatment in the manufacturing steps after forming the resistor element 11A. This can prevent enlargement of the semiconductor region serving as the source/drain for each of the MISFET(s). As a result, the MISFET(s) can be formed with characteristics as designed.

Further, in a case of forming the resistor element 11A from a two-layered thin film of the polycrystal silicon film 17 and the WSi film 18, since the WSi film 18 of low resistance is present, this lowers the resistance value of the resistor element 11A, which results in a concern that a desired resistance value can no longer be obtained. Accordingly, it is preferred to adopt a method of forming the resistor element 11A from the polycrystal silicon film 11, as in this embodiment.

Figure 9:
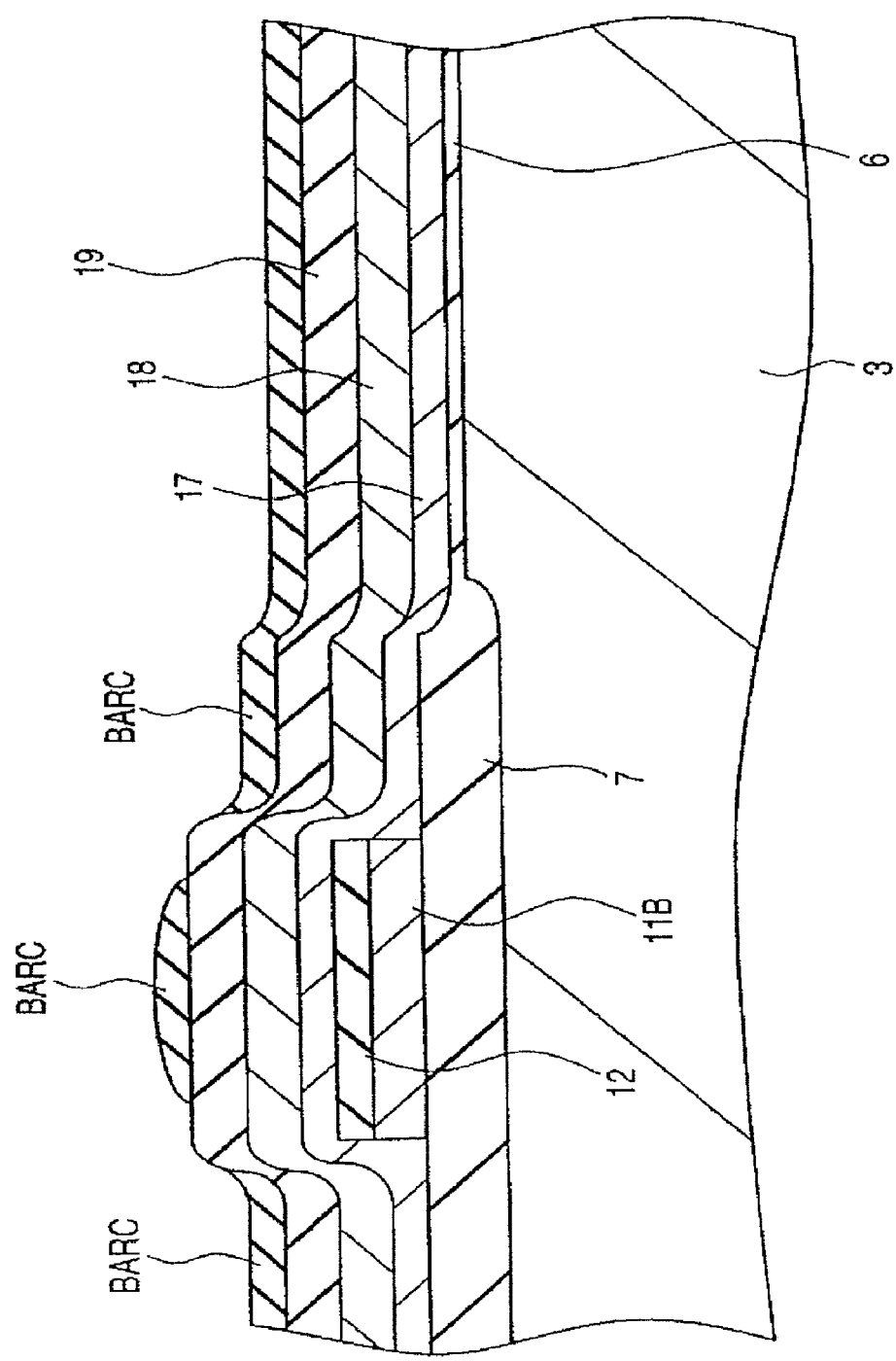
FIG. 9 is a cross sectional view of the main portion of the semiconductor device illustrating manufacturing steps studied in comparison with the manufacturing steps for the semiconductor device according to the present invention.

By the way, in order to prevent occurrence of parasitic capacitance between the capacitor element C and the substrate 1, it may be considered to adopt a method of forming the capacitor element C over the field insulation film 7. In a case of forming the electrode 20B, an anti-reflection film is coated on the silicon oxide film 19 before coating the photoresist film. According to an experiment conducted by the present inventors, in a case where the capacitor element C is formed over the field insulation film 7, since a step is present between the upper surface of the field insulation film 7 and the surface of the active region (about 140 nm in this embodiment), as shown in FIG. 9, it has been found that the anti-reflection film BARC flows down above the lower electrode 11B and can not be coated sufficiently. In a case where the coating of the anti-reflection film BARC is insufficient, since the patterning accuracy of the photoresist film used upon forming the upper electrode 20B is poor, it results in the disadvantage that the upper electrode 20B can not be fabricated into a desired size. Further, in a case where the capacitor element C is formed above the field insulation film 7, it has been found that the effect of flow down of the anti-reflectance film BARC is decreased by forming the lower electrode 11B at a space of about 50 µm or more in the plane from the active region, thereby making it possible to coat a required amount of the anti-reflection film BARC above the lower electrode 11B, according to the experiment conducted by the present inventors. However, when the lower electrode 11B is formed so as to be spaced apart from the active region, this results in the disadvantage of hindering the size-reduction of the chip of this embodiment. In view of the above, the capacitor device C is formed over the active region in this embodiment, as described above. This makes it possible to decrease the size of the chip in this embodiment. There may be a concern for the occurrence of a parasitic capacitance between the capacitor element C and the substrate 1 when the capacitor element C is formed over the active region, and so, means for suppressing such a parasitic capacitance will be described below.

Figure 10:
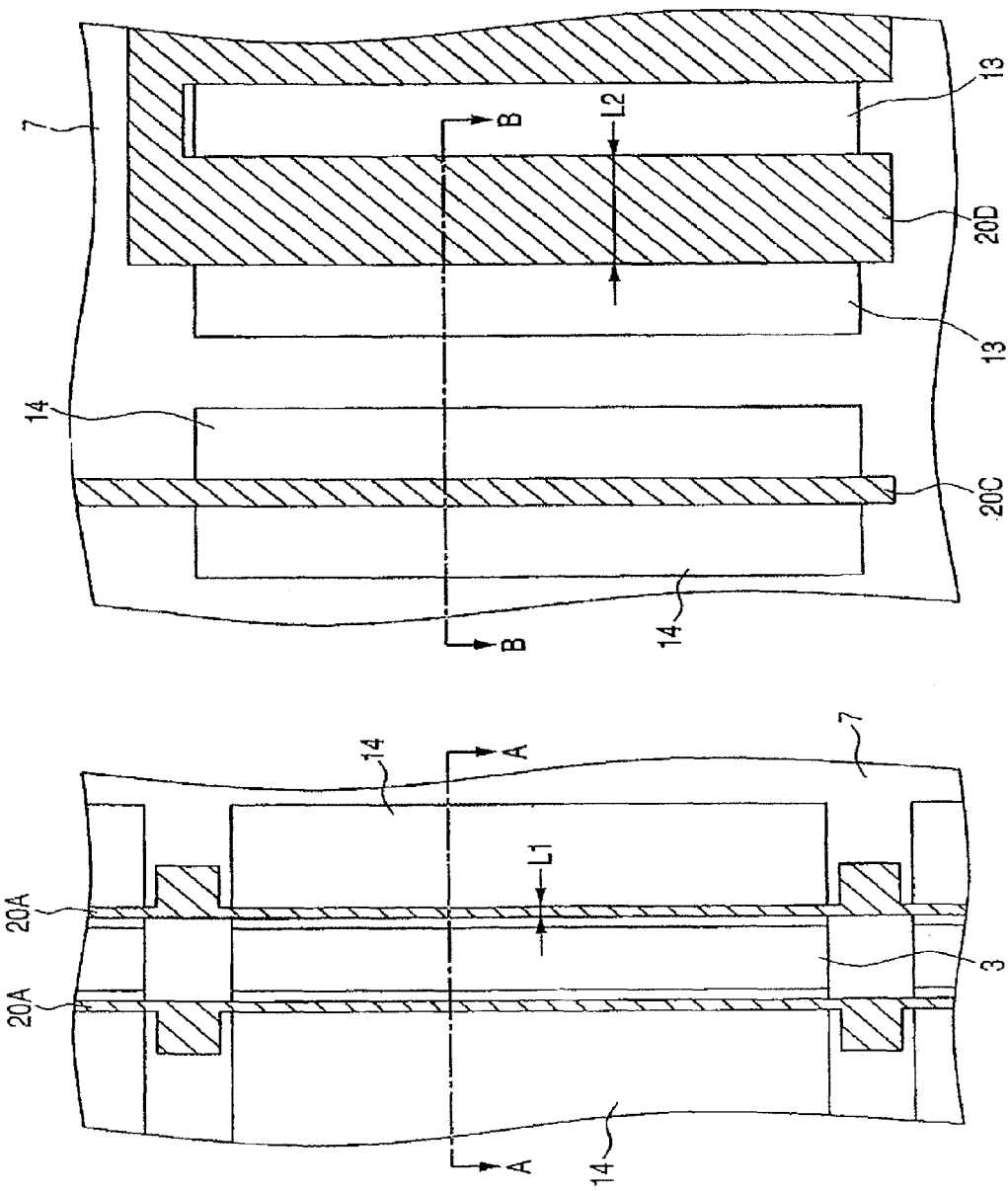
FIG. 10 is a plan view of the main portion of the semiconductor device during the manufacture of the semiconductor device according to the present invention.

Further, as shown in FIG. 10, gate electrodes 20A and 20D are patterned, respectively, such that the gate length L1 for the n-channel type power MISFET formed in the region PWMIS is smaller than the gate length L2 for the p-channel type MISFET formed in the region PMIS in this embodiment. The gate length L1 for the n-channel type power MISFET and the gate length L2 for the p-channel type MISFET can be defined, for example, as about 0.3 µm and 1 µm, respectively. Further, the gate length for the n-channel type MISFET formed in the region NMIS can be defined, for example, to about 1 as well. The region PWMIS in FIG. 8 shows a cross section along line A-A in FIG. 10, and regions NMIS and PMIS show the cross section along line B-B in FIG. 10.

In this embodiment, with an aim of amplifying high frequency power, an improvement for the gain is demanded for the n-channel type power the MISFET. Since the gain of MISFET is in inverse proportion with the gate length, a method may be considered for patterning the gate electrode 20A such that the gate length for the n-channel type power MISFET is as short as possible. Further, in the MISFET, there is a concern for the occurrence of punch through due to the short channel effect as the gate length decreases. Thus, in the region PWMIS in which the n-channel type power MISFET is formed, the short channel effect in the n-channel power MISFET can be suppressed by introducing impurity ions having a p-conduction type into the p-well 14 and the single crystal silicon layer 3. On the other hand, since the p-channel type MISFET formed in the region PMIS constitutes a switching element, a higher gain as compared with the n-channel type power MISFET is not required. Then, in the p-channel type power MISFET, the short channel effect can be suppressed by increasing the gate length without using means for suppressing the short channel effect by the introduction of impurity ions a having n-conduction type. That is, in this embodiment, respective gate electrodes 20A and 20D are patterned such that the gate length L2 for the p-channel type MISFET formed in the region PMIS is larger than the gate length L1 for the n-channel type power MISFET formed in the region PWMIS, as described above. Since this can save the step of introducing impurity ions for suppressing the short channel effect in the p-channel type MISFET, the number of manufacturing steps for the semiconductor device in this embodiment can be decreased. As a result, the manufacturing cost for the semiconductor device in this embodiment can be decreased. In the n-channel type MISFET formed in the region NMIS, since punch through due to the short channel effect tends to occur more compared with the p-channel type MISFET, introduction of impurity ions for suppressing the short channel effect is conducted for the n-channel type MISFET (formation of the p$^-$-semiconductor region) in this embodiment.

After removing the photoresist film used for patterning the silicon oxide film 19, the WSi film 18 and the polycrystal silicon film 17, impurity ions a having n-conduction type (for example, P) are introduced into the single crystal silicon layer 3 in the region PWMIS using another photoresist film (not illustrated) patterned by photolithography as a mask, thereby forming an n$^-$-semiconductor region 21. Successively, after removing the photoresist film over the substrate 1, impurity ions having a n-conduction type (for example, As) are introduced into the single crystal silicon layer 3 in the p-well 14 and the region PWMIS using a further photoresist film (not illustrated) patterned by photolithography as a mask, thereby forming n$^+$-semiconductor regions 22A and 22B to the regions PWMIS and NMIS, respectively. By the steps described so far, an n-channel type power MISFET Qpw having the n$^+$-semiconductor region 22A as source/drain can be formed in the region PWMIS, and an n-channel type power MISFET Qn having the n$^+$-semiconductor region 22B as source/drain can be formed in the region NMIS.

Then, after removing the photoresist film above the substrate 1, impurity ions having a p-conduction type (for example, B) are introduced into the p-well 14 in the region PWMIS using a further photoresist film (not illustrated) patterned by photolithography as a mask, thereby forming a p$^-$-semiconductor region 23. In this case, the impurity ions are implanted obliquely to the main surface (device forming surface) of the substrate 1. By forming the p$^-$-semiconductor region 23, a short channel effect in the n-channel type power MISFET Qpw can be suppressed.

Then, a case is assumed, for example, of forming the p$^-$-semiconductor region 15 by a step identical with the step of forming the p$^-$-semiconductor region 23. In this case, since the impurity ions are implanted obliquely relative to the main surface of the substrate 1 as described above, there may be a concern that the region formed with the p$^-$-semiconductor region scatters in the chip. If such scattering should be caused, the threshold voltage will be scattered between each of the plural n-channel type MISFET Qn in the chip. In this embodiment, since the n-channel type MISFET Qn is formed as a switching element, in a case where the threshold voltage scatters between each of the plural n-channel type MISFET Qn in the chip, problems with the switching operation may possibly occur. Therefore, in this embodiment, the p$^-$-semiconductor region 23 for suppressing the short channel effect in the n-channel type power MISFET Qpw and the p$^-$-semiconductor region 15 for suppressing the short channel effect in the n-channel type MISFET Qn are formed respectively in separate steps. This can prevent the threshold voltage from scattering between the plural n-channel type MISFET Qn. That is, it is possible to prevent problems with the switching operation by the n-channel type MISFET Qn.

Successively, after removing the photoresist film above the substrate 1, impurity ions having a p-conduction type (for example, BF$_2$) are introduced into the region PMIS, the region PWMIS and the region CAPA using a photoresist film (not illustrated) newly patterned by photolithography as a mask, thereby forming p$^+$-semiconductor regions 24, and 26, respectively. By the steps described so far, the p$^+$-semiconductor region 24 can be formed in the region PWMIS and the p-channel type MISFET Qp having the p$^+$-semiconductor region 24 as source/drain can be formed in the region PMIS. Further, in the region PWMIS, the p-semiconductor region 25 can be used as a channel stopper. The p$^-$-semiconductor region 26 is formed in a region surrounding the n-semiconductor region 10, as seen in plan view.

Figure 12:
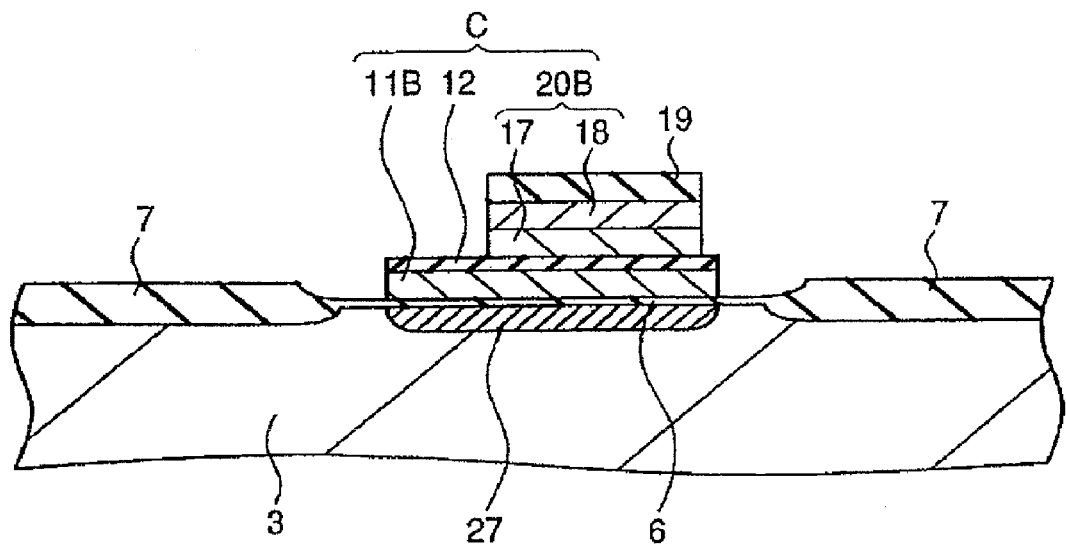
FIG. 12 is a cross sectional view of the main portion of the semiconductor device illustrating a conduction type of substrate just below a capacitor element when applying a negative voltage to the capacitor element provided to the semiconductor device according to an embodiment of the invention.
Figure 13:
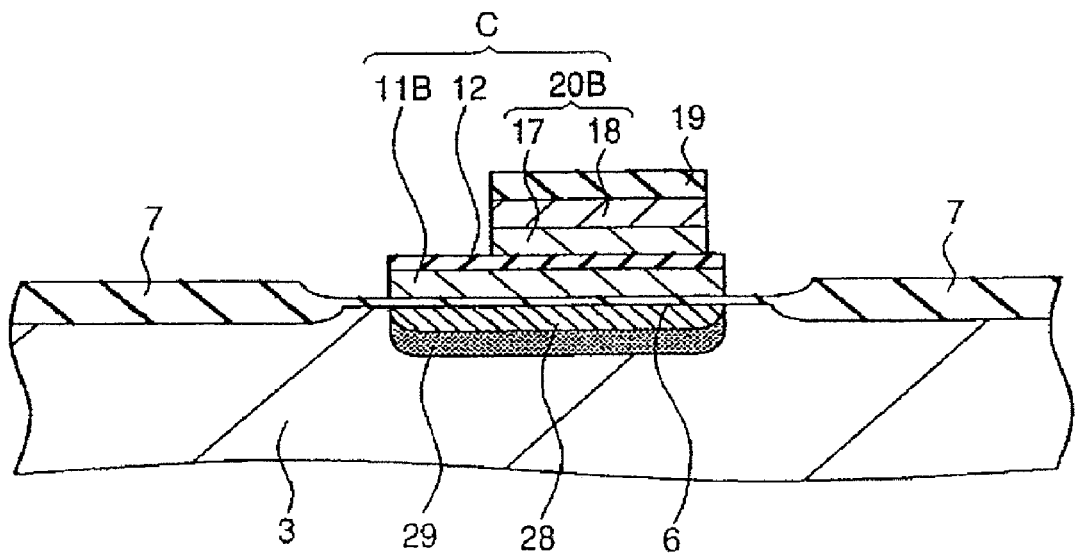
FIG. 13 is a cross sectional view of the main portion of the semiconductor device illustrating a conduction type of substrate just below a capacitor element when applying a positive voltage to the capacitor element provided to the semiconductor device according to an embodiment of the invention.
Figure 14:
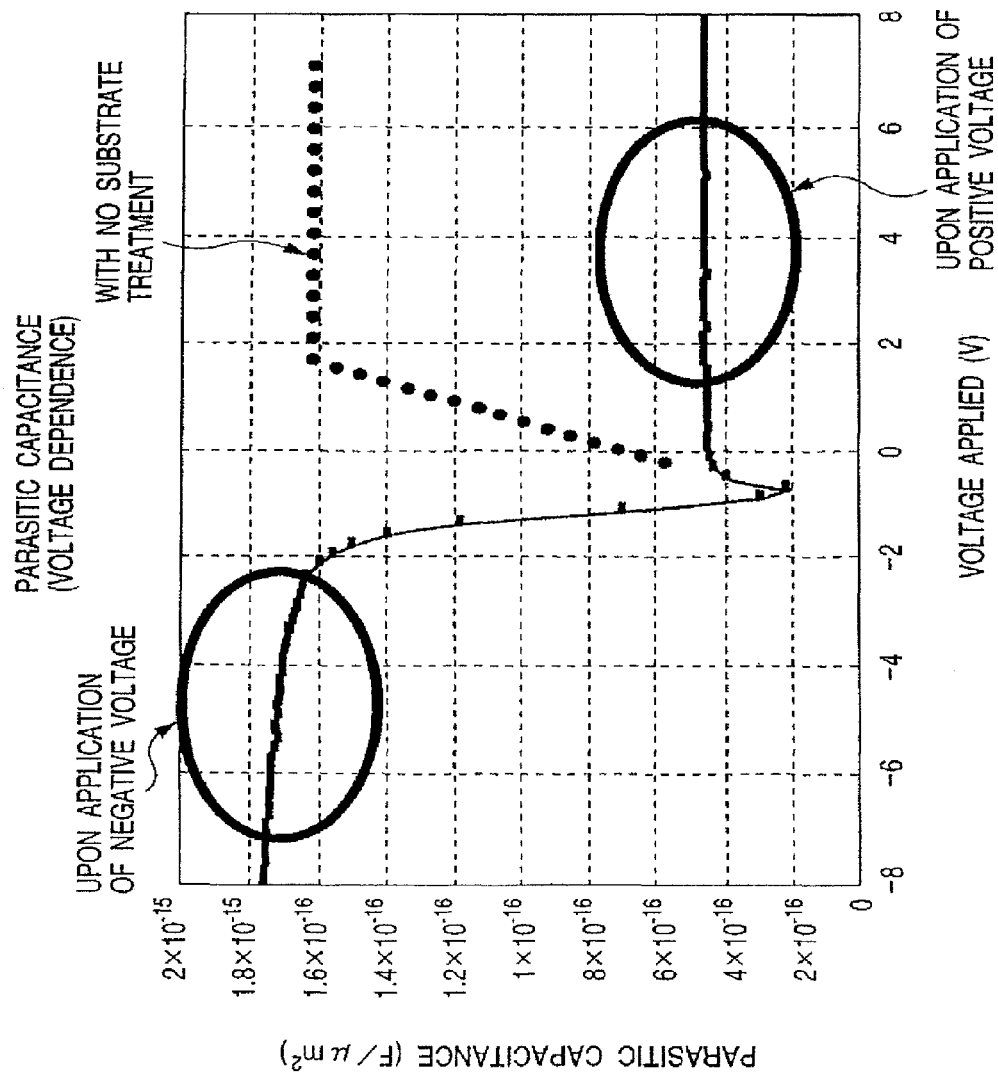
FIG. 14 is graph showing a relation between a voltage applied to a capacitor element provided to the semiconductor device according to an embodiment of the invention and parasitic capacitance generated between the capacitor element and a substrate to which the capacitor element is formed.

The operation of the capacitor element C, when the single crystal silicon layer 3 having the p-conduction type (substrate 1) is electrically connected to the ground potential and a positive or negative voltage is applied to the capacitor element C in this embodiment, will be described with reference to FIG. 12 to FIG. 14. FIG. 12 and FIG. 13 are cross sectional views of a main portion of the semiconductor device and will be referred to for explaining the conduction type of the single crystal silicon layer 3 just below the capacitor element C when a positive or negative voltage is applied to the capacitor element C. In FIG. 12 and FIG. 13, the n-semiconductor region 10 and the pt semiconductor region 26 are not illustrated for better under standing of the conduction type of the single crystal silicon layer 3 just below the capacitor element C. FIG. 14 is a graph showing a relation between a voltage applied to the capacitor element C and a parasitic capacitance formed between the capacitor element C and the single crystal silicon layer 3, obtained experimentally by the present inventors.

As shown in FIG. 12, when a negative voltage is applied to the capacitor element C, electric charges are accumulated on the surface of the single crystal silicon layer 3 just below the capacitor element C to form a p-charge accumulation layer 27. Accordingly, a parasitic capacitance is formed with the capacitor element C and the charge accumulation layer 27 serving as capacitor electrodes and the silicon oxide film 6 serving as a capacitor insulation film. The capacitance value increases as the distance between the capacitor electrodes is smaller; and, as has been described above, since the thickness of the silicon oxide film 16 is as thin as about 15 nm in this embodiment, a parasitic capacitance of a large capacitance value is formed between the capacitor element C and the single crystal silicon layer 3 (refer to FIG. 14).

Further, as shown in FIG. 13, in this embodiment, since the n-semiconductor region 10 is formed on the surface of the single crystal silicon layer 3 just below the capacitor element C, when a positive voltage is applied to the capacitor element C, an n-inversion layer 28 is formed to the surface of the single crystal silicon layer 3 just below the capacitor element C, and, further, a depletion layer 29 is formed just below the inversion layer 28. In a case where the inversion layer 28 and the depletion layer 29 are formed, a parasitic capacitance is formed with the capacitor element C and the inversion layer 28 serving as capacitor electrodes and with the silicon oxide film 6 serving as the capacitor insulation film; and, a parasitic capacitance is formed with the inversion layer 28 and the single crystal silicon layer 3 serving as capacitor electrodes and the depletion layer 29 serving as a capacitor insulation film. In this case, since the parasitic capacitance formed between the capacitor element C and the single crystal silicon layer 3 is a synthesis capacitance formed by serially connecting a parasitic capacitance formed between the capacitor element C and the inversion layer 28, and a parasitic capacitance formed between the inversion layer 28 and the single crystal silicon layer 3, the capacitance value can be decreased (refer to FIG. 14). Further, in this embodiment, since the p$^+$-semiconductor region 26 is formed in the region surrounding the n-semiconductor region 10, as seen in plan view, the inversion layer 28 and the depletion layer 29 can be prevented from extending in the horizontal direction (direction along with the main surface of the substrate). Since this can prevent an increase in the region of the capacitor electrode, an increase of the parasitic capacitance value can be prevented.

On the other hand, in a case where the substrate treatment as in the formation of the n-semiconductor region 10 and the p$^+$-semiconductor region 26 is not applied, when a negative voltage is applied to the capacitor element C, charges are accumulated on the surface of the single crystal silicon layer 3 just below the capacitor element C like in the case of applying the substrate treatment, so that the p-charge accumulation layer 27 is formed to exhibit a parasitic capacitance value like the case where the substrate treatment is applied. On the other hand, in a case where a positive voltage is applied to the capacitor element C, the depletion layer 29 is not formed since the n-semiconductor 10 is not formed. Accordingly, a parasitic capacitance of a large capacitance value having the same capacitance characteristics as the capacitor element of the MOS structure is formed between the capacitor element C and the single crystal silicon layer 3 (refer to FIG. 14).

That is, in this embodiment, the n-semiconductor region 10 is formed to the surface of the single crystal silicon film 3 just below the capacitor element C, and the p$^+$-semiconductor region 26 is formed to the region surrounding the n-semiconductor region 10, as seen in plan view. Further, a positive voltage is applied to the capacitor element C. This can decrease the capacitance value of the parasitic capacitance formed between the capacitor element C and the single crystal silicon layer 3 (substrate 1). As a result, it is possible to prevent the possibility that the parasitic capacitance results in problems with the operation of the circuits formed in the chip of this embodiment.

Figure 11:
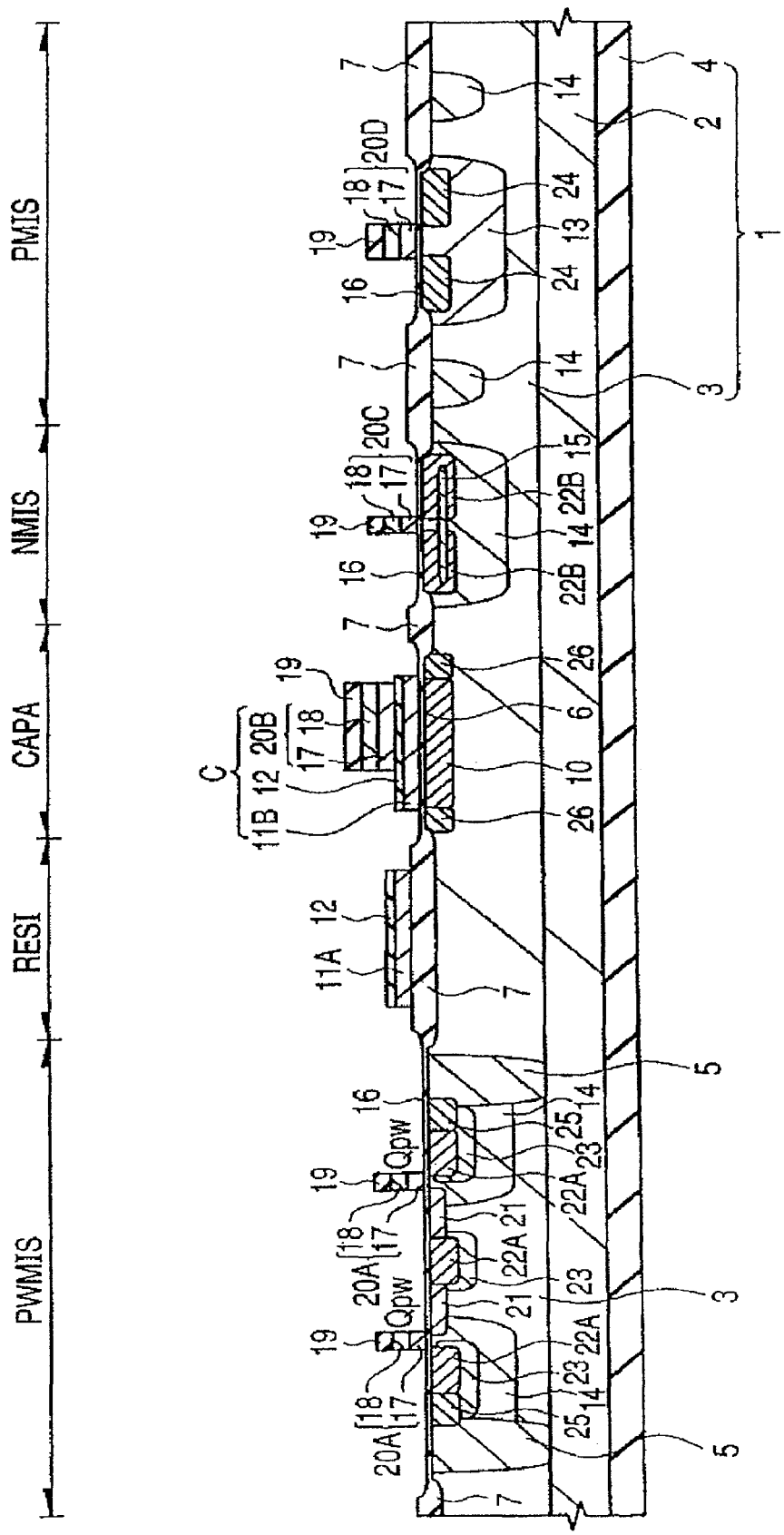
FIG. 11 is a cross sectional view of the main portion of the semiconductor device during a manufacturing step succeeding the step of FIG. 8.
Figure 15:
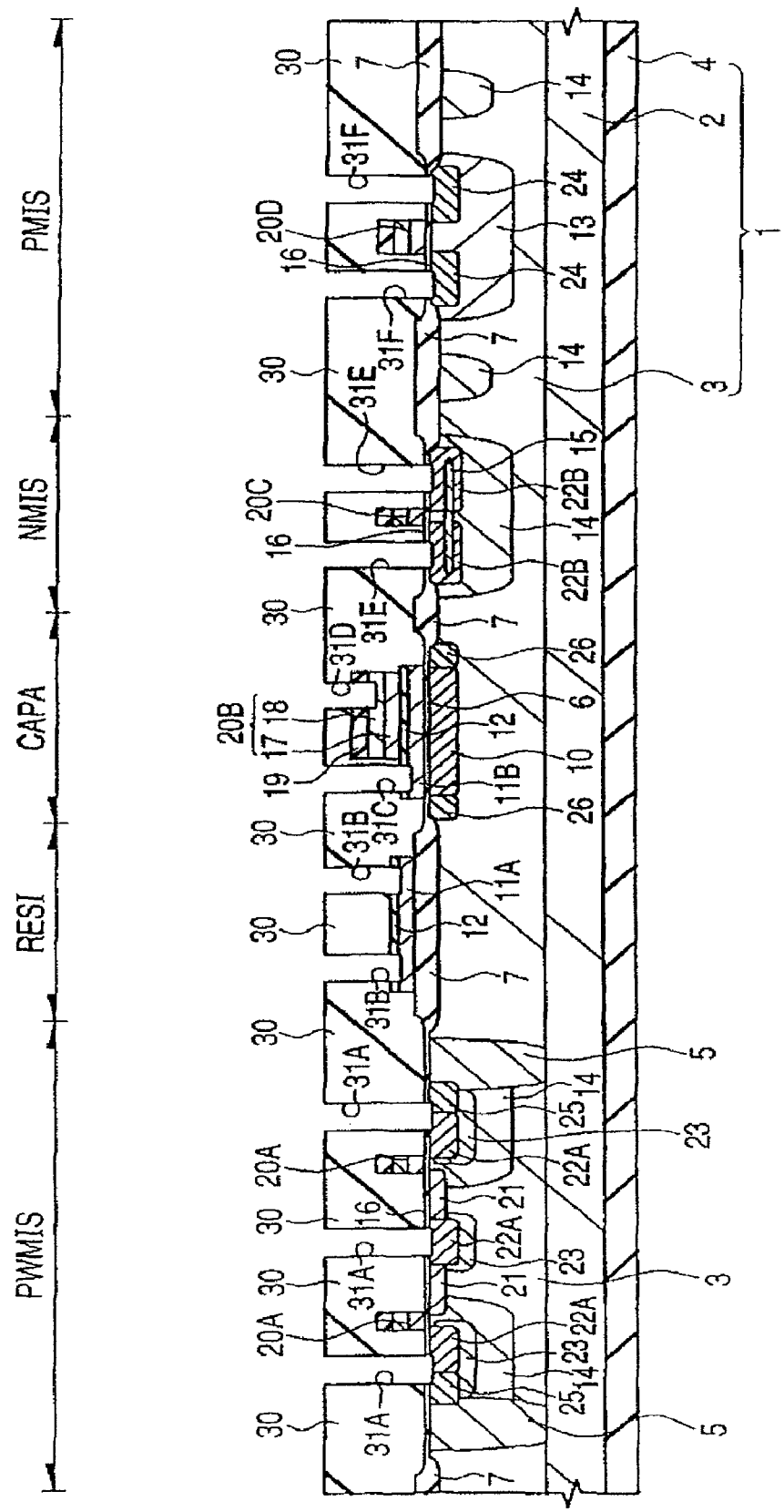
FIG. 15 is a cross sectional view of the main portion of the semiconductor device during a manufacturing step succeeding the step of FIG. 11.

Then, after removing the photoresist film used for forming the p$^+$-semiconductor regions 24, 25, and 26, a silicon oxide film (second dielectric film) 30 is deposited above the substrate 1, as shown in FIG. 15. Successively, connection holes 31A-31F are perforated by etching using a photoresist film (not illustrated) patterned by photolithography as a mask. The connection hole 31A connects with the n$^+$-semiconductor region 22A and the p$^+$-semiconductor region 25 in the region PWMIS, the connection hole 31B connects with the resistor element 11A in the region RESI, the connection hole (second opening) 31C connects with a second portion of the lower electrode 11B of the resistor element C (refer to FIG. 11) in the region CAPA, the connection hole (first opening) 31D connects with the upper electrode 20B of the capacitor element C in the region CAPA, the connection hole 31E connects with the n$^+$-semiconductor region 22B in the region NMIS, and the connection hole 31F connects with the p$^+$-semiconductor region 24 in the region PMIS. In this case, connection holes reaching the gate electrodes 20A, 20C, and 20D are also perforated, but they are not illustrated in FIG. 15.

When the connection hole 31D is perforated, since the WSi film 18 with a lower etching selection ratio compared with the silicon oxide film can be used as an etching stopper, this can prevent the connection hole 31D from reaching the lower electrode 11B. That is, when a plug is formed in the connection hole 31D in the subsequent step, it can prevent the disadvantage that the upper electrode 20B and the lower electrode 11B of the capacitor element C are short circuited by the plug.

Figure 16:
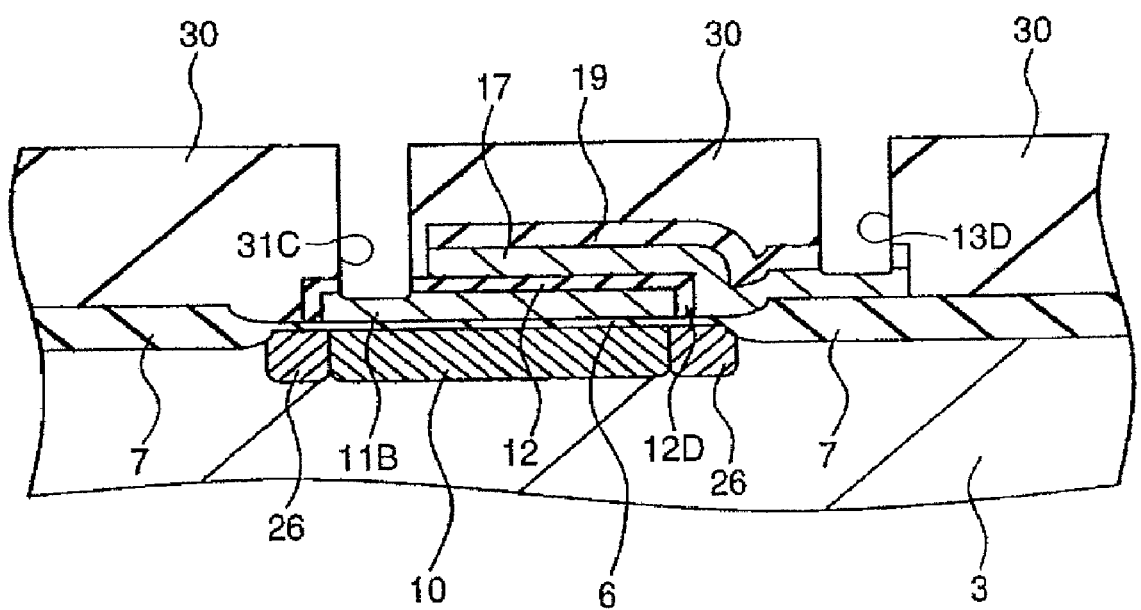
FIG. 16 is a cross sectional view of the main portion of the semiconductor device illustrating manufacturing steps studied in comparison with the manufacturing steps for the semiconductor device according to the present invention.

A method for perforating the connection hole 31D without using the WSi film 18 as an etching stopper will be considered. In this case, as shown for example in FIG. 16, a method may be considered of patterning the polycrystal silicon film 17 and the silicon oxide film 19 as the upper electrode for the capacitor element C so as to extend above the field insulation film 7 and perforating the connection hole 31D reaching the polycrystal silicon film 17 above the field insulation film 7. In this case, it is necessary to form a silicon oxide film 12D to the side wall of the lower electrode 11B, for example, by heat treatment before deposition of the polycrystal silicon film 17, in order to prevent short circuit from being created between the lower electrode 11B and the polycrystal silicon film 17. By using the method described above, the connection hole 31D can be perforated so as not to reach the lower electrode 11B without using the WSi film 18 as an etching stopper. However, since the polycrystal silicon film 17 and the silicon oxide film 19 are patterned so as to extend over the field insulation film 7, the capacitor element C is extended largely in the horizontal direction to bring about a concern of hindering the size reduction of the chip in this embodiment. Accordingly, it is preferred that the upper electrode 20B of the capacitor element C is formed from the silicon film 17 and the WSi film 18 and patterned above the lower electrode 11B as in this embodiment. Further, since the upper electrode 20B can be patterned above the lower electrode 11B and the capacitor element C can be formed above the active region, the size of the chip in this embodiment can be decreased.

Figure 17:
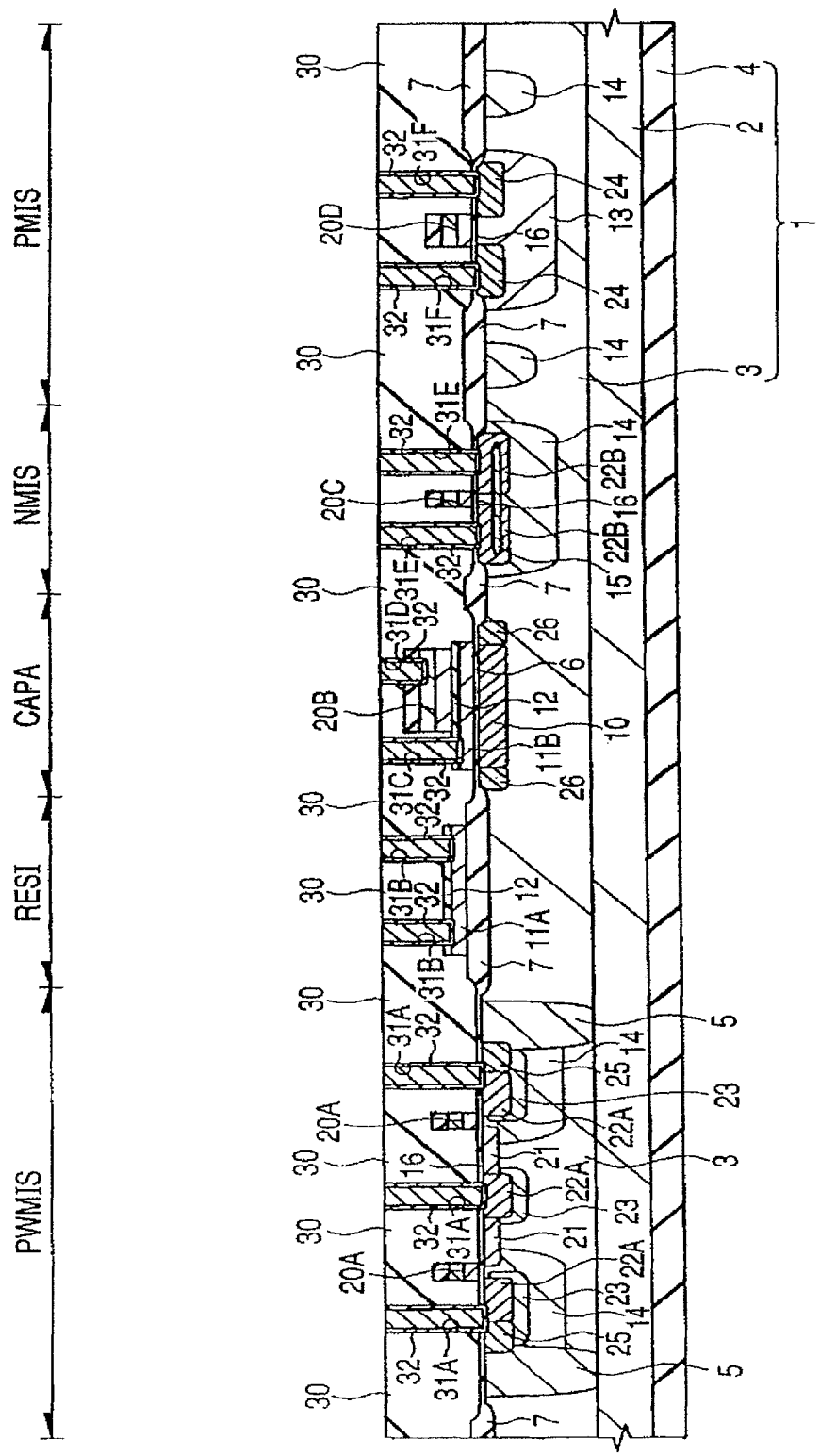
FIG. 17 is a cross sectional view of the main portion of the semiconductor device during a manufacturing step succeeding the step of FIG. 15.
Figure 18:
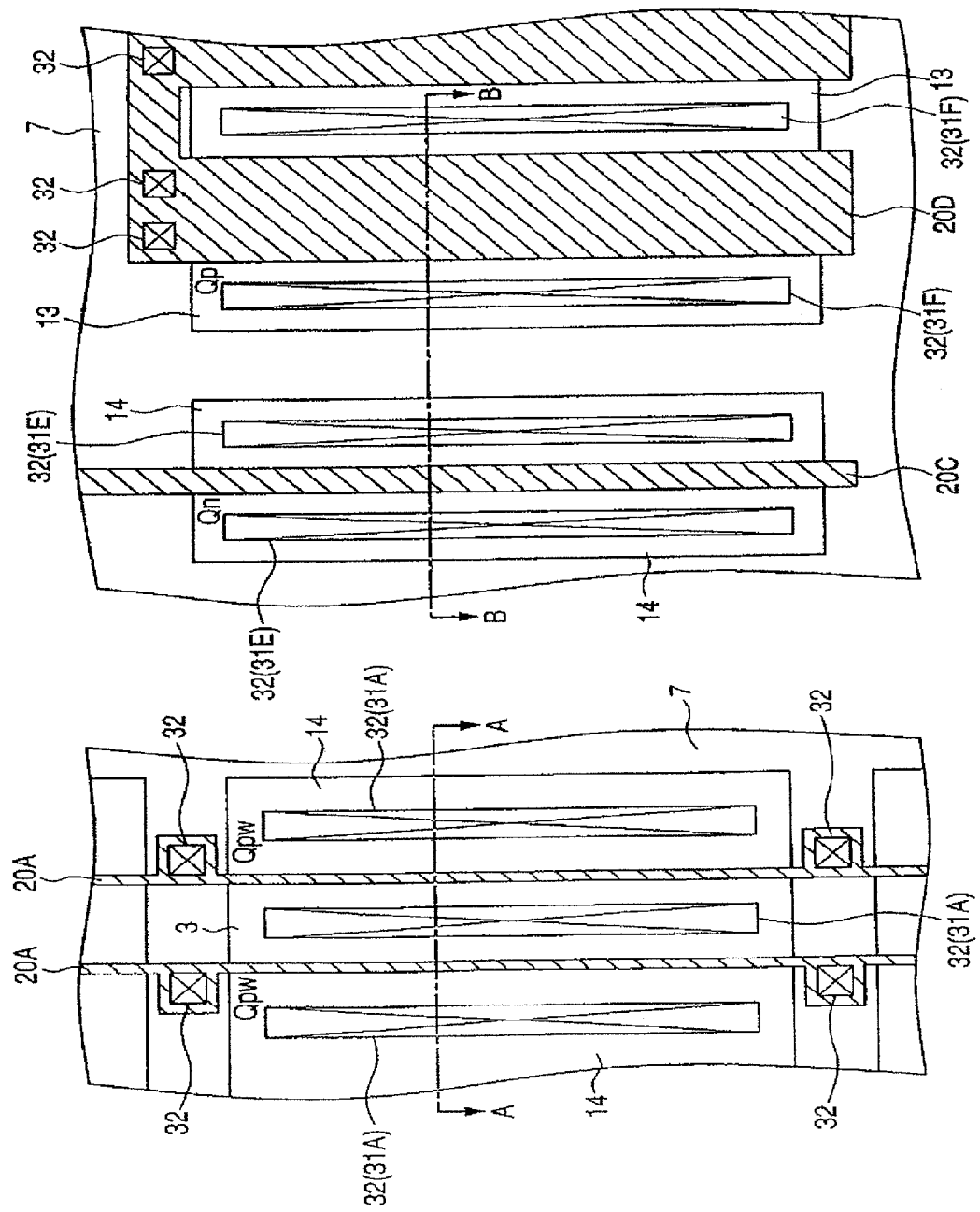
FIG. 18 is a plan view of the main portion of the semiconductor device during the manufacture of the semiconductor device according to the present invention.

Then, after removing the photoresist film used for perforating the connection holes 31A to 31F, a Ti (titanium) film of about 30 nm thickness and a TiN (titanium nitride) film of about 80 nm thickness are deposited successively from the lower layer over the silicon oxide film 30 including the inside of the connection holes 31A to 31F and the inside of the connection holes reaching the gate electrode 20A, 20C, and 20D, as shown in FIG. 17 and FIG. 18. Successively, after applying a heat treatment at about 650° C. to the substrate 1, a W (tungsten) film of about 700 nm thickness for burying the connection holes is deposited above the substrate 1. Then, by removing the W film, the TiN film and the Ti film above the silicon oxide film 30 by an etching back method, plugs 32 comprising the TiN film and the Ti film serving as the barrier conductor film and the W film serving as the main conductive layer can be formed in the connection holes. FIG. 18 is an enlarged plan view of a main portion in the vicinity of the gate electrodes 20A, 20C, and 20D for the n-channel type power MISFET Qpw, the n-channel type MISFET Qn and the p-channel type MISFET Qp, respectively, upon formation of the plugs 18. Further, the region PWMIS in FIG. 17 shows a cross section along line A-A in FIG. 18 and regions NMIS and PMIS show cross sections along line B-B in FIG. 18.

Figure 19:
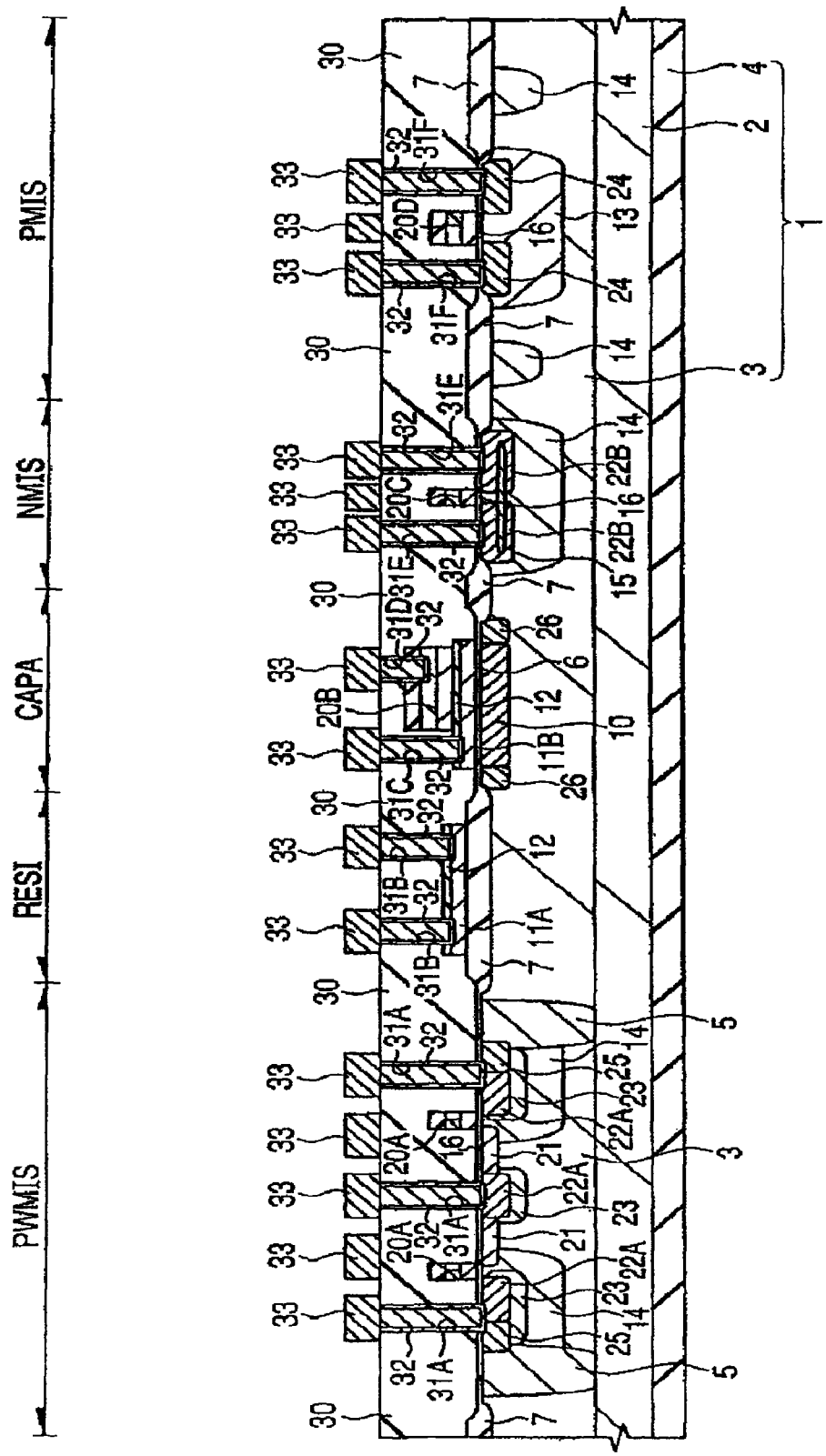
FIG. 19 is a cross sectional view of the main portion of the semiconductor device during a manufacturing step succeeding the step of FIG. 17.

Then, as shown in FIG. 19, a stacked film (second conduction film) is formed above the substrate 1 by depositing, for example, a Ti film of about 10 nm thickness, an aluminum alloy film of about 400 nm thickness containing Cu (copper) and Si (silicon), a Ti film of about 10 nm thickness and a TiN film of about 75 nm thickness successively from the lower layer over the substrate 1, as shown in FIG. 19. Successively, the stacked film is dry etched by using a photoresist film (not illustrated) patterned by photolithography as a mask, wirings (first wiring, second wiring) 33 comprising the stacked film and in connection with the plug 32 are formed.

Figure 20:
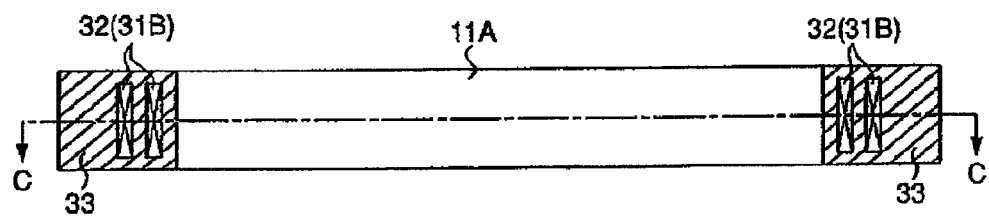
FIG. 20 is a plan view of the main portion of the semiconductor device during the manufacture of the semiconductor device according to the present invention.
Figure 21:
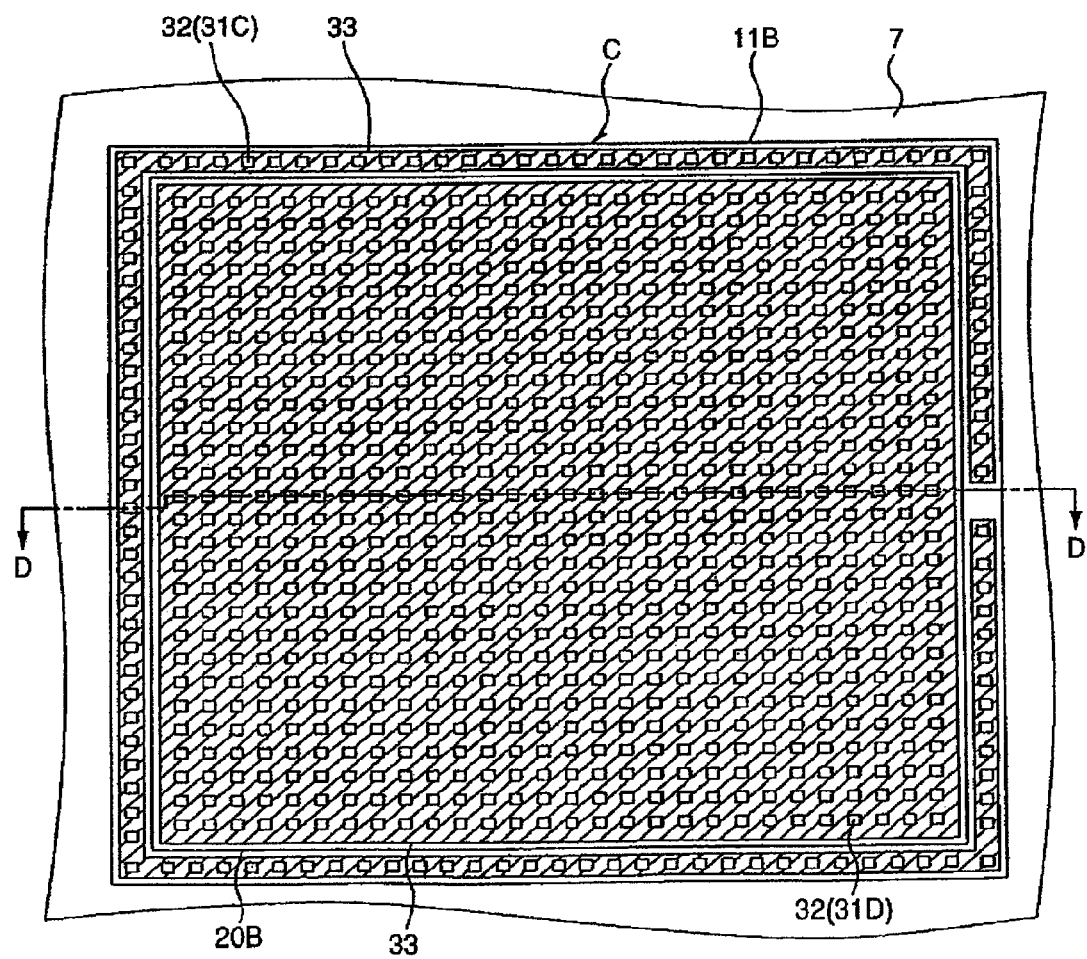
FIG. 21 is a plan view of the main portion of the semiconductor device during the manufacture of the semiconductor device according to the present invention.

FIG. 20 and FIG. 21 are plan views showing a main portions for the region RESI and the region CAPA when the wirings 33 are formed respectively in which wirings 33 are shown by hatching. Further, the regions RESI and CAPA in FIG. 19 show cross sections along line C-C in FIG. 20 and line D-D in FIG. 21.

As shown in FIG. 20, while two plugs 32 (connection holes 31B) are formed between a wiring 33 and a resistor element 11A, only one plug 32 (connection hole 31B) is shown for better understanding of the positional relation for the wiring 33, the resistor element 11A and the plug 32 (connection hole 31B). Further, while an example of arranging two plugs 32 (connection holes 31B) between one wiring 33 and the resistor element 11A is shown in FIG. 20, the number of the plugs 32 (connection holes 31B) is not restricted thereto.

Further, as shown in FIG. 21, in this embodiment, plural plugs 32 (connection holes 31C) are formed between one wiring 33 and the lowering electrode 11B of the capacitor element C and plural plugs 32 (connection holes 31D) are formed between other wirings 33 and the upper electrode 20B of the capacitor element C. While a number of plugs 32 for connecting the wirings 33 and the upper electrode 20B (connection holes 31D) appear in the cross section along line D-D, only one of the plugs 32 (connection holes 31D) for connecting the wirings 33 and the upper electrode 20B is illustrated for better understanding of the positional relation between the wiring 33 and the plugs 32 (connection holes 31C, 31D). As described above, when plural plugs 32 are disposed between the wiring 33 and the lower electrode 11B and between the wirings 33 and the upper electrode 20B, the resistance values for the lower electrode 11B and the upper electrode 20B can be decreased compared with the case of connecting the wirings 33 with the lower electrode 11B and the wirings 33 with the upper electrode 22B, for example, by a single plug, and the parasitic resistance value of the capacitor element C can be decreased. As a result, it is possible to prevent the parasitic resistance from causing problems with the operation of the circuits formed in the chip in this embodiment.

Figure 22:
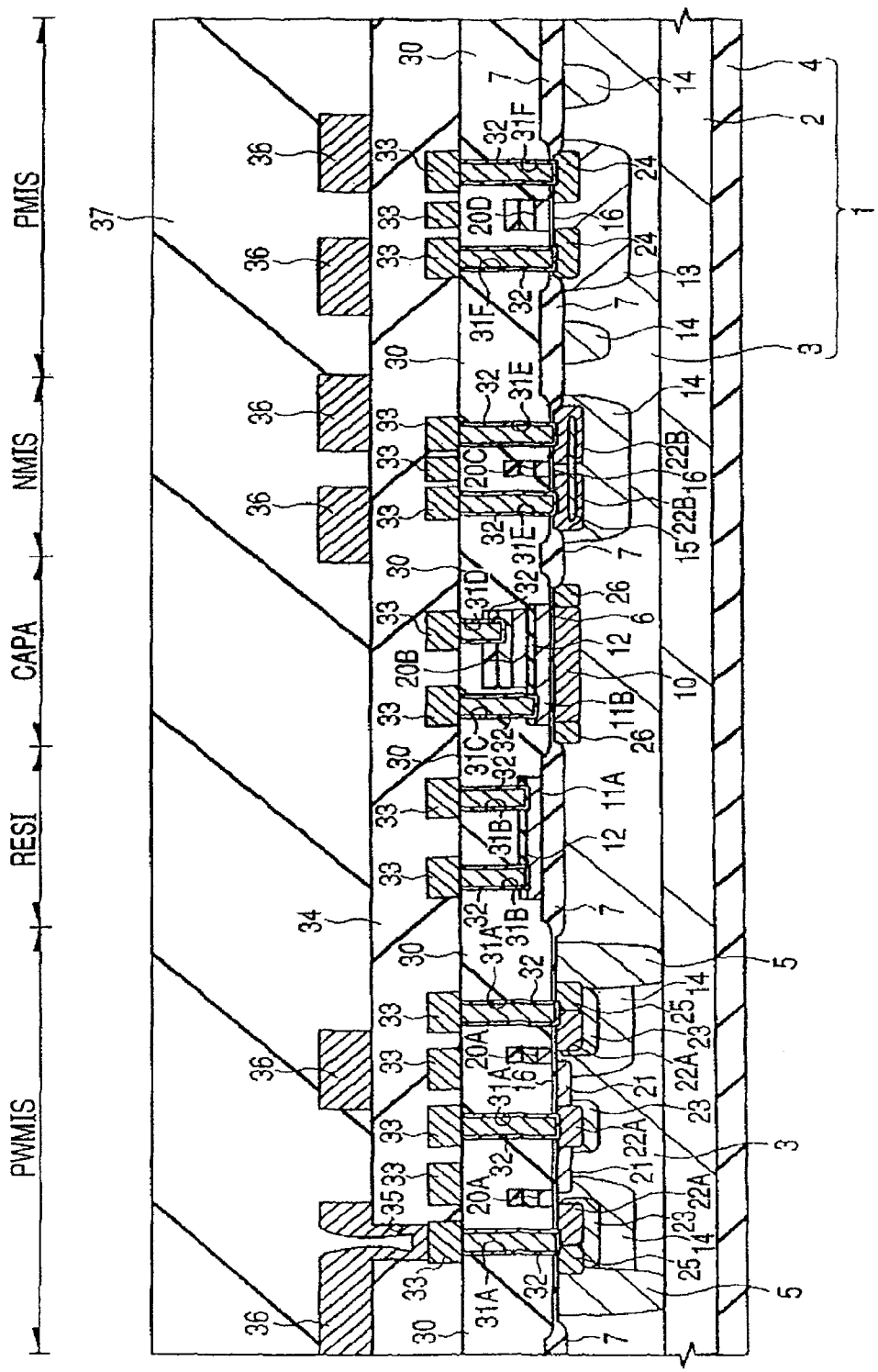
FIG. 22 is a cross sectional view of the main portion of the semiconductor device during a manufacturing step succeeding the step of FIG. 19.

Then, after removing the photoresist film used for patterning the wirings 33, a silicon oxide film 34 is deposited above the substrate 1, as shown in FIG. 22. Successively, the silicon oxide film 34 is etched by using a photoresist film patterned by photolithography as a mask to form a connection hole 35 reaching the wiring 33. Next, after removing the photoresist film, a Ti film of about 30 nm thickness and a TiN film of about 100 nm thickness are, for example, deposited successively from the lower layer above the silicon oxide film 34 including the inside of the connection hole 35, to form a barrier conductive film. Successively, a Ti film of about 20 nm thickness and an aluminum alloy film of about 100 nm thickness containing Cu and Si are deposited successively from the lower layer above the barrier conductive film, to form a stacked film comprising the barrier conductive film, the Ti film and the aluminum alloy film. Then, the stacked film is etched by using a photoresist film patterned by photolithography as a mask to form a wiring 36.

Then, after removing the photoresist film used for the patterning of the wiring 36, a silicon oxide film of about 600 nm thickness and a silicon nitride film of about 500 nm thickness are deposited successively from the lower layer above the substrate 1, to form a dielectric film comprising the silicon oxide film and the silicon nitride film.

Figure 23:
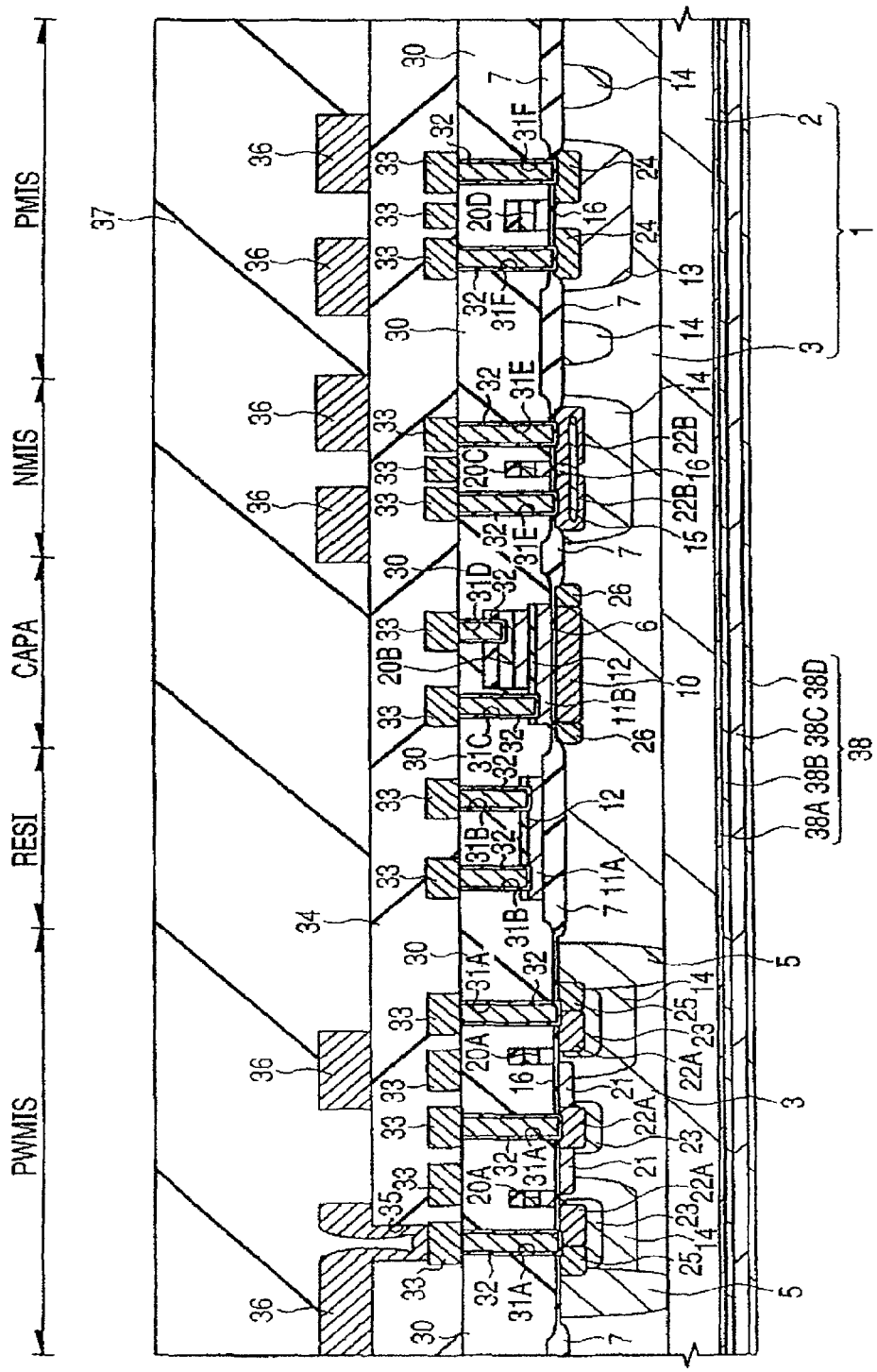
FIG. 23 is a cross sectional view of the main portion of the semiconductor device during a manufacturing step succeeding the step of FIG. 22.

Then, as shown in FIG. 23, the rear face of the substrate 1 is ground to remove the silicon oxide film 4 protecting the rear face of the semiconductor substrate 2. Successively, an Ni (nickel) film 38A of about 50 nm thickness, a Ti film 38B of about 100 nm thickness, an Ni film 38C of about 200 nm thickness and an Au (gold) film 38D of about 100 nm thickness are, for example, deposited successively to the rear face of the substrate 1 by a sputtering method to form a rear face electrode 38 comprising the Ni film 38A, Ti film 38B, Ni film 38C and Au film 38D. Then, the substrate 1 is cut and divided into individual chips to manufacture the semiconductor device of this embodiment.

In this embodiment, as described above, a controlling CMOS circuit including the n-channel type MISFET Qpw (refer to FIG. 11), the resistor element 11A (refer to FIG. 11), the capacitor element C (refer to FIG. 11), the n-channel type MISFET Qn (refer to FIG. 11), and the p-channel type MISFET Qp (refer to FIG. 11) can be formed in one chip. This can suppress an increase in the manufacturing cost of the semiconductor device of this embodiment. Further, since the n-channel type power MISFET Qpw and the controlling CMOS circuit can be formed in one chip, the system formed by using the chip according to this embodiment (for example, high frequency power amplifier) can be reduced in size.

Now, a high frequency power amplifier formed by using the chip as the semiconductor device of this embodiment, as described above, will be explained with reference to FIG. 24 and FIG. 25.

Figure 24:
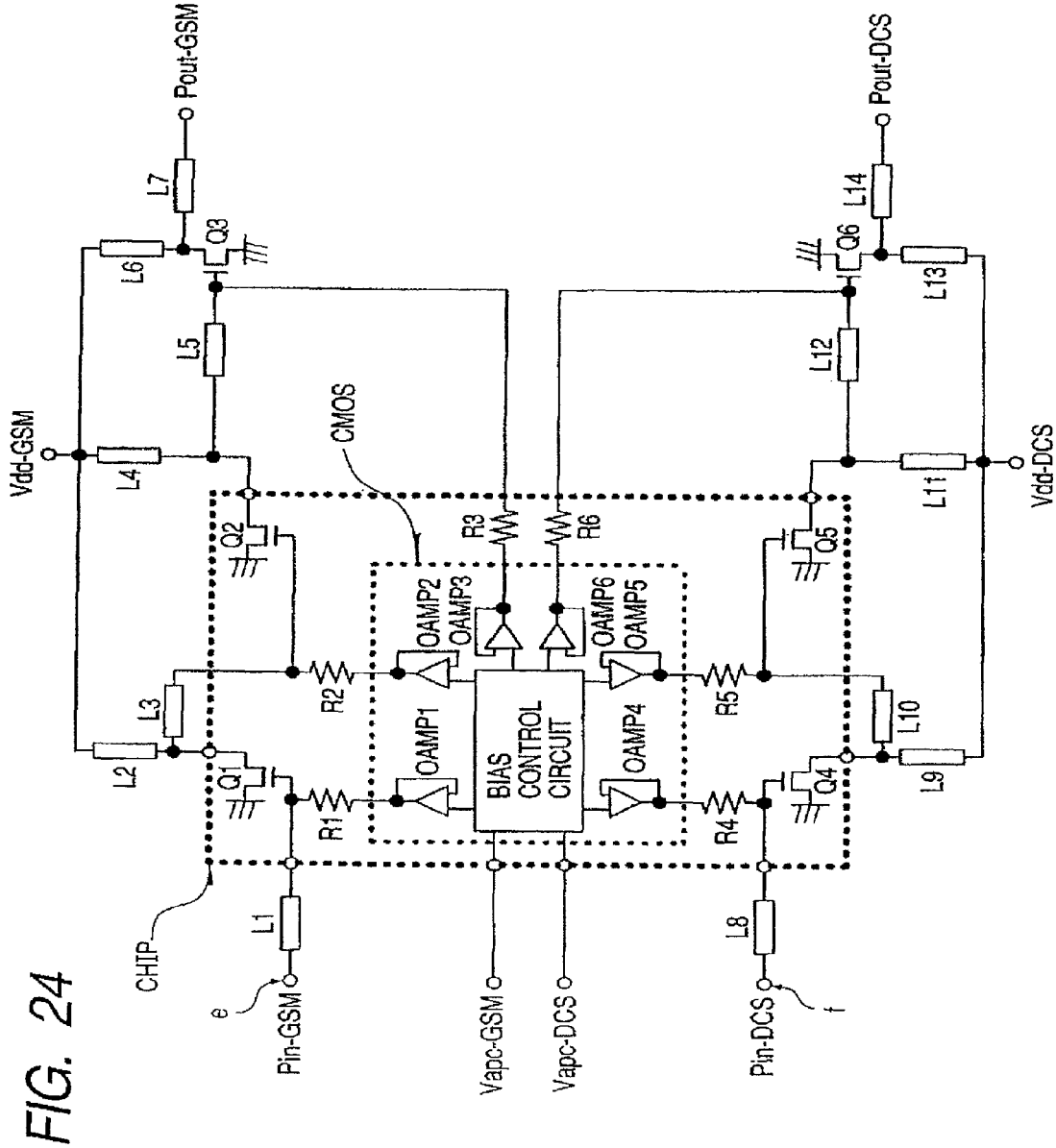
FIG. 24 is an equivalent circuit diagram of a high frequency power amplifier containing a semiconductor device according to the present invention.

The high frequency power amplifier of this embodiment is a dual band type transmission power amplifier incorporated with two systems including a GSM system (Global System for Mobile Communication) at a working frequency of about 500 MHz to 900 MHz (first frequency band) and a DCS system (Digital Cellular System) at a working frequency of about 1.7 GHz to 1.8 GHz (second frequency band), and FIG. 24 is an equivalent circuit diagram of the main portion of the transmission power amplifier.

As shown in FIG. 24, the high frequency power amplifier of this embodiment has an amplification system (first circuit) e for the GSM system serving as a first amplification system and an amplification system (second circuit) f for DCS system serving as a second amplification system. The amplification system e and the amplification system f each has an identical circuit structure although the performance of electronic parts used in each of them are different. Accordingly, in the explanation for the amplification system e, references for the parts in the amplification system f corresponding to the amplification system e are shown in brackets for the explanation of the amplification system f.

External electrode terminals in the amplification system e are Pin-GSM (Pin-DCS in amplification system f) as an input terminal, Pout-GSM (Pout-DCS in amplification system f) as an output terminal, Vdd-GSM (Vdd-DCS in amplification system f) as a first reference potential (power source potential), and Vapc-GSM (Vapc-DCS in amplification system f) as a bias terminal.

Three amplification stages are connected in cascade between Pin-GSM (Pin-DCS) and Pout-GSM (Pout-DCS). The first amplification stage, the second amplification stage and the third amplification stage (final amplification stage) are formed by transistors Q1, Q2 and Q3 (Q4, Q5, A6). Each of the transistors constituting each of the amplification stages has a control terminal for receiving input signals to the stage and a bias potential (gate electrode), a first terminal for sending the output signal of the stage (drain electrode) and a second terminal for receiving the reference potential (GND potential) for the stage (source electrode).

Pin-GSM (Pin-DCS) is connected with the gate electrode of the transistor Q1 (Q4) by way of a matching circuit L1 (L8). Since the amplification system has a three stage constitution, the gate electrodes of the second stage transistor and the third stage transistor are connected to the drain electrodes of the transistors in the preceding stages by way of the matching circuits L3 (L10) and L5 (L12). The drain electrode of the transistor Q3 (Q6) forming the output stage serving as the final amplification stage is connected by way of a matching circuit L7 (L14) to Pout-GSM (Pout-DCS). The drain electrodes of the respective transistors Q1, Q2, and Q3 (Q4, Q5 and Q6) are connected by way of matching circuits L2, L4, and L6 (L9, L11, and L13) to Vdd-GSM (Vdd-DCS).

The gate electrode for the respective transistors Q1, Q2 and Q3 (Q4, Q5, and Q6), are connected by way of resistors R1, R2, and R3 (R4, R5, and R6) operation amplifiers OAMP1, OAMP2, and OAMP3 (OAMP4, OAMP5, and OAMP6) and a bias control circuit to Vapc-GSM (Vapc-DCS).

In FIG. 24, a region shown by CHIP is a chip manufactured by the manufacturing method of the embodiment described above. That is, the transistors Q1 and Q2 (Q4 and Q5) can be formed from the n-channel type power MISFET Qpw (refer to FIG. 11). Further, the region shown by CMOS is a controlling CMOS circuit (analog circuit), which includes a resistor element 11A (refer to FIG. 11), the capacitor element C (refer to FIG. 11), the n-channel type MISFET Qn as a switching element (refer to FIG. 11) and the p-channel type MISFET Qp (refer to FIG. 11) formed by the manufacturing method of this embodiment. Further, the controlling CMOS circuit (analog circuit) conducts a switching operation (selection) for the GSM amplification system e or the DCS amplification system f.

Figure 25:
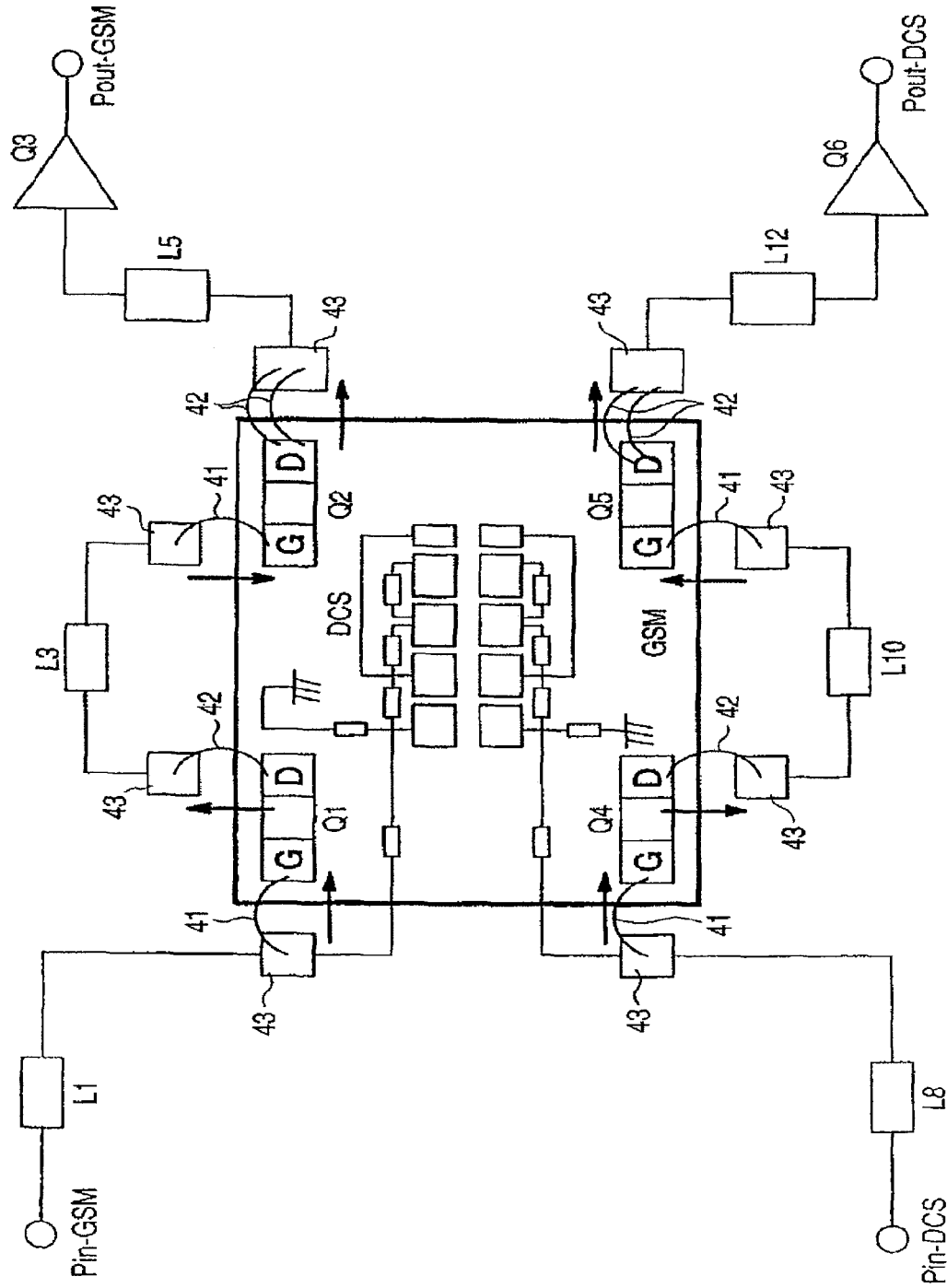
FIG. 25 is a plan view illustrating a positional relation for electrode pads and bonding wires of a chip representing a semiconductor device of the present invention and bonding pads outside the chip.

FIG. 25 is a plan view showing the outline of the chip of this embodiment and a positional relation between the electrode pads (gate electrodes and the drain electrodes) of the chip and bonding wires and bonding pads outside of the chip.

As shown in FIG. 25, in this embodiment, the transistors Q1, Q2, Q4, and Q5 are located at four corners of a planar rectangular chip, respectively. Accordingly, the transistors Q1 and Q2 of the amplification system e for GSM system and the transistors Q4 and Q5 of the amplification system f for DCS system can be arranged such that the extending direction of wires (first wire) 41 connected with the gate electrodes (first direction) and the extending direction of wires (second wire) 42 connected with the drain electrodes (second direction) are perpendicular to each other. As a result, cross-talk between the input power and the output power can be suppressed. Cross-talk can also be suppressed by arranging both of the wires in a crossing state approximate to perpendicular crossing, although they are not perpendicular to each other. The other end of the wire 41 is, for example, connected with a bonding pad 43 as a portion of the wiring formed to the mounting substrate to which the chip is bonded.

The high frequency power amplifier of this embodiment, as described above, can be used, for example, in mobile communication equipment of a dual mode type, which is being switched between two systems, that is, the GSM system and the DCS system.

Embodiment 2

Figure 26:
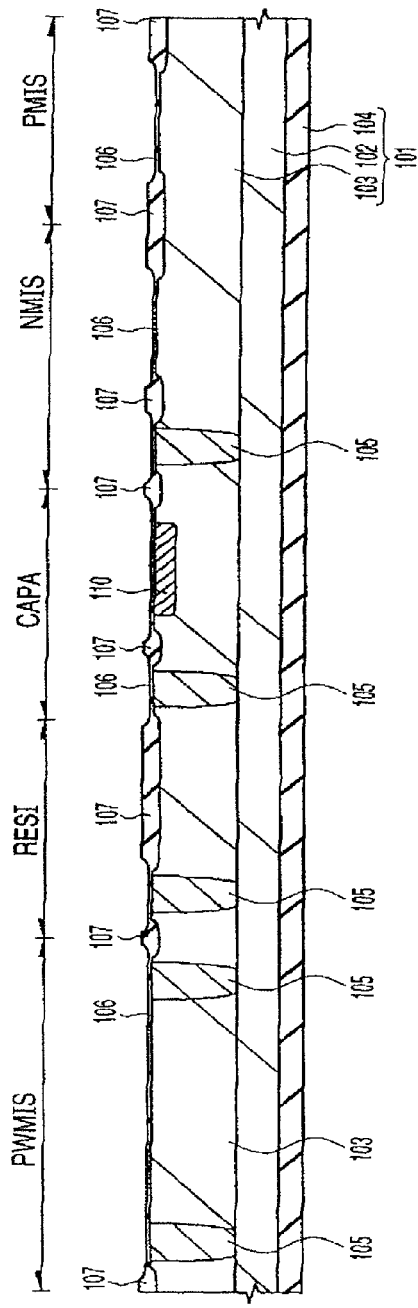
FIG. 26 is a cross sectional view of the main portion of a semiconductor device illustrating a step in the method of manufacturing the semiconductor device according to an embodiment of the present invention.
Figure 27:
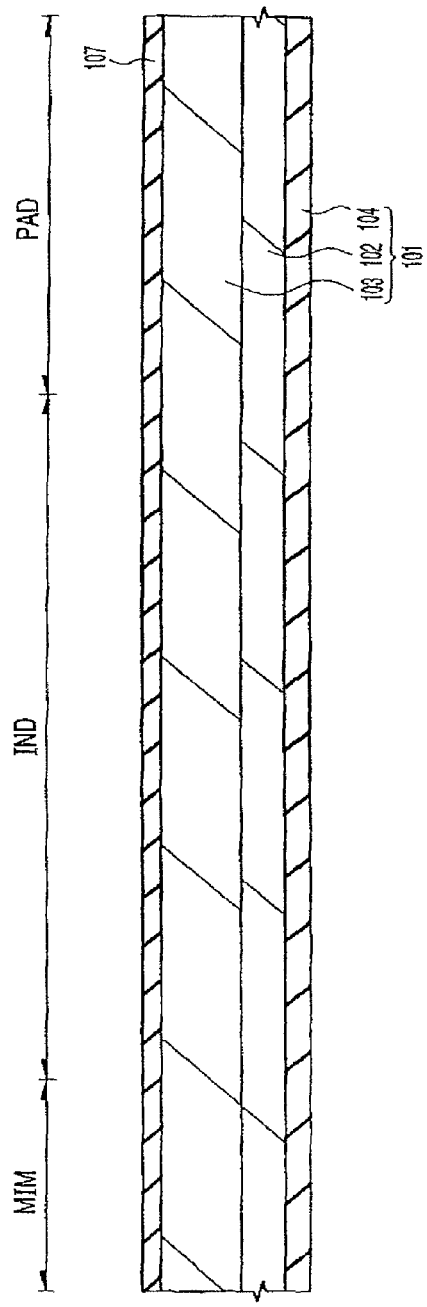
FIG. 27 is a cross sectional view of the main portion of the semiconductor device illustrating the method of manufacturing the semiconductor device according to an embodiment of the present invention.

At first, a substrate 101, as shown in FIG. 26 and FIG. 27, is provided. The substrate 101 comprises a semiconductor substrate 102 comprising single crystal silicon with a resistivity of about 3 mΩcm to 6 mΩcm, a single crystal silicon layer 103 epitaxially grown to the main surface of the semiconductor substrate 102 and a silicon oxide film 104 formed to the rear face of the semiconductor substrate 102. As an example, the single crystal silicon layer 103 is doped with impurities of a p-conduction type (for example, B (boron)) and has a resistivity of about 18 Ωcm to 23 Ωcm and a thickness of about 2.9 μm to 3.1 μm. The silicon oxide film 104 has a function of protecting the rear face of the semiconductor substrate 102 from contamination and damage. Further, the substrate 101 is divided, for example, into a region formed with a protection diode in the succeeding step (not illustrated), a region PWMIS formed with an n-channel power MISFET, a region RESI formed with a resistor element, a region CAPA formed with a capacitor element to form an analog circuit, a region NMIS formed with an n-channel MISFET, and a region PMIS formed with a p-channel MISFET, a region NIM formed with a capacitor element used in the high frequency band circuit, a region IND formed with an inductor used in the high frequency band circuit and a region PAD formed with bonding pads for connection with bonding wires.

Then, impurity ions having a p-conduction type (for example, B) are introduced to the single crystal silicon layer 103 using a photoresist film (not illustrated) patterned by photolithography as a mask thereby forming a $p^{++}$-semiconductor region (impurity layer) 105. Then, the photoresist film is removed.

Successively, a heat treatment is applied at about 850° C. to the substrate to form a thin silicon oxide film 106 of about 15 nm thickness to the surface of the single crystal silicon layer 103 and the $p^{++}$ semiconductor region 105. Then, a silicon nitride film of about 140 nm thickness (not illustrated) is deposited on the silicon oxide film 106 by a CVD method. Then, the silicon nitride film is patterned (etched) using a photoresist film (not illustrated) patterned by photolithography as a mask. Then, after removing the photoresist film, a heat treatment is applied to the substrate 101 by using steam at about 1050° C. for about 33 min to selectively increase the thickness of the silicon oxide film 106, thereby forming a field insulator film 107 of about 350 nm thickness. The region formed with the field insulator film 107 can be defined as a device isolation region and other regions can be defined as device forming regions (active region). Successively, the silicon nitride film that remain on the silicon oxide film 106 is removed by cleaning the substrate 101.

Then, impurity ions having a n-conduction type (for example, As (arsenic)) are introduced to the region CAPA to be formed with a capacitor element by the subsequent step using a photoresist film patterned by photolithography as a mask, thereby forming an n-semiconductor region 110. The role of the n-semiconductor region 110 will be described specifically in connection with the process where the capacitor element is completed in the region CAPA.

Figure 28:
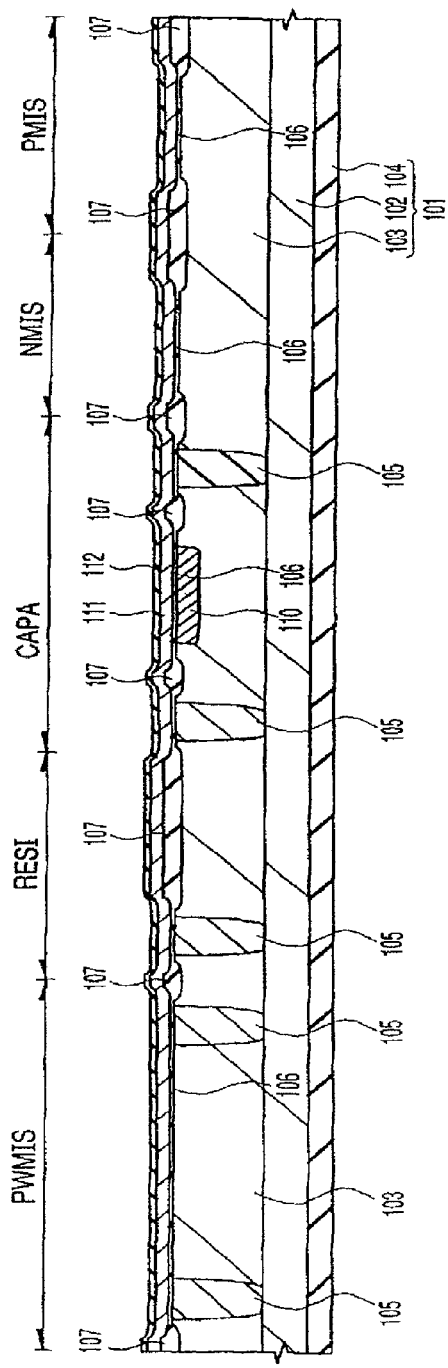
FIG. 28 is a cross sectional view of the main portion of the semiconductor device during a manufacturing step succeeding the step of FIG. 26.
Figure 29:
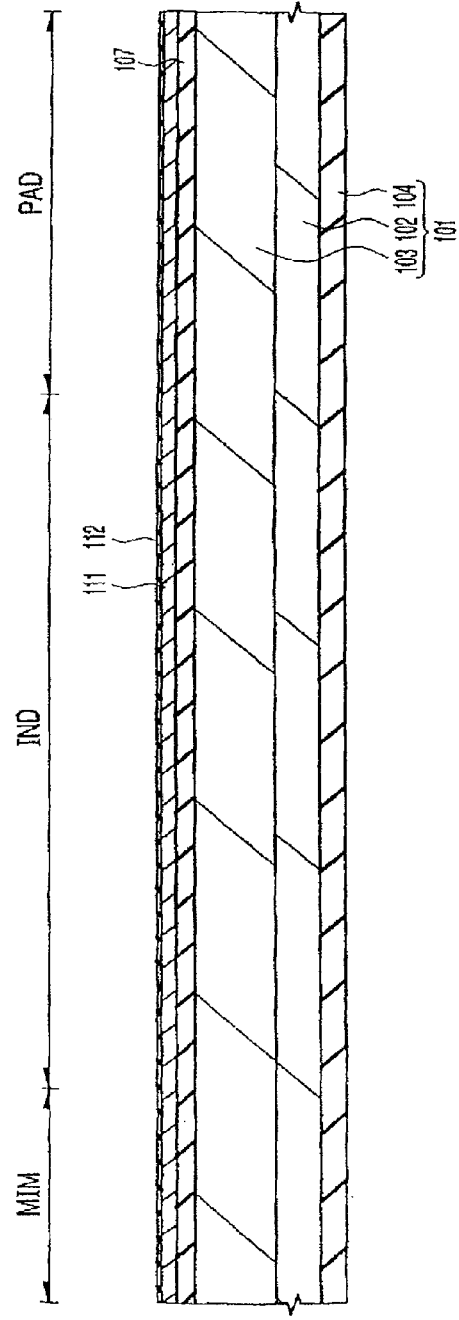
FIG. 29 is a cross sectional view of the main portion of the semiconductor device during a manufacturing step succeeding the step of FIG. 27.

Then, as shown in FIG. 28 and FIG. 29, an intrinsic polycrystal silicon film (first silicon layer) 111 of about 150 nm is deposited over the substrate 101. Successively, an ONO film 112 is deposited on the polycrystal silicon film 111. The deposition step for the ONO film 112 will be described in detail with reference to FIG. 30.

Figure 30:
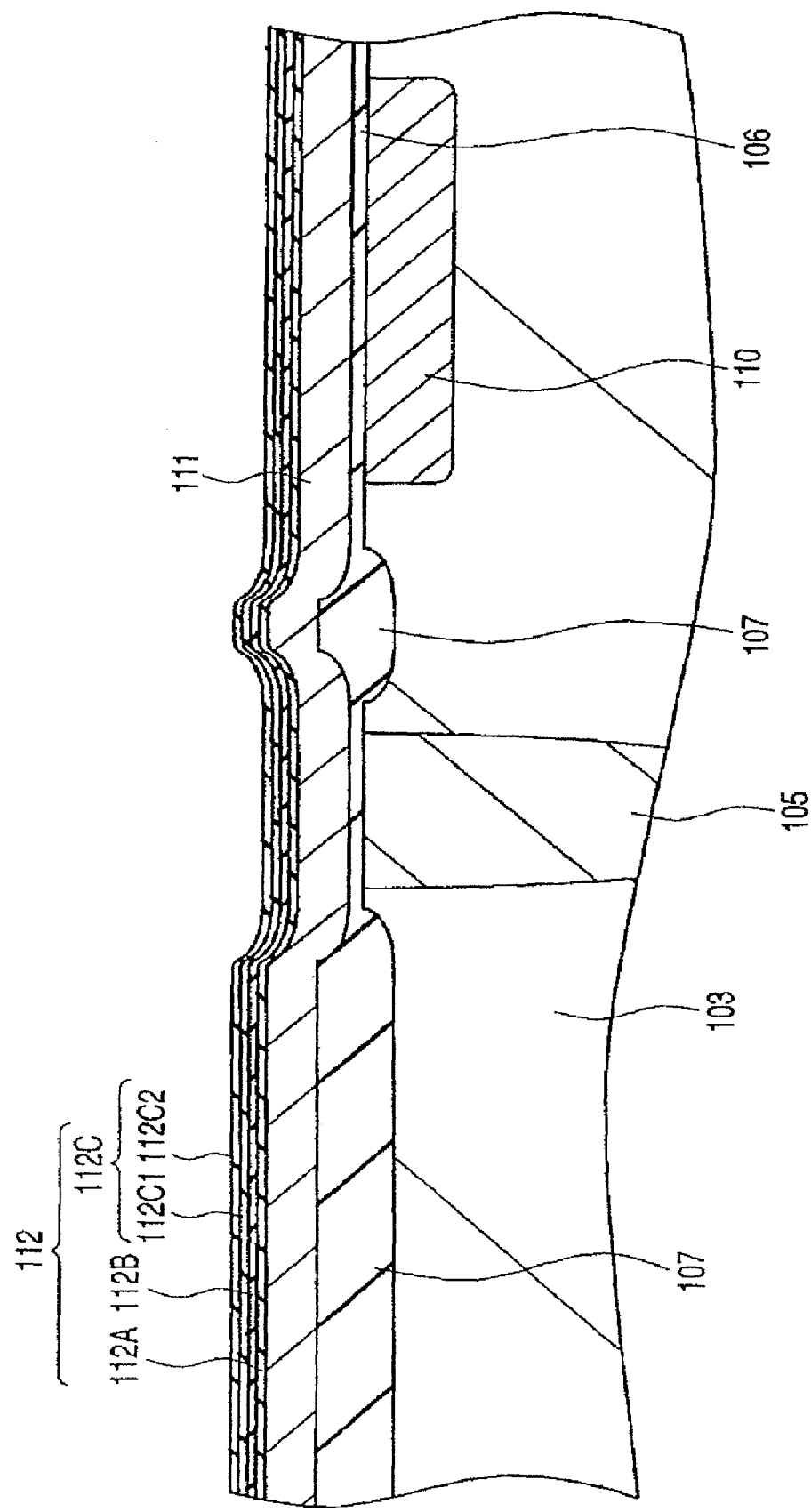
FIG. 30 is a cross sectional view the main portion of the semiconductor device during manufacture of the semiconductor device.

FIG. 30 is a cross sectional view of a main portion showing the vicinity of the regions RESI and CAPA in an enlarged scale. After depositing the polycrystal silicon film 111, a heat treatment at about 800° C. is applied at first to the substrate 101 thereby forming a thin silicon oxide film 112A at about 4 to 5 nm on the surface of the polycrystal silicon film 111. Successively, impurity ions having a n-conduction type (for example, P (phosphorus)) are introduced into the polycrystal silicon film 111. The impurity ions introduced into the polycrystal silicon film 111 can be diffused favorably into the polycrystal silicon film 111 by the hysteresis of the heat treatment in the manufacturing steps after forming the resistor element, and the resistor element can be activated favorably upon forming the resistor element from the polycrystal silicon film 111 in the subsequent step.

Successively, a silicon nitride film 112B of about 20 nm thickness is deposited on the silicon oxide film 112A, for example, by a CVD method. Successively, the surface of the silicon nitride film 112B is oxidized by a heat treatment at about 1100° C. to form a silicon oxide film 112C1. Successively, a silicon oxide film 112C2 of about 15 nm thickness is deposited on the silicon oxide film 112C1 by a CVD method to form a silicon oxide film 112C comprising the silicon oxide films 112C1 and 112C2. The ONO film 112 can be formed from the silicon oxide film 112A, the silicon nitride film 112B, and the silicon oxide film 112C. The ONO film 112 is fabricated to a capacitor dielectric film of the capacitor element in the subsequent step. Further, by stacking the silicon oxide film 112C2 on the silicon oxide film 112C1 upon forming the silicon oxide film 112C, the durability of the ONO film 112 to time dependent dielectric breakdown can be improved. This can improve the reliability of the capacitor element to be formed in the subsequent step.

Then, as shown in FIG. 31, the ONO film 112 and the polycrystal silicon film 111 are patterned by etching using a photoresist film (not illustrated) patterned by photolithography as a mask. Thus, a resistor element 111A comprising the polycrystal silicon film 111 is formed in the region RESI to be formed with the resistor element, and a lower electrode (wiring layer) 111B for the capacitor element comprising the polycrystal silicon film 111 is formed in the region CAPA to be formed with the capacitor element. Further, a capacitor dielectric film of the capacitor element comprising the patterned ONO film 112 for forming an analog circuit can be formed in the region CAPA.

Then, after removing the photoresist film used for patterning the ONO film 112 and the polycrystal silicon film 111, impurity ions having a n-conduction type (for example, P) are introduced into the single crystal silicon layer 103 of the region PMIS to be formed with the p-channel MISFET using a further photoresist film (not illustrated) patterned by photolithography as a mask, thereby forming an n-well 113 as shown in FIG. 32.

Successively, after removing the photoresist film used for forming the n-channel 113, impurity ions having a p-conduction type (for example, B) are introduced by using a further photoresist film (not illustrated) patterned by photolithography as a mask, thereby forming a p-well 114 to the polycrystal silicon layer 103 of the region PWMIS to be formed with the n-channel type power MISFET and a region NMIS to be formed with the n-channel type MISFET. Further, the p-well 114 is formed also to the single crystal silicon layer 103 below the field insulator film 107 surrounding the active region in the region PMIS. The p-well 114 formed below the field insulator film 107 can function as a channel stopper after forming the p-channel type MISFET in the region PMIS.

Then, after removing the photoresist film used for forming the p-well 114, impurity ions having a p-conduction type (for example, BF$_2$ (boron difluoride)) are introduced by using a further photoresist film (not illustrated) patterned by photolithography as a mask, thereby forming a p$^-$-semiconductor region 115 in the region NMIS. By the formation of the p$^-$-semiconductor region 115, the threshold voltage for the n-channel type MISFET to be formed in the region NMIS by the subsequent step can be controlled. Further, since there may be a concern for the occurrence of punch through due to the short channel effect as the gate length is smaller in the MISFET, the short channel effect can be suppressed by forming the p$^-$-semiconductor region 115.

Then, after removing the photoresist film used for forming the p$^-$-semiconductor region 115, the substrate 101 is cleaned. Successively, a heat treatment at about 800° C. is applied to the substrate 101 to form a gate insulation film 116 to the surface of each of the active regions in the region PWMIS to be formed with an n-channel type power MISFET, a region NMIS to be formed with an n-channel type MISFET and a region PMIS to be formed with a p-channel type MISFET. Successively, a polycrystal silicon film 117 (second silicon layer) doped with impurity ions (for example, P or B), a WSi (tungsten silicide) film 118 and a silicon oxide film 119 are stacked successively from the lower layer over the substrate 101. The polycrystal silicon film 117, the WSi film 118 and the silicon oxide film 119 can be deposited respectively by a CVD method and the thickness of respective films can be, for example, about 100 nm, 150 nm and 150 nm. Further, instead of depositing the WSi film 118, a barrier metal film, such as a titanium nitride film, and a W (tungsten) film may be stacked successively from the lower layer.

Then, the silicon oxide film 119, the WSi film 118 and the polycrystal silicon film 117 are patterned by etching using a photoresist film (not illustrated) patterned by photolithography as a mask. Thus, it is possible to form a gate electrode (wiring layer) 120A comprising the polycrystal silicon film 117 and the WSi film 118 in the region PWMIS, to form an upper electrode (wiring layer) 120B of a capacitor element comprising the polycrystal silicon film 117 and the WSi film 118 for forming an analog circuit to a region above the lower electrode 111B in the region CAPA, and to form gate electrodes (wiring layer) 120C and 120D each comprising the polycrystal silicon film 117 and the WSi film 118 in the regions NMIS and PMIS, respectively. Since the gate electrodes 120A, 120C, and 120D are formed as a structure by stacking the polycrystal silicon film 117 and the WSi film 118, the wiring resistance of the gate electrodes 120A, 120C, and 120D can be decreased. Further, by the steps described so far, a capacitor element C comprising the lower electrode 111B, the ONO film 112 serving as a capacitor insulation film, and the upper electrode 120B for forming the analog circuit can be formed in the region CAPA (first capacitor element, passive element).

Upon patterning the silicon oxide film 119, the WSi film 118, and the polycrystal silicon film 117, the silicon nitride film 112B (refer to FIG. 30) forming the ONO film 112 can be used as an etching stopper to protect the lower electrode 111B from overetching in the region CAPA.

As described above, while the gate electrodes 120A, 120C, and 120D each comprising the polycrystal silicon film 117 and the WSi film 118 are formed in this embodiment, it may be considered to form the gate electrodes 120A, 120C, and 120D from the polycrystal silicon film 111 like the resistor element 111A and the lower electrode 111B and the capacitor element C. However, in a case of forming the gate electrodes 120A, 120C, and 120D from the polycrystal silicon film 111, it may be a concern that the side wall of the gate electrodes 120A, 120C, and 120D will be etched upon patterning the silicon oxide film 119, the WSi film 118, and the polycrystal silicon film 117 in the subsequent steps, thereby to make the size of the gate electrodes 120A, 120C, and 120D different from the design values. Accordingly, it is preferred that the gate electrodes 120A, 120C, and 120D are formed of the polycrystal silicon film 117 and the WSi film 118, as in this embodiment.

Figure 33:
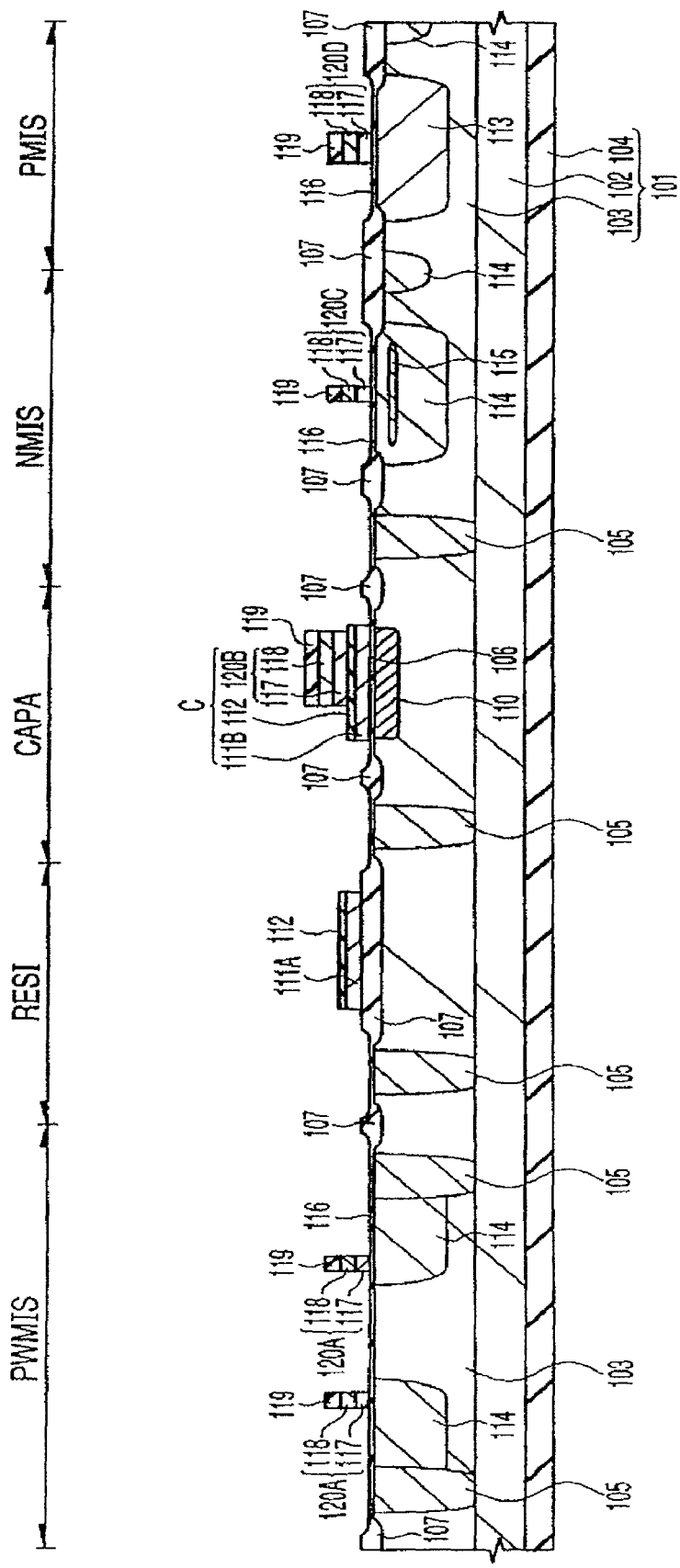
FIG. 33 is a cross sectional view of the main portion of the semiconductor device during a manufacturing step succeeding the step of FIG. 32.
Figure 34:
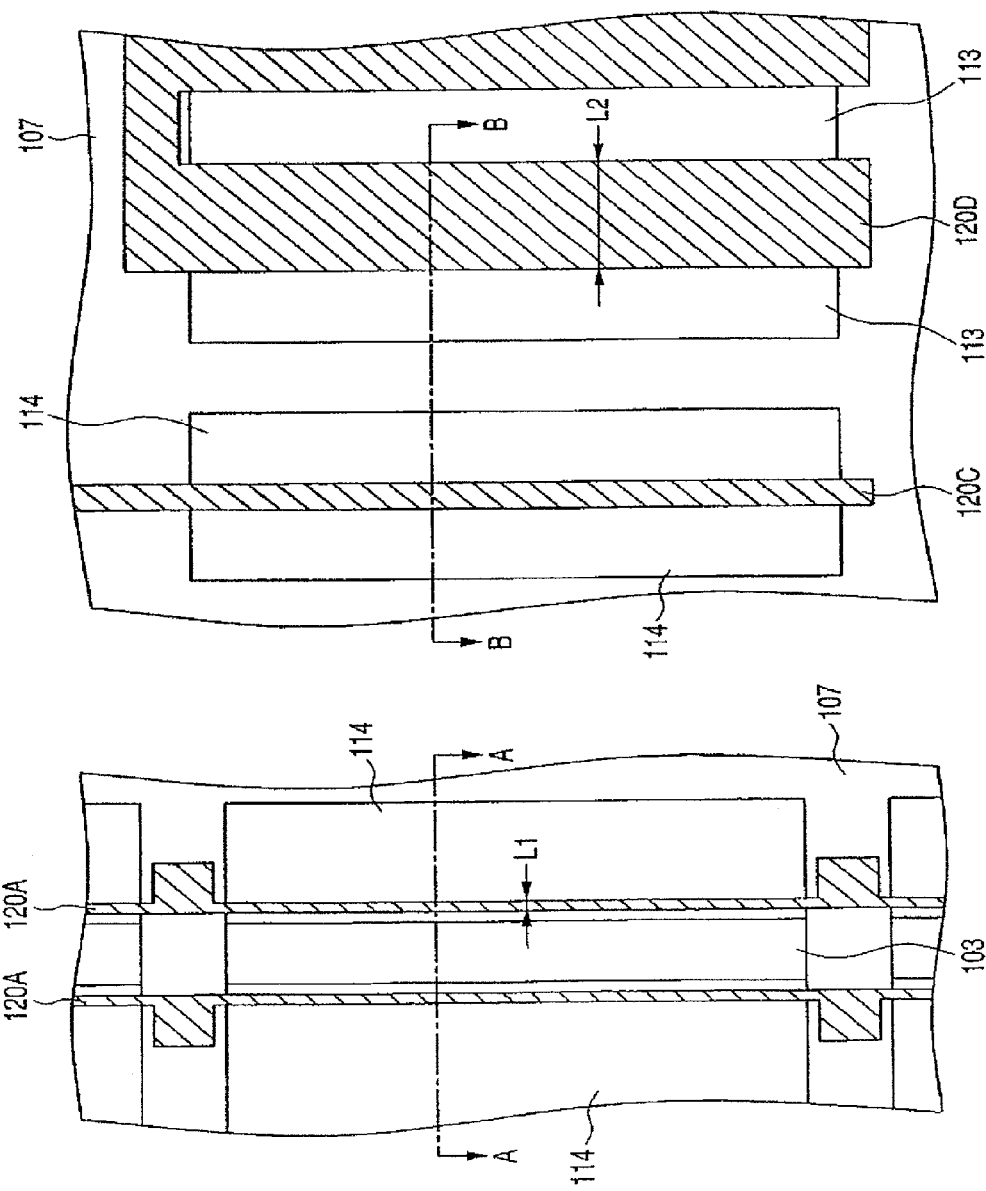
FIG. 34 is a plan view of the main portion of the semiconductor device during the manufacture of the semiconductor device according to the present invention.

As shown in FIG. 34, the gate electrodes 120A and 120D are patterned respectively such that the gate length L1 for the n-channel type power MISFET formed in the region PWMIS is smaller than the gate length L2 for the p-channel type MISFET formed in the region PMIS in this embodiment. The gate length L1 for the n-channel type power MISFET and the gate length L2 for the p-channel type MISFET can be defined, for example, as being about 0.3 μm and 1 μm, respectively. Further, the gate length for the n-channel type MISFET formed in the region NMIS can also be defined, for example, as being about 1 μm. The region PWMIS in FIG. 33 shows a cross section along line A-A in FIG. 34, and regions NMIS and PMIS show a cross section along line B-B in FIG. 34.

In this embodiment, with the aim of amplifying high frequency power, an improvement of the gain is demanded for the n-channel type power MISFET. Since the gain of the MISFET is in inverse proportion with the gate length, a method may be considered for patterning the gate electrode 120A such that the gate length for the n-channel type power MISFET is as short as possible. Further, in the MISFET, there is a concern for the occurrence of punch through due to the short channel effect as the gate length decreases. Thus, in the region PWMIS to be formed with the n-channel type power MISFET, the short channel effect can be suppressed by introducing impurity ions having a p-conduction type into the p-well 114 and the single crystal silicon layer 103 in the n-channel power MISFET.

On the other hand, since the p-channel type MISFET formed in the region PMIS constitutes a switching element, it is not required that the gain is so high as compared with the n-channel type power MISFET. In the p-channel type power MISFET, the short channel effect can be suppressed by increasing the gate length without using means for suppressing the short channel effect by the introduction of impurity ions having a n-conduction type.

That is, in this embodiment, respective gate electrodes 120A and 120D are patterned such that the gate length L2 for the p-channel type MISFET formed in the region PMIS is larger than the gate length L1 for the n-channel type power MISFET formed in the region PWMIS, as described above. In the n-channel type MISFET formed in the region NMIS, since punch through due to the short channel effect tends to occur more compared with the p-channel type MISFET, introduction of impurity ions for suppressing the short channel effect is conducted for the n-channel type MISFET (formation of the p$^-$-semiconductor region) in this embodiment.

Figure 35:
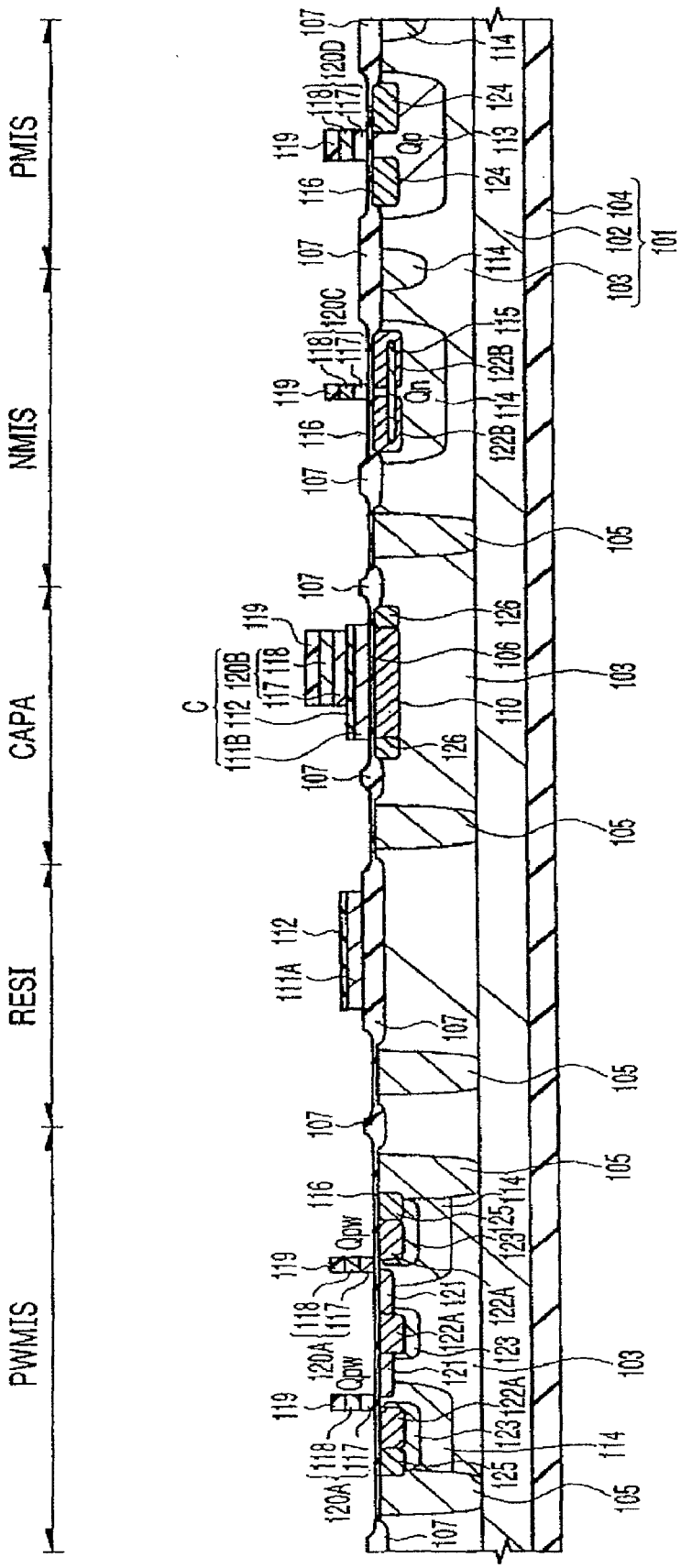
FIG. 35 is a cross sectional view of the main portion of the semiconductor device during a manufacturing step succeeding the step of FIG. 33.

After removing the photoresist film used for patterning the silicon oxide film 119, the WSi film 118 and the polycrystal silicon film 117, impurity ions having a n-conduction type (for example, P) are introduced into the single crystal silicon layer 103 in the region PWMIS using a further photoresist film (not illustrated) patterned by photolithography as a mask, thereby forming an n$^-$-semiconductor region 121, as shown in FIG. 35. Successively, after removing the photoresist film over the substrate 101, impurity ions having a n-conduction type (for example, As) are introduced into the single crystal silicon layer 103 in the p-well 114 and the region PWMIS using a further photoresist film (not illustrated) patterned by photolithography as a mask, thereby forming n$^+$-semiconductor regions 122A and 122B to the regions PWMIS and NMIS, respectively. By the steps described so far, an n-channel type power MISFET (active element, second MISFET) Qpw having the n$^+$-semiconductor region 122A as a source•drain can be formed in the region PWMIS, and an n-channel type power MISFET (active element, first MISFET) Qn having the n$^+$-semiconductor region 122B as a source•drain can be formed in the region NMIS.

Then, after removing the photoresist film above the substrate 101, impurity ions having a p-conduction type (for example, B) are introduced into the p-well 114 in the region PWMIS using a further photoresist film (not illustrated) patterned by photolithography as a mask, thereby forming a W-semiconductor region 123. In this case, the impurity ions are implanted obliquely to the main surface (element forming surface) of the substrate 101. By forming the p$^-$-semiconductor region 123, the short channel effect in the n-channel type power MISFET Qpw can be suppressed.

Successively, after removing the photoresist film above the substrate 101, impurity ions having a p-conduction type (for example, BF$_2$) are introduced into the region PMIS, the region PWMIS and the region CAPA by using a further photoresist film (not illustrated) patterned by photolithography as a mask, thereby forming p$^+$-semiconductor regions 124, 125 and 126, respectively. By the steps described so far, the p-channel type MISFET (active element) Qp having the p$^+$-semiconductor region 124 as a source•drain can be formed in the region PMIS. Further, in the region PWMIS, the p-semiconductor region 125 can be used as a channel stopper. The p$^+$-semiconductor region 126 is formed in a region surrounding the n-semiconductor region 110, as seen in plan view.

As described above, in this embodiment, since the n-semiconductor region 110 is formed on the surface of the single crystal silicon layer 103 just below the capacitor element C, when a positive voltage is applied to the capacitor element C, an n-inversion layer (not illustrated) is formed to the surface of the single crystal silicon layer 103 just below the capacitor element C, and, further, a depletion layer (not illustrated) is formed just below the inversion layer. In a case where the inversion layer 28 and the depletion layer are formed, a parasitic capacitance having the capacitor element C and the inversion layer serving as the capacitor electrodes and the silicon oxide film 106 serving as a capacitor insulation film, as well as a parasitic capacitance having the inversion layer and the single crystal silicon layer 103 serving as capacitor electrodes and the depletion layer serving as the capacitor insulation film are formed. In this case, since the parasitic capacitance formed between the capacitor element C and the single crystal silicon layer 103 is a synthesis capacitance formed by serially connecting a parasitic capacitance formed between the capacitor element C and the inversion layer, and a parasitic capacitance formed between the inversion layer and the single crystal silicon layer 103, the capacitance value can be decreased. Further, in this embodiment, since the p$^+$-semiconductor region 126 is formed in the region surrounding the n-semiconductor region 110, as seen in plan view, the inversion layer and the depletion layer can be prevented from extending in the horizontal direction (direction along with the main surface of the substrate). Since this can prevent an increase in the region of the capacitor electrode, an increase of the parasitic capacitance value can be prevented.

Figure 36:
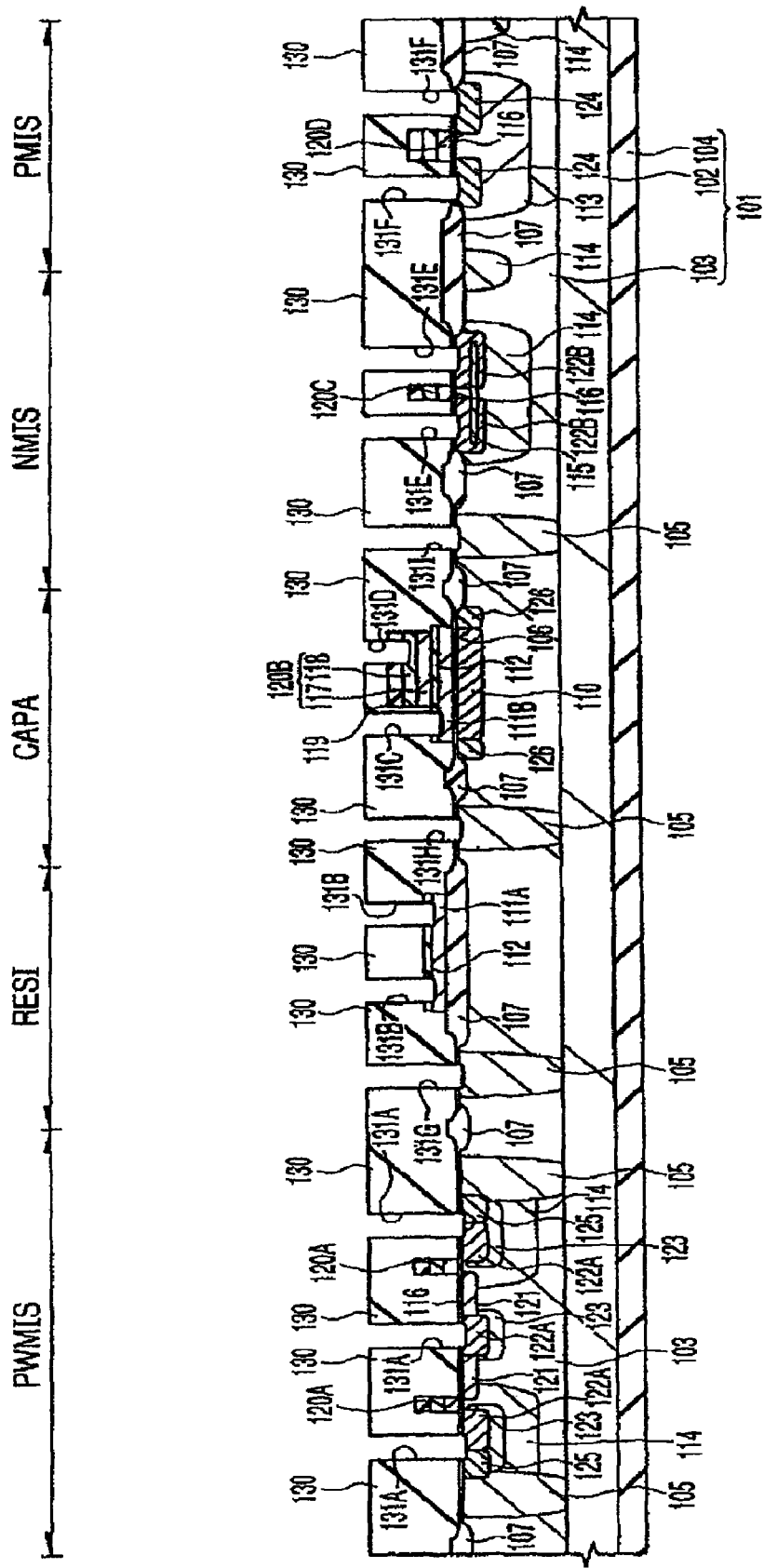
FIG. 36 is a cross sectional view of the main portion of the semiconductor device during a manufacturing step succeeding the step of FIG. 35.
Figure 37:
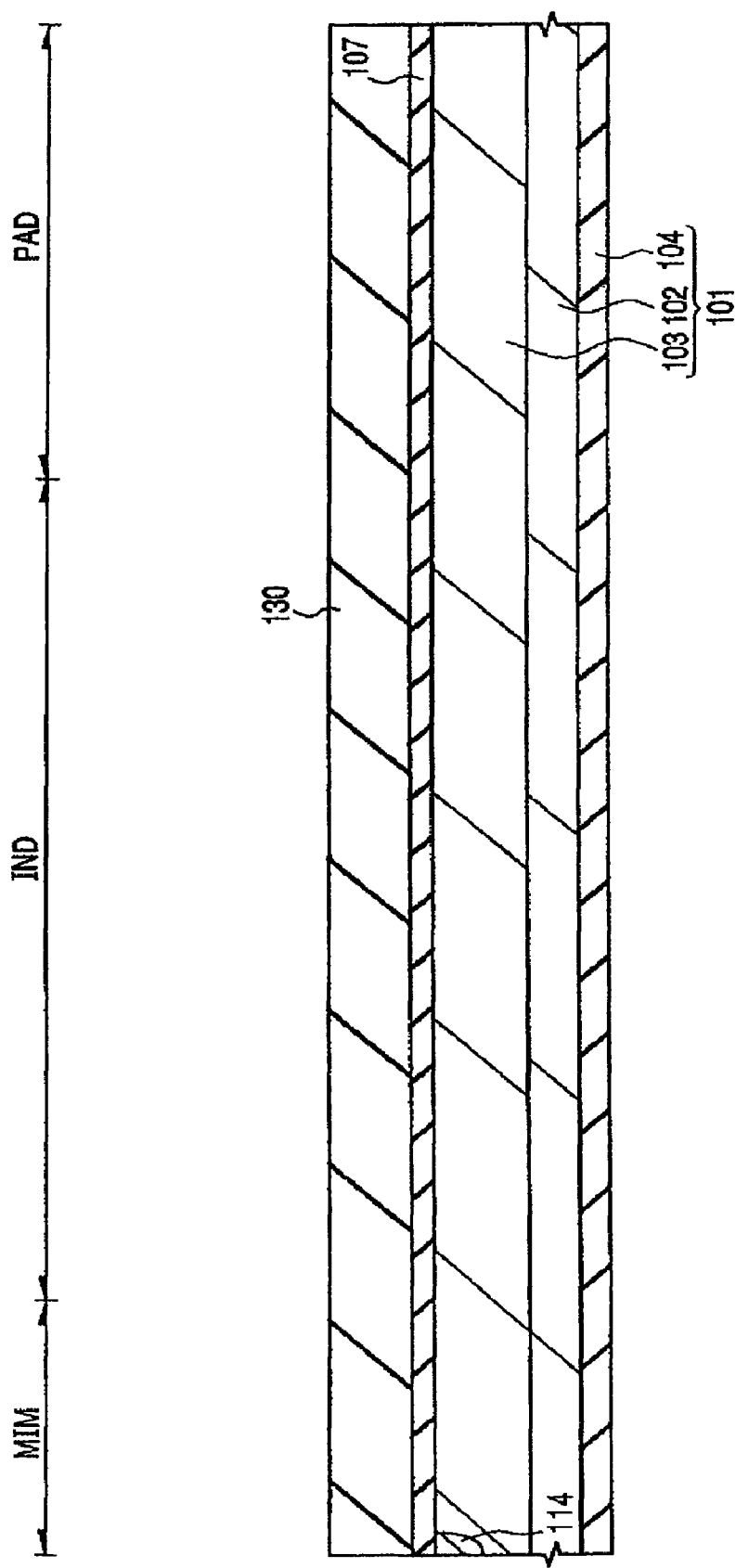
FIG. 37 is a cross sectional view of the main portion of a semiconductor device according to an embodiment of the present invention.

Then, after removing the photoresist film used for forming the p$^+$-semiconductor regions 124, 125, and 126, a silicon oxide film (first insulation film) 130 is deposited over the substrate 101, as shown in FIG. 36 and FIG. 37. Successively, after polishing the surface of the silicon oxide film 130 by a CMP (Chemical Mechanical Polishing) method to planarize the surface thereof, connection holes 131A-131F are formed by etching the silicon oxide film 130 using a photoresist film (not illustrated) patterned by photolithography as a mask. The connection hole 131A connects with the n$^+$-semiconductor region 122A and the p$^+$-semiconductor region 125 in the region PWMIS, the connection hole 131B connects with the resistor element 111A in the region RESI, the connection hole 131C connects with a lower electrode 111B of the resistor element C (refer to FIG. 33) in the region CAPA, the connection hole 131D connects with the upper electrode 120B of the resistor element C in the region CAPA, the connection hole 131E connects with the n$^+$-semiconductor region 122B in the region NMIS, and the connection hole 131F connects with the p$^+$-semiconductor region 124 in the region PMIS, the connection hole 131H connects with the p$^{++}$-semiconductor region 105 in the region CAPA, and the connection hole 131I connects with the p++-semiconductor region 105 in the region NMIS. In this case, connection holes reaching the gate electrodes 120A, 120C, and 120D are also formed, but not illustrated, in FIG. 36.

When the connection hole 131D is formed, since the WSi film 118 with lower etching selection ratio compared with the silicon oxide film can be used as an etching stopper, this can prevent the connection hole 131D from reaching the lower electrode 111B. That is, when a plug is formed in the connection hole 131D in the subsequent step, it can prevent the disadvantage that the upper electrode 120B and the lower electrode 111B of the resistor element C are short-circuited by the plug.

Figure 38:
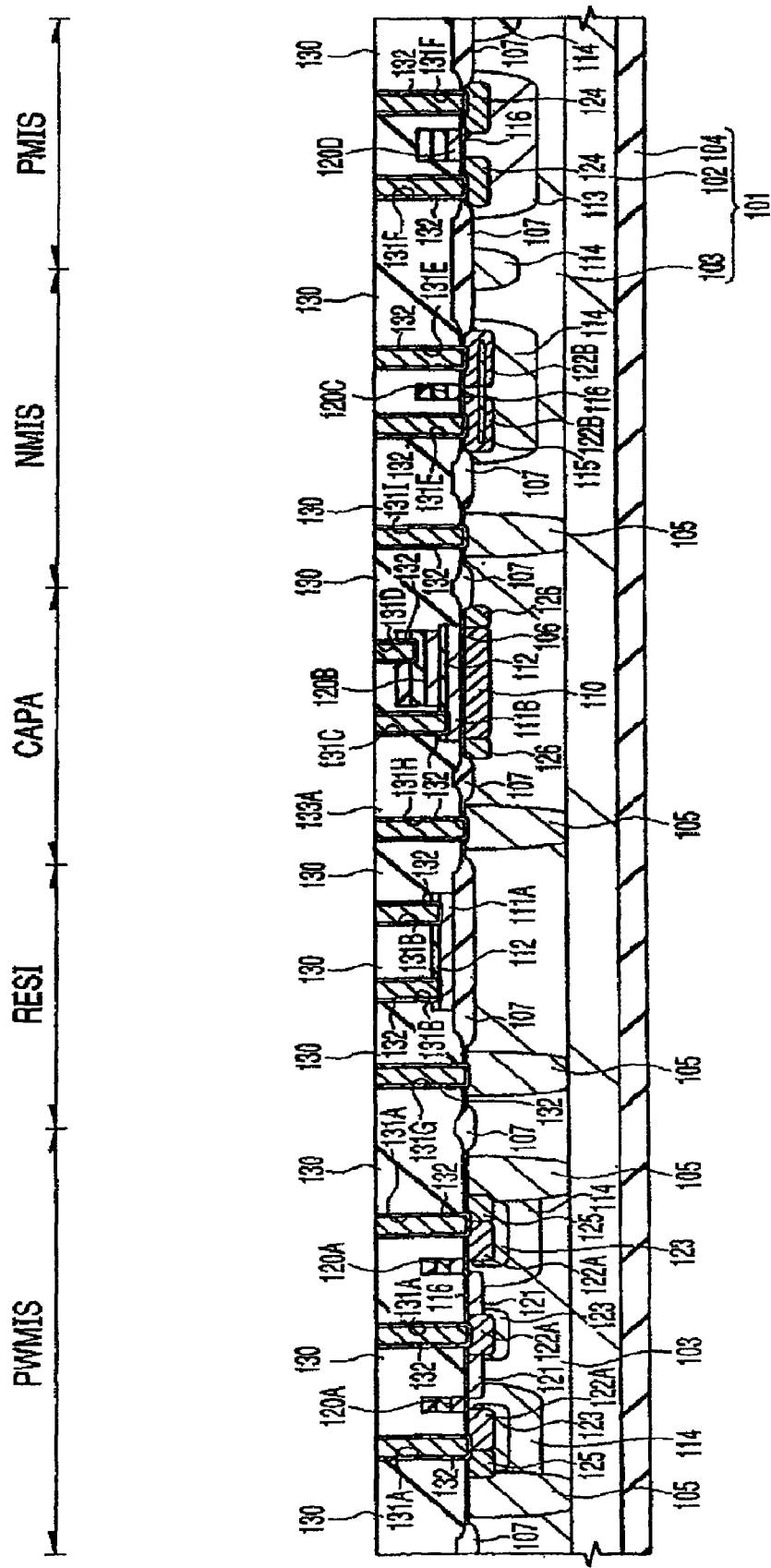
FIG. 38 is a cross sectional view of the main portion of the semiconductor device during a manufacturing step succeeding the step of FIG. 36.
Figure 39:
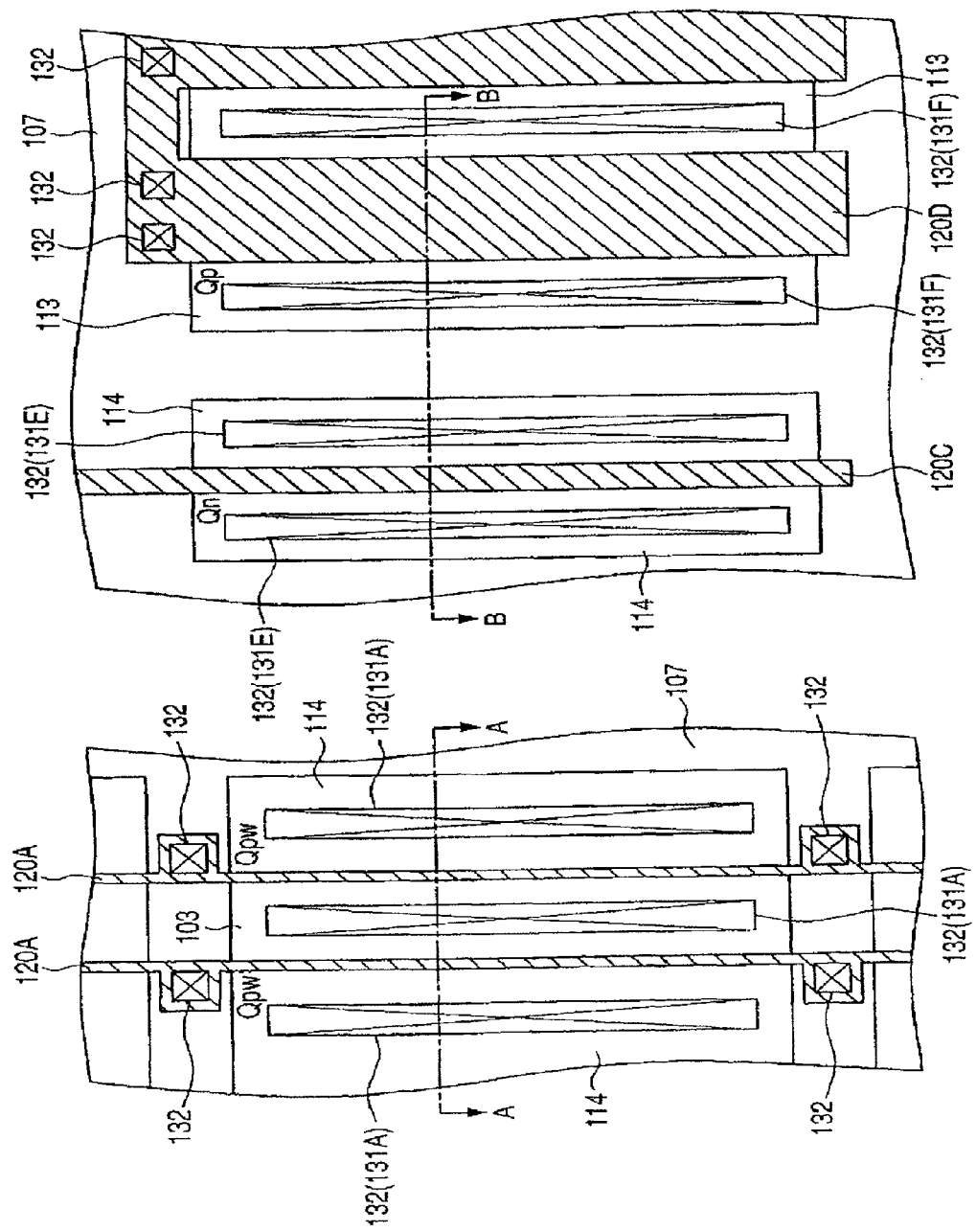
FIG. 39 is a plan view of the main portion of the semiconductor device during the manufacture of the semiconductor device according to the present invention.

Then, after removing the photoresist film used for perforating the connection holes 131A to 131F, a Ti (titanium) film of about 30 nm thickness and a TiN (titanium nitride) film of about 80 nm thickness are deposited successively from the lower layer over the silicon oxide film 130 including the inside of the connection holes 131A to 131F and the inside of the connection holes reaching the gate electrodes 120A, 120C, and 120D, as shown in FIG. 38 and FIG. 39. Successively, after applying a heat treatment at about 650° C. to the substrate 101, a W (tungsten) film of about 700 nm thickness for burying the connection holes is deposited over the substrate 101. Then, by removing the W film, the TiN film and the Ti film above the silicon oxide film 130 by an etching back method, plugs 132 comprising the TiN film and the Ti film serving as the barrier conductor film and the W film as the main conductive layer can be formed in the connection holes. FIG. 39 is an enlarged plan view of a main portion in the vicinity of the gate electrodes 120A, 120C, and 120D for the n-channel type power MISFET Qpw, the n-channel type MISFET Qn and the p-channel type MISFET Qp respectively upon formation of the plugs 132. Further, the region PWMIS in FIG. 38 shows a cross section along line A-A in FIG. 39 and regions NMIS and PMIS show cross sections along line B-B in FIG. 39.

Figure 40:
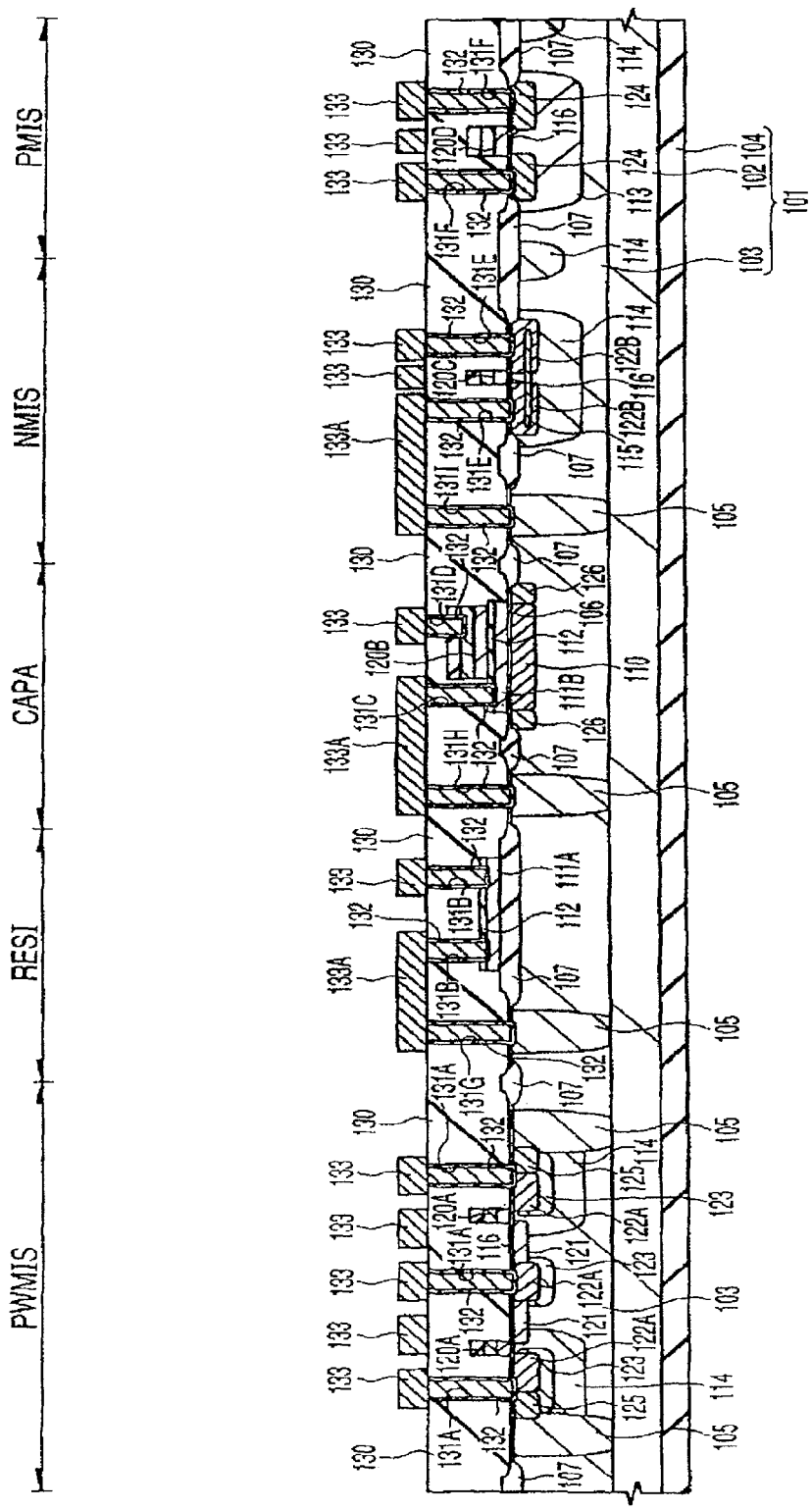
FIG. 40 is a cross sectional view of the main portion of the semiconductor device during a manufacturing step succeeding the step of FIG. 38.
Figure 41:
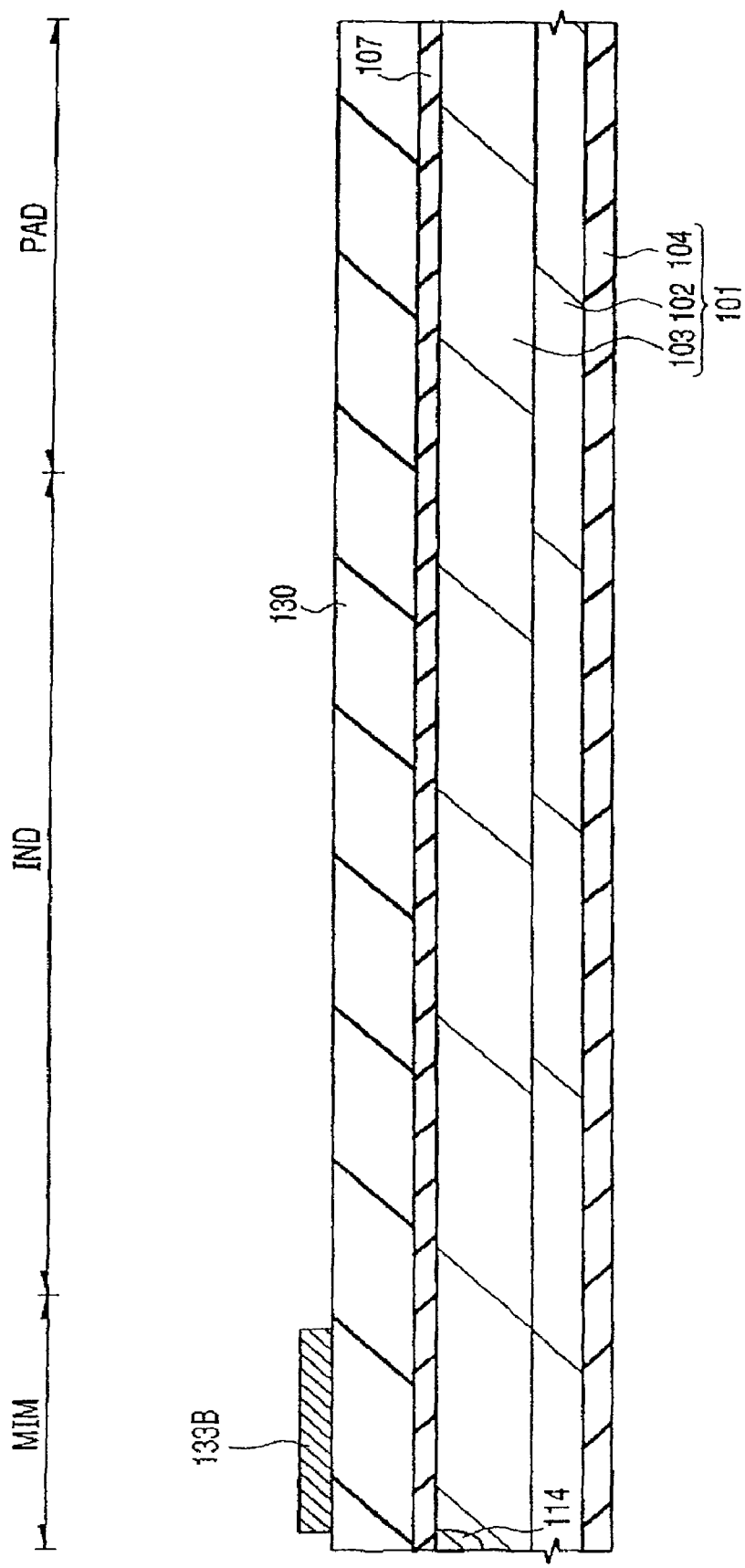
FIG. 41 is a cross sectional view of the main portion of the semiconductor device during a step in the manufacture of the semiconductor device.

As shown in FIG. 40 and FIG. 41, a stacked film (first metal layer, first conductive film) is formed above the substrate 101 by depositing, for example, a Ti film of about 10 nm thickness, an aluminum alloy film of about 400 nm thickness containing Cu (copper) and Si (silicon), a Ti film of about 10 nm thickness and a TiN film of about 75 nm thickness successively from the lower layer. Successively, the stacked film is dry etched by using a photoresist film (not illustrated) patterned by photolithography as a mask, thereby forming wirings (wiring layer) 133, 133A, and 133B comprising the stacked film and in connection with the plug 132. The wiring 133A electrically connects the resistor element 111A and the p++-semiconductor region 105 in the region RESI, the wirings 133A electrically connects the lower electrode 111B of the capacitor element C forming an analog circuit (refer to FIG. 33) and the p++-semiconductor region 105 in the region CAPA, and the wiring 133A electrically connects the n+-semiconductor region 122B serving as the source for the n-channel type MISFET Qn and p++-semiconductor region 105 in the region NMIS. Further, the wiring 133B is formed in the region MIM.

As described above, the surface of the silicon oxide film 130 below the wirings 133, 133A, and 133B has been planarized. Accordingly, since the surface can be flattened for the wiring 133B serving as the lower electrode for the capacitor element formed in the region MIM in the step to be described subsequently, the capacitor dielectric film formed on the wiring 133B can be deposited at a stable film thickness. Therefore, in the region MIM, a capacitor element with less scattering of the capacitance value can be formed with wirings 133B serving as a lower electrode.

Figure 42:
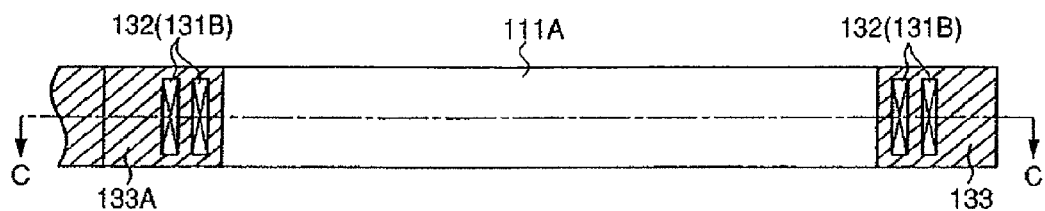
FIG. 42 is a plan view of the main portion of the semiconductor device during the manufacture of the semiconductor device according to the invention.
Figure 43:
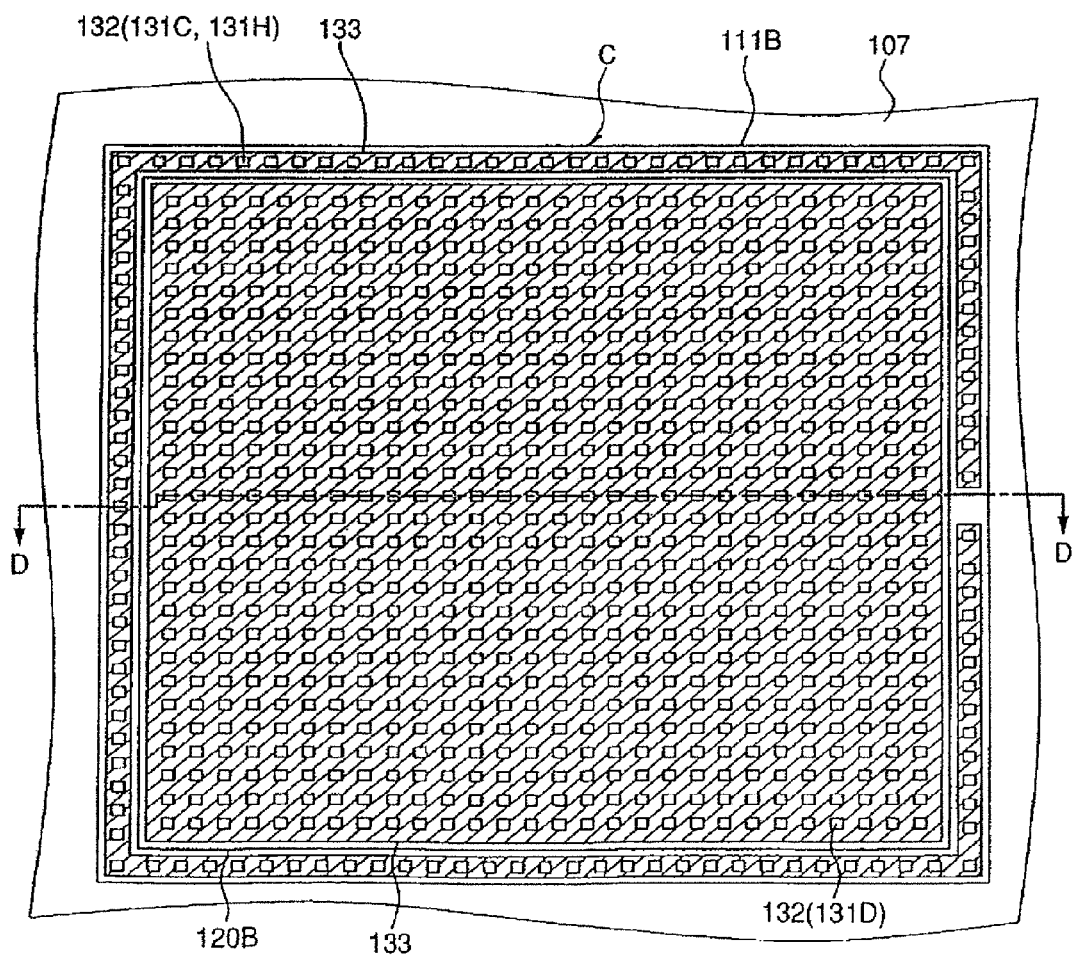
FIG. 43 is a plan view of the main portion of the semiconductor device during the manufacture of the semiconductor device according to the present invention.

FIG. 42 and FIG. 43 are plan views showing main portions for the region RESI and the region CAPA when the wirings 133 and 133A are formed, respectively, and the wirings 133 and 133A are shown by hatching. Further, the regions RESI and CAPA in FIG. 40 show cross sections along line C-C in FIG. 42 and line D-D in FIG. 43. In FIG. 42, the plug 132 (connection hole 131G) for connecting the wiring 133A and the p++-semiconductor region 105 is not illustrated.

As shown in FIG. 42, while two plugs 132 (connection holes 131B) are formed between one wiring 133, 133A and the resistor element 111A, only one of the plugs 132 (connection hole 131B) is shown for better understanding of the positional relation for the wirings 133, 133A, the resistor element 111A and the plug 132 (connection hole 131B) in FIG. 40. Further, while an example of arranging two plugs 132 (connection holes 131B) between one wiring 133 and 133A and the resistor element 111A is shown in FIG. 42, the number of the plugs 132 (connection holes 131B) is not restricted thereto.

Further, as shown in FIG. 43, in this embodiment, plural plugs 132 (connection holes 131C or 131H) are formed between the wiring 133A and the lower electrode 111B of the capacitor element C, and plural plugs 132 (connection holes 131D) are formed between the wiring 133 and the upper electrode 120B of the capacitor element C. While a number of plugs 132 (connection holes 131D) for connecting the wiring 133 and the upper electrode 120B appear in the cross section along line D-D, only one of the plugs 132 (connection holes 131D) for connecting the wiring 133 and the upper electrode 120B is illustrated for better understanding of the positional relation between the wirings 133, 133A and the plugs 132 (connection holes 131C, 131D, and 131H). As described above, when plural plugs 132 are disposed between the wiring 133A and the lower electrode 111B and between the wiring 133 and the upper electrode 120B, the resistance values for the lower electrode 111B and the upper electrode 120B can be decreased compared with the case of connecting the wiring 133A with the lower electrode 111B and the wiring 133 with the upper electrode 122B, for example, by a single plug, and the parasitic resistance value of the capacitor element C can be decreased. As a result, it is possible to prevent the parasitic resistance from resulting in problems with the operation of the circuits formed in the chip of this embodiment.

Figure 44:
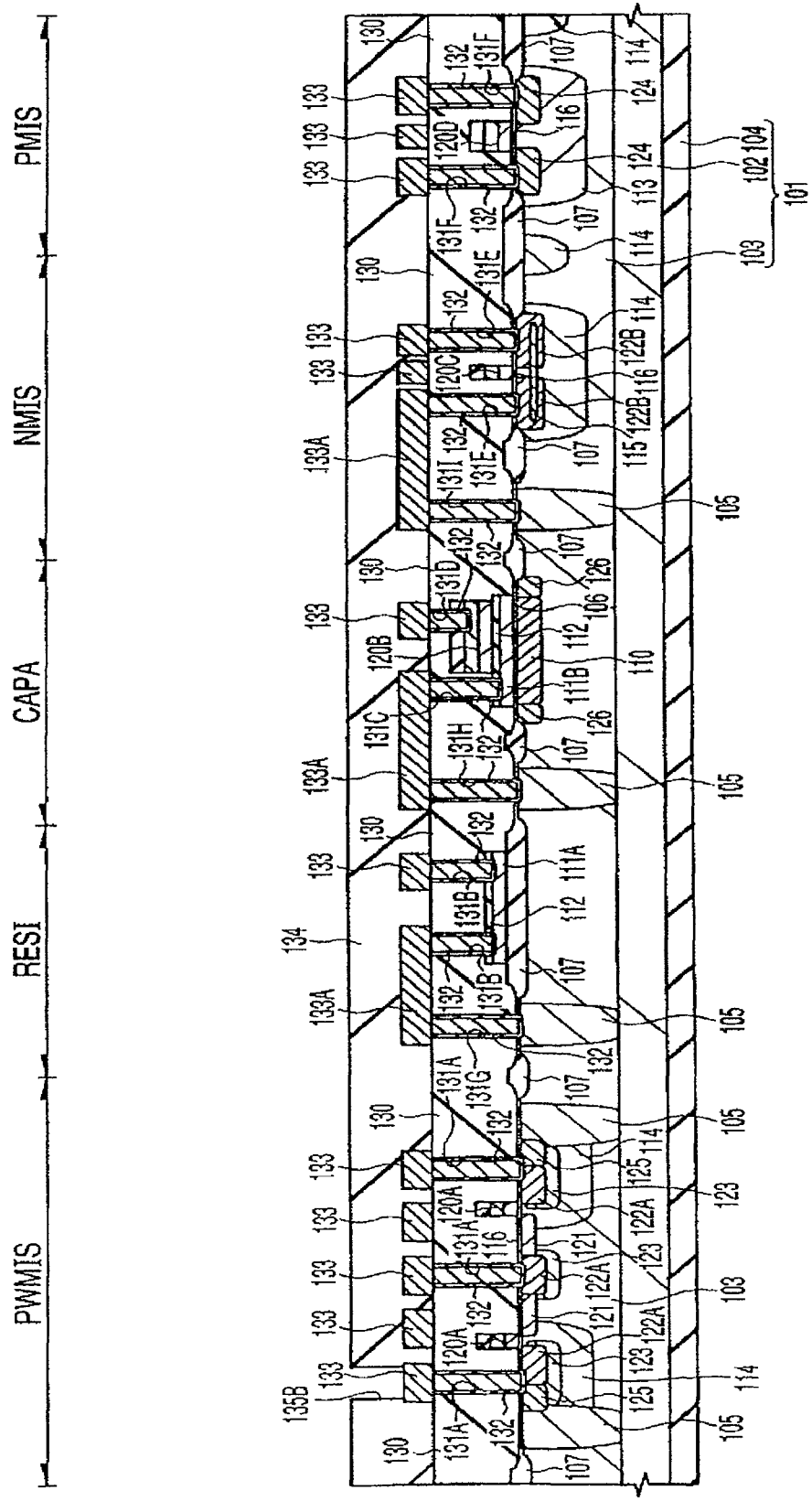
FIG. 44 is a cross sectional view of the main portion of the semiconductor device during a manufacturing step succeeding the step of FIG. 40.
Figure 45:
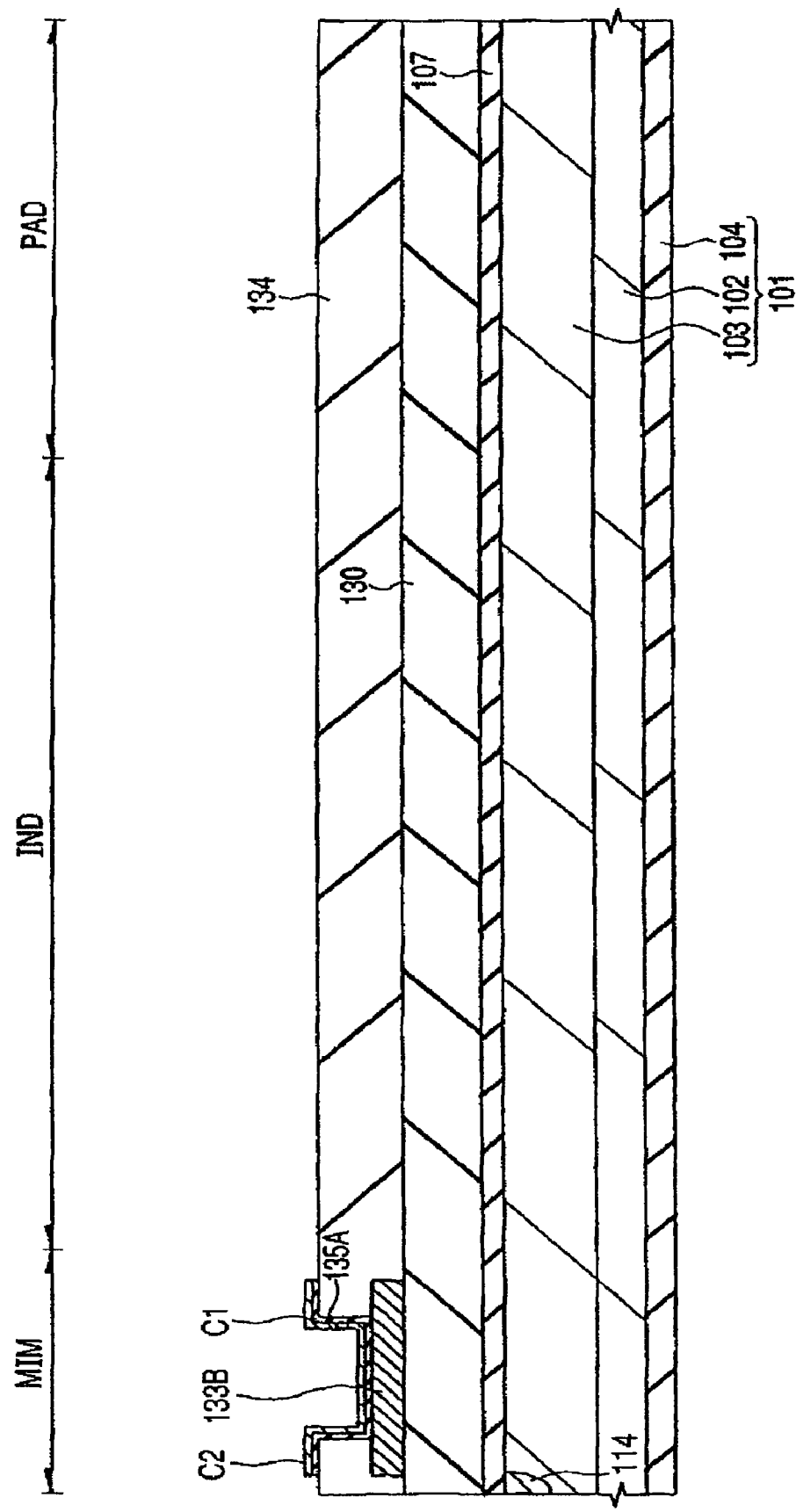
FIG. 45 is a cross sectional view of the main portion of the semiconductor device during a manufacturing step succeeding the step of FIG. 41.

Then, after removing the photoresist film used for patterning the wirings 133, 133A, a silicon oxide film 134 of about 0.95 mm thickness is deposited over the substrate 101, as shown in FIG. 44 and FIG. 45. Successively, the silicon oxide film 134 is etched by using a photoresist film patterned by photolithography as a mask to form a connection hole 135 reaching the wiring 133B. Next, after removing the photoresist film, a silicon oxide film (second insulative film) C1 of about 100 nm thickness is deposited over the substrate 101 including the inside of the connection hole 135A, for example, by a CVD method. The silicon oxide film C1 is a capacitor dielectric film of a capacitor element to be formed in the region MIM in the step to be described later. In this process, the silicon oxide film C1 is formed by a film deposition method that is capable of controlling the film thickness in the order of several ten nm, accompanying the heat treatment at a temperature lower than that for forming the ONO film 112 as a capacitor dielectric film of the capacitor element C described above (for example, refer to FIG. 33). As described above, since the surface of the wiring 133B below the silicon oxide film C1 is planarized, the silicon oxide film C1 can be deposited at a stable film thickness. Thus, in the region MIM, a capacitor element with less scattering for the capacitance value can be formed with the silicon oxide film C1 as the capacitor dielectric film.

Then, a titanium nitride film C2 of about 80 nm thickness is deposited on the silicon oxide film by a sputtering method. Then, the titanium nitride film C2 and the silicon oxide film C1 are etched by using a photoresist film patterned by photolithography as a mask, thereby leaving the titanium nitride film C2 and the silicon oxide film C1 in the region MIM including the inside of the connection hole 135A.

Then, after removing the photoresist film, the silicon oxide film 134 is etched by using a further photoresist film patterned by photolithography as a mask, thereby forming connection hole 135B reaching the wiring 133. Successively, the photoresist film is removed.

Figure 46:
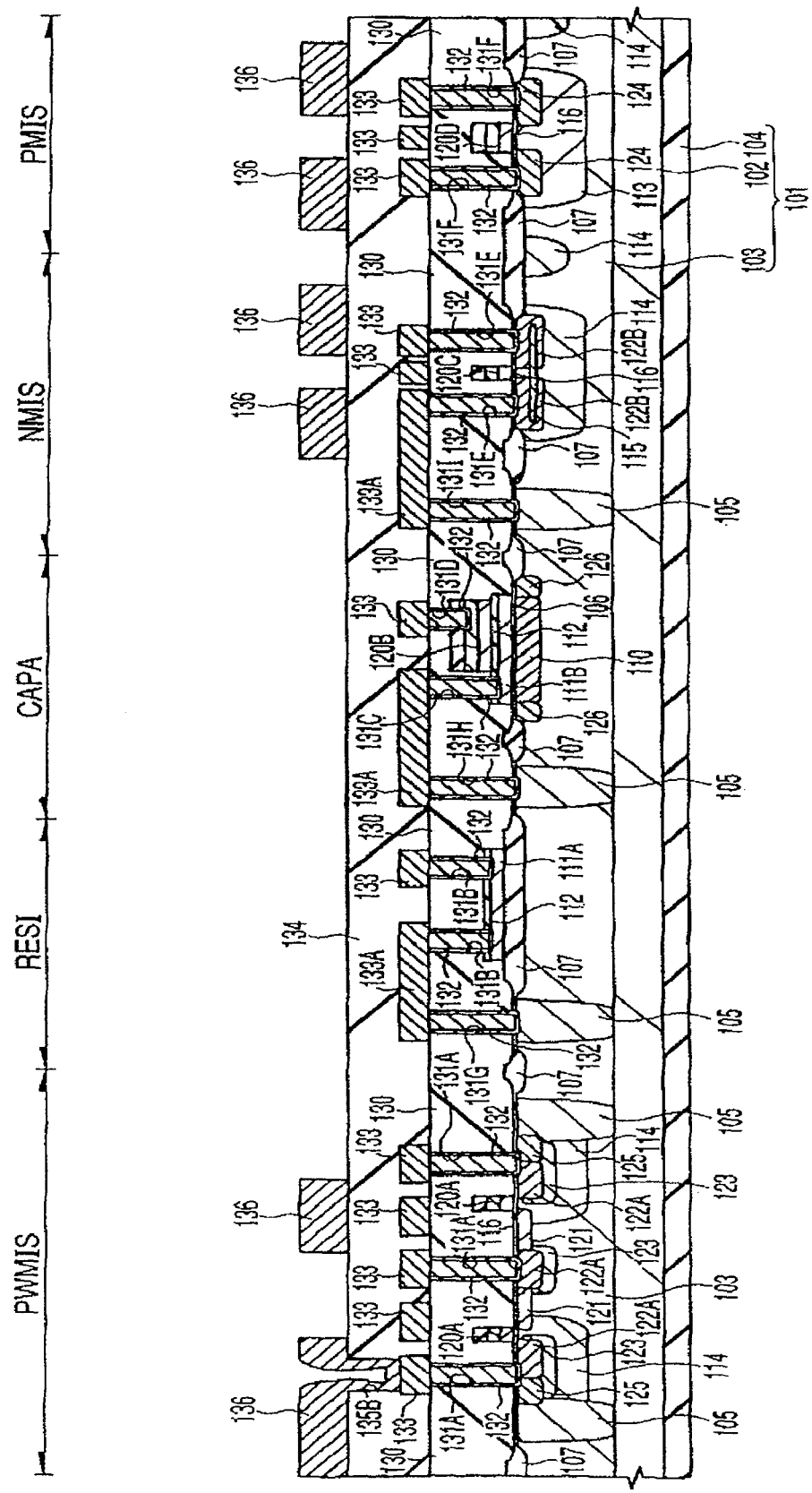
FIG. 46 is a cross sectional view of the main portion of the semiconductor device during a manufacturing step succeeding the step of FIG. 44.
Figure 47:
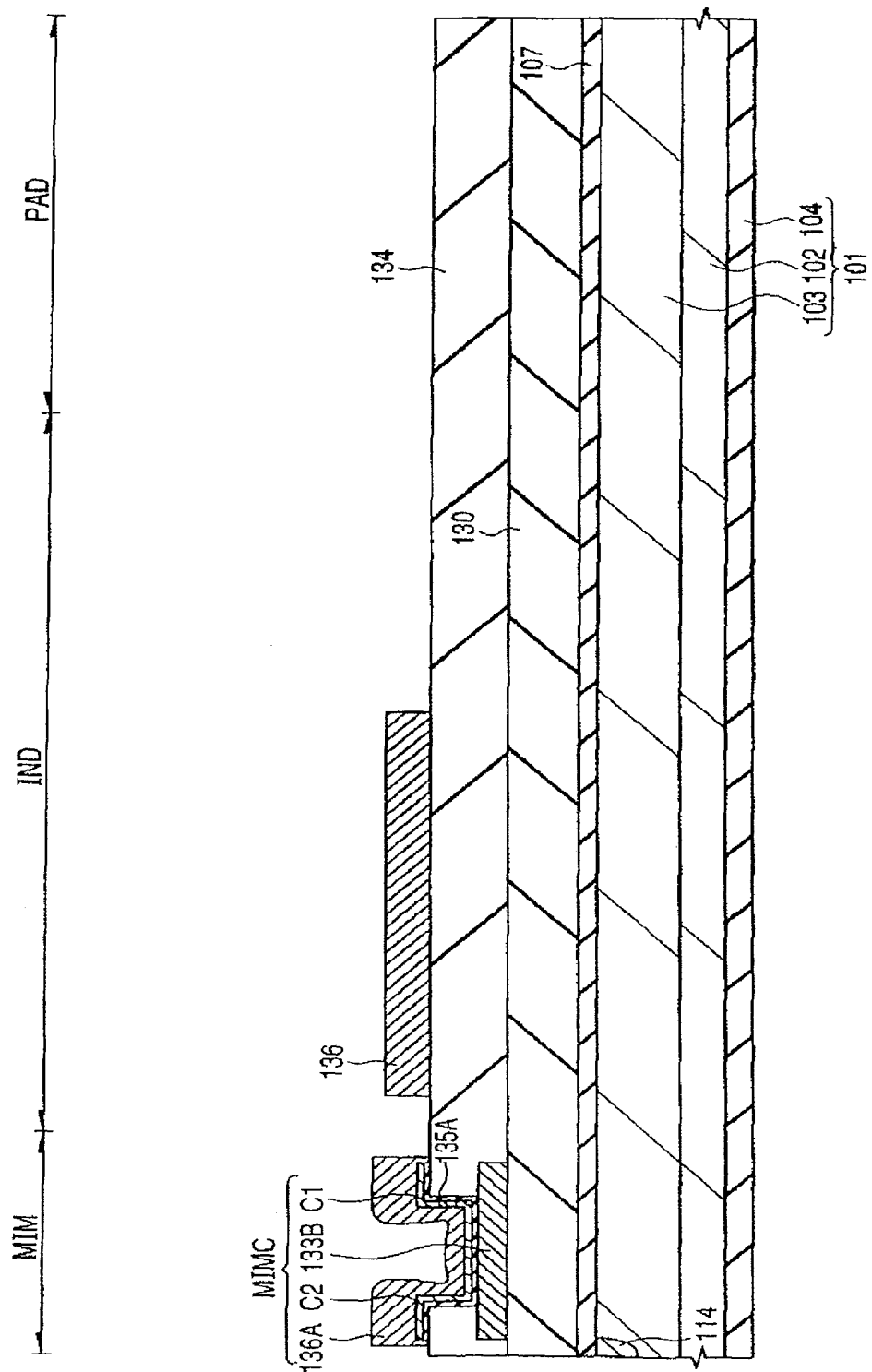
FIG. 47 is a cross sectional view of the main portion of the semiconductor device during a manufacturing step succeeding the step of FIG. 45
Figure 48:
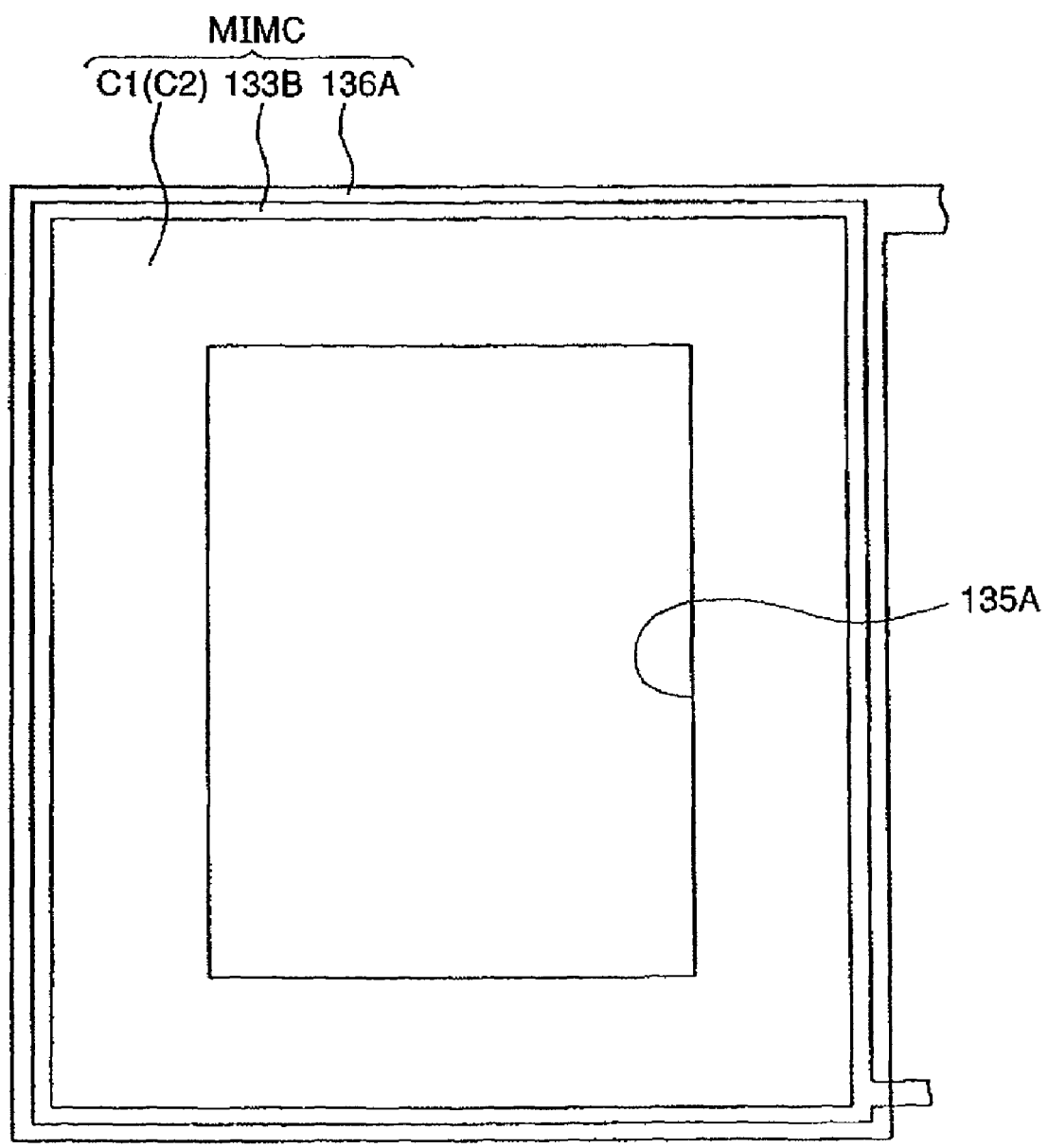
FIG. 48 is a cross sectional view of the main portion of the semiconductor device during manufacture of the semiconductor device.

Then, as shown in FIG. 46 and FIG. 47, a barrier conductive film is formed by depositing a Ti film of about 30 nm thickness and a TiN film of about 100 nm thickness successively from the lower layer on the silicon oxide film 134 including the inside of the connection holes 135A, 135B. Successively, a stacked film comprising the barrier conductor film, the Ti film and the aluminum alloy film (second metal layer, second conductive film) is formed by depositing a Ti film of about 20 nm thickness and an aluminum alloy film of about 1200 nm thickness containing Cu and Si successively from the lower layer on the barrier conductive film. Then, the stacked film is etched by using a photoresist film patterned by photolithography as a mask to form wirings (wiring layer) 136, 136A. The wiring 136A is formed in the region MIM including the inside of the connection hole 135. By the steps described so far, a capacitor element (second capacitor element) MIMC having the wiring 133B serving as the lower electrode, the silicon oxide film C1 serving as the capacitor dielectric film and the titanium nitride film C2 and the wiring 136A serving as the upper electrode can be formed in the region MIM. FIG. 48 is a plan view of the capacitor element MIMC. According to the steps described above, since the wiring 133B serving as the lower electrode is formed on the silicon oxide film 130 planarized at the surface, a capacitor element MIMC with less scattering for the capacitance value can be formed.

By the way, the capacitor element MIMC is formed to a layer above the capacitor element C described above (for example, refer to FIG. 33). That is, the electrode (lower electrode (wiring 133B) and upper electrode (wiring 136A)) of the capacitor element MIMC is formed so as to be spaced apart more from the substrate 101 than the electrode of the capacitor element C (lower electrode 111B and upper electrode 120B). Accordingly, the parasitic capacitance value formed between the electrode of the capacitor element MIMC and the substrate 101 can be made smaller than the parasitic capacitance value formed between the electrode of the capacitor element C and substrate 101.

Further, the capacitor element C contains a polycrystal silicon film in the upper electrode 120B and the lower electrode 110B, and the capacitor dielectric film is formed while controlling the film thickness thinly in the order of several nm, for example, by a thermal oxidation treatment accompanying a high temperature of about 1000° C. or higher and a CVD method. This is because the polycrystal silicon film is less deformed even by heating at high temperature, and film deposition means accompanying a high temperature capable of controlling the film thickness in the order of several nm is used upon forming the capacitor dielectric film of the capacitor element C. As a result, since the thickness of the capacitor dielectric film 1 is reduced, the capacitance value per unit of the capacitor element C increases. That is, since a capacitor element C of a desired capacitance value can be formed by the upper electrode 120B and the lower electrode 11B of a small area, the chip having the semiconductor device of this embodiment can be reduced in the size.

On the other hand, in the capacitor element MIMC, the silicon oxide film C1 serving as the capacitor dielectric film is formed by controlling the thickness in the order of several tens nm and the thickness of the capacitor dielectric film is increased more than that of the capacitor element. This is because the aluminum alloy film contained in the wiring 133B forming the lower electrode of the capacitor element MIMC tends to be deformed easily by heating at high temperature and the deformation of the aluminum alloy film is prevented upon film deposition of the silicon oxide film C1 by applying means including heat treatment at a lower temperature than that upon forming the ONO film 112 serving as the capacitor dielectric film of the capacitor element C, as described above. In the case of using such film deposition means, since control of the thickness of the silicon oxide film C1 is in the order of several tens nm, the capacitance value per unit area of the capacitor element MIMC is smaller than that of the capacitor element C. Accordingly, the capacitor element MIMC has a smaller capacitance unit value than the capacitor element C. In this way, the capacitor element MIMC which is usable in the high frequency band circuit is formed in this embodiment.

Figure 49:
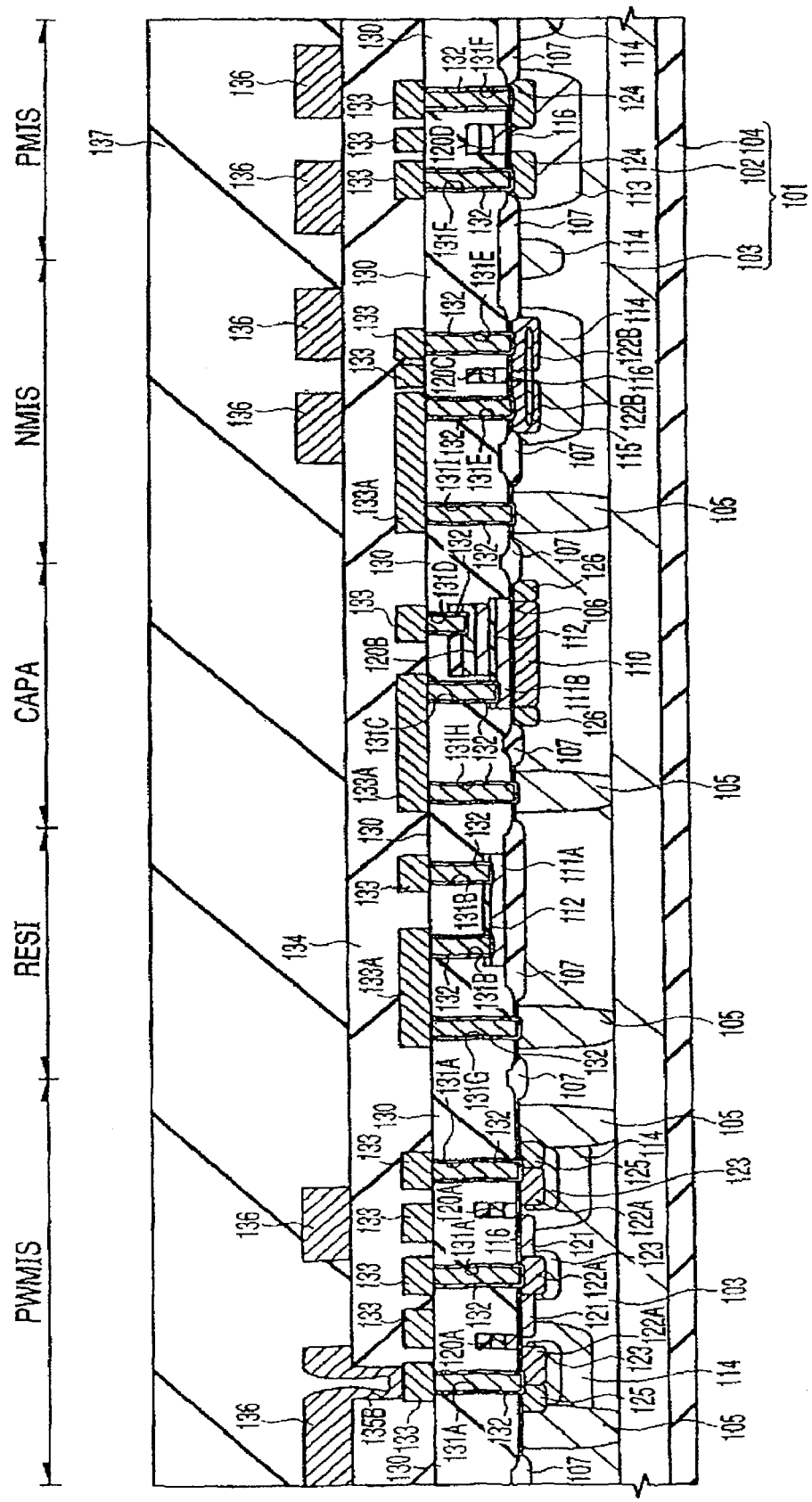
FIG. 49 is a cross sectional view of the main portion of the semiconductor device during a manufacturing step succeeding the step of FIG. 46.
Figure 50:
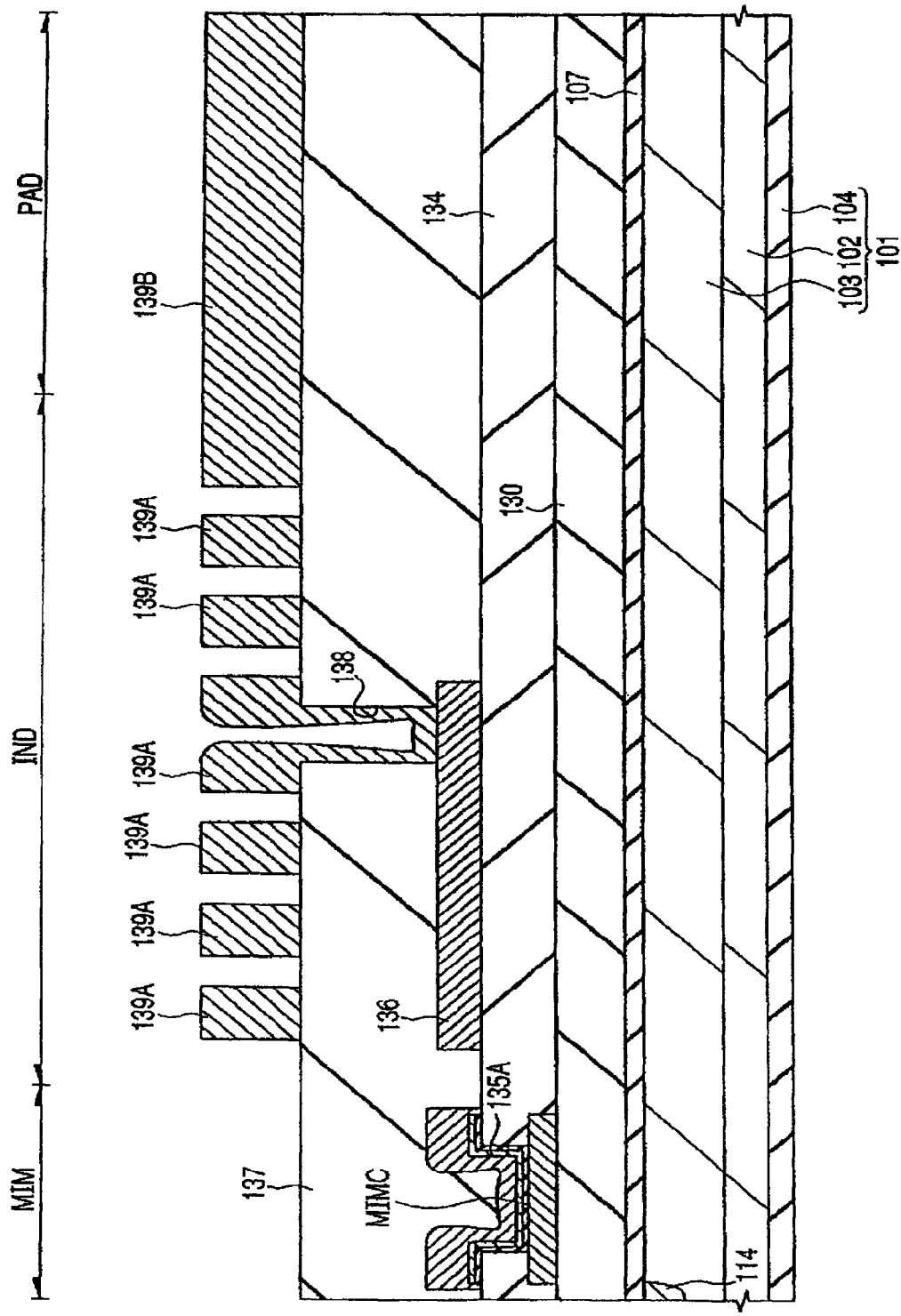
FIG. 50 is a cross sectional view of the main portion of the semiconductor device during a manufacturing step succeeding the step of FIG. 47.

Then, as shown in FIG. 49 and FIG. 50, a silicon oxide film (third insulation film) 137 of about 1.65 μm thickness is deposited on the substrate 101. Successively, the silicon oxide film 137 is etched using a photoresist film patterned by photolithography as a mask, thereby forming a connection hole 138 reaching the wiring 136 to the silicon oxide film 137 in the region IND.

Then, a barrier conductor film is formed by depositing, for example, a Ti film of about 10 nm thickness and a TiN film of about 50 nm thickness successively from the lower layer over the silicon oxide film 137 including the inside of the connection hole 138. Successively, for example, a Ti film of about 20 nm thickness and an aluminum alloy film of about 1200 nm thickness containing Cu and Si are deposited successively from the lower layer over the barrier conductor film. Then, on the aluminum alloy film, there are formed a barrier conductor film by depositing an aluminum alloy film of about 800 nm thickness containing Cu and Si successively from below, a Ti film and a 2-layered aluminum alloy film (third metal layer, a third conductive film).

Figure 51:
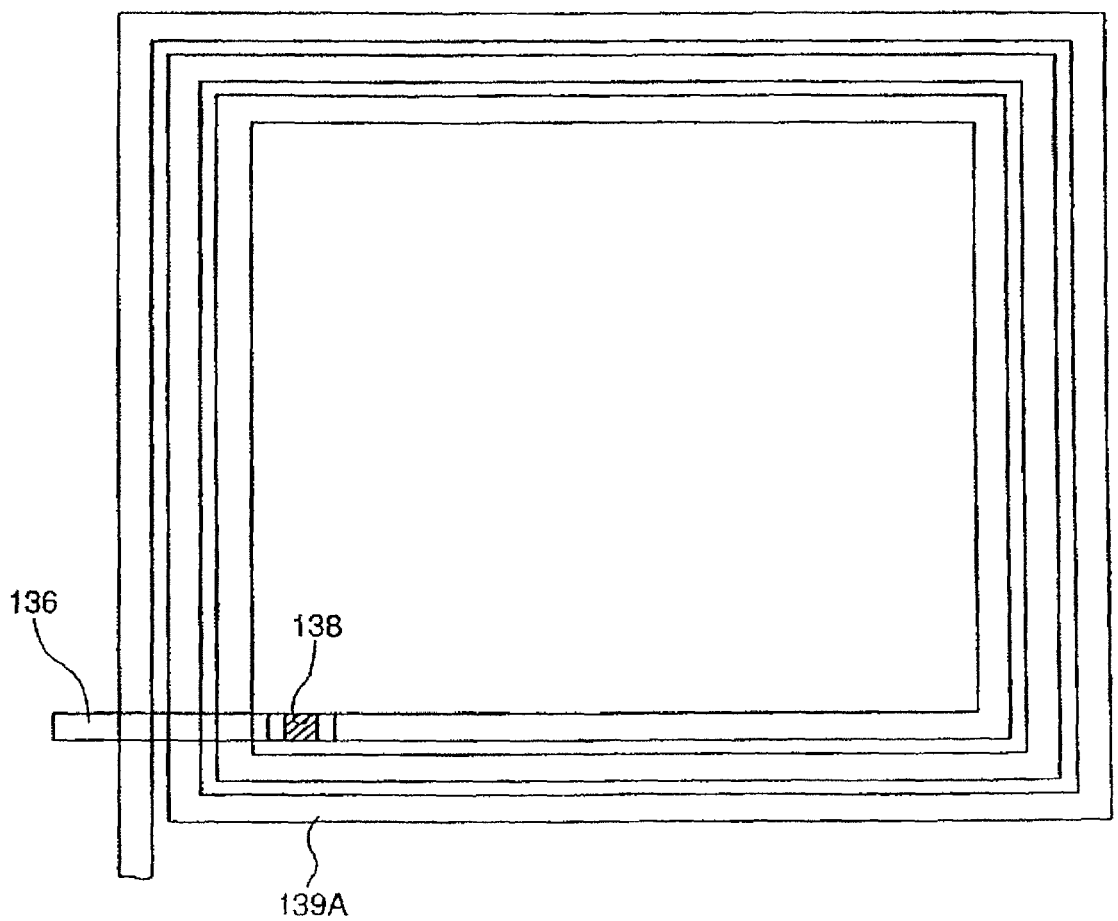
FIG. 51 is a plan view of the main portion of the semiconductor device during manufacture of the semiconductor device.

Successively, the stacked film is etched by using a photoresist film patterned by photolithography as a mask, thereby forming wirings (first wiring layers) 139A, 139B with a thickness greater than that of the wiring below. The wirings 139A, 139B form the uppermost metal wiring layer over the substrate 101. FIG. 51 is a plan view of a main portion of the region IND upon forming the wirings 139A, 139B. As shown in FIG. 51, the wiring 139A forms a spiral coil (inductor) in the region IND, one end thereof (first terminal) being disposed at the uppermost layer and the other end (second terminal) being connected through the connection hole 138 with the lower wiring 136. The spiral coil formed of the wiring 139A is used in the circuit of high frequency band 136. In FIG. 51, the hatched region shows the connection hole 138. Further, the wiring 139B forms a bonding pad for connection with the bonding wire in the region PAD. In this embodiment, wirings at the uppermost layer (wirings 139A, 139B) are used for the spiral coil and the bonding pad. Accordingly, the wiring width and the wiring pitch are larger compared with the lower wiring layer. Therefore, the wiring at the uppermost layer can take a larger aspect ratio for the wiring than that of the lower wiring layer and can be formed at a moderate fabrication accuracy. That is, the wirings 139A, 139B at the uppermost layer can be formed at a thickness greater than that of the lower wiring layer.

As described above, in this embodiment, the spiral coil is formed by using the wiring 139A having a thickness relatively greater than that of the wirings 133, 133A. Assuming a case of forming a spiral coil having characteristics about equal with the spiral coil from the wirings at the layer identical with the wirings 133, 133A, it is necessary to increase the thickness of the silicon oxide film in order to decrease the parasitic capacitance value. However, since the aspect ratio of the connection hole 135B is increased making it difficult to form the connection hole 135B when the thickness of the silicon oxide film 134 is increased, it is necessary to enlarge the diameter of the connection hole 135B. Accordingly, fine fabrication is not possible, resulting in the disadvantage that the size of a chip including the semiconductor device of this embodiment can not be decreased. Further, for decreasing the parasitic resistance value, it is necessary to increase the thickness of the aluminum alloy film forming the wirings to a size about equal with the wiring 139A. In the case of increasing the thickness of the aluminum alloy film forming the wirings 133, 133A, it may be also a concern that fine fabrication for the wirings 133, 133A is difficult. Accordingly, it is preferred to form the spiral coil by using the wiring 139A with a thickness relatively greater than that of the wirings 133, 133A.

Further, since the spiral coil is formed by using the wiring 139A with a thickness relatively greater than that of the wirings 133, 133A, the parasitic resistance value of the spiral coil can be decreased compared with a case of forming the spiral coil from the wiring at the layer identical with the wirings 133, 133A.

Further, since the spiral coil is formed by using the wiring 139A formed to a layer above the wirings 133, 133A, the interlayer film thickness between the spiral coil and the substrate 101 increases compared with a case of forming the wiring at the layer identical with the wirings 133, 133A, so that the parasitic capacitance value between the spiral coil and the substrate 101 can be decreased.

For example, in a case where the semiconductor device of this embodiment is used for a high frequency power amplifier, and the high frequency power amplifier is formed of plural amplification stages, the spiral coil and the capacitor element MIMC can be used as an inter-stage matching circuit (resonance circuit). Assuming Q (quality factor) as an amount expressing the sharpness of the resonance of the resonance circuit, fr as a self resonance frequency, f as a frequency of the circuit, R as a parasitic capacitance value, C as a parasitic capacitance value, and L as an inductance value, $Q=2\pi fL/R$ and $fr=1/(2\pi(CL)^{1/2})$ in the spiral coil, and $Q=1/(2\pi fCR)$ in the capacitor element MIMC. Besides, fr is a frequency for reducing as Q=0 and the characteristic of the spiral coil can be improved by increasing fr.

According to the formulae described above, the value Q decreases in accordance with an increase in the parasitic resistance value both for the spiral coil and the capacitor element MIMC. Further, in the spiral coil, since the resonance frequency is lowered as the parasitic capacitance value increases, the value Q is lowered in the high frequency circuit. Therefore, in this embodiment, the parasitic capacitance formed between the spiral coil and the substrate is decreased as much as possible by forming the spiral coil using the wiring 139A as the metal wiring at the uppermost layer, as described above. As a result, according to the method of manufacturing the semiconductor device of this embodiment, it is possible to prevent a lowering of the value Q by decreasing the parasitic capacitance between the spiral coil and the substrate 101.

On the other hand, in the capacitor element MIMC, since the value for the synthesis capacitance of the capacitance value of the capacitor element MIMC per se and the parasitic capacitance value develops as the capacitance value for the capacitor element MIMC, the capacitance value for the capacitor element MIMC decreases as the parasitic capacitance value increases. That is, the capacitance value for the capacitor element MIMC is different from the design value. Further, in view of the formulae described above, in the capacitor element MIMC, the value Q is lowered as the parasitic resistance value and the parasitic capacitance value increase.

That is, as described above, in the spiral coil and the capacitor element MIMC in this embodiment, since a decrease of the parasitic resistance value and the parasitic capacitance value is attained, respectively, a resonance circuit of sharp resonance can be formed by using the spiral coil and the capacitor element MIMC of this embodiment.

Further, as described above, since the analog circuit operates at relatively low frequency (for example, about 100 MHz), no high value Q is required for the capacitance of the matching circuit. Accordingly, the parasitic capacitance causes no problem compared with the high frequency band circuit having the spiral coil and the capacitor element MIMC described above. Then, the area of the capacitor element can be decreased by using polycrystal silicon having large capacitance value per unit area for the capacitor electrode as in the capacitor element described above (refer for example to FIG. 33). That is, the area for the chip including the semiconductor device of this embodiment can be decreased. Further, as in this embodiment, the area for the chip is decreased effectively also by forming the capacitor element MIMC and the capacitor element C on one identical substrate 101 by using different wiring layers.

Figure 52:
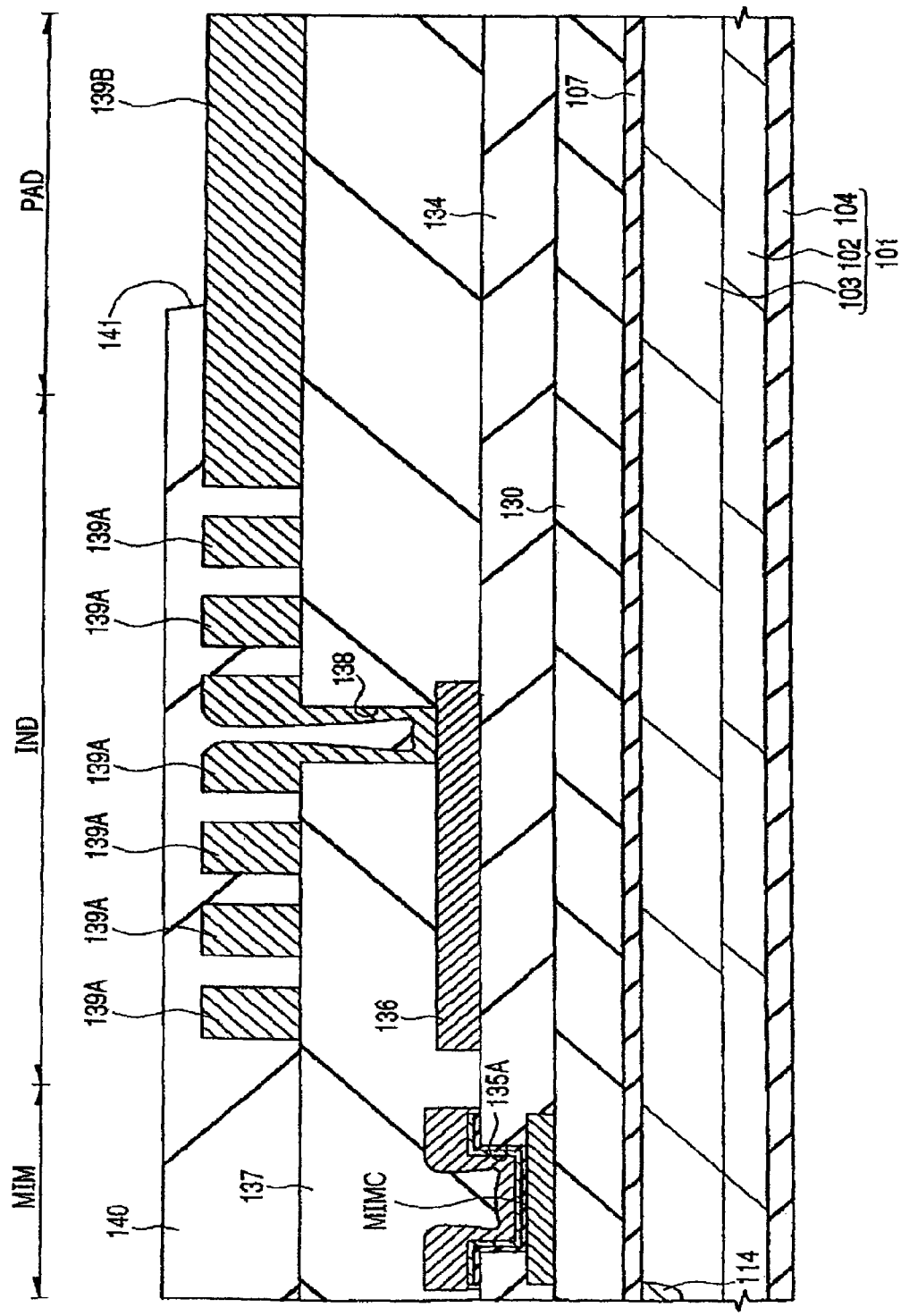
FIG. 52 is a cross sectional view of the main portion of the semiconductor device during a manufacturing step succeeding the step of FIG. 50.

Then, after removing the photoresist film used for the patterning of the wirings 139A, 139B, a silicon oxide film of about 600 nm thickness and a silicon nitride film of about 500 nm thickness are deposited successively from the lower layer above the substrate 101 to form a dielectric film 140 comprising the silicon oxide film and the nitride film as shown in FIG. 52. Successively, the dielectric film 140 is etched using a photoresist film patterned by photolithography as a mask to form an opening 141 reaching the wiring 139B. The surface of the wiring 139B is exposed by forming the opening 141, and the wiring 139B can be used as a bonding pad.

Figure 53:
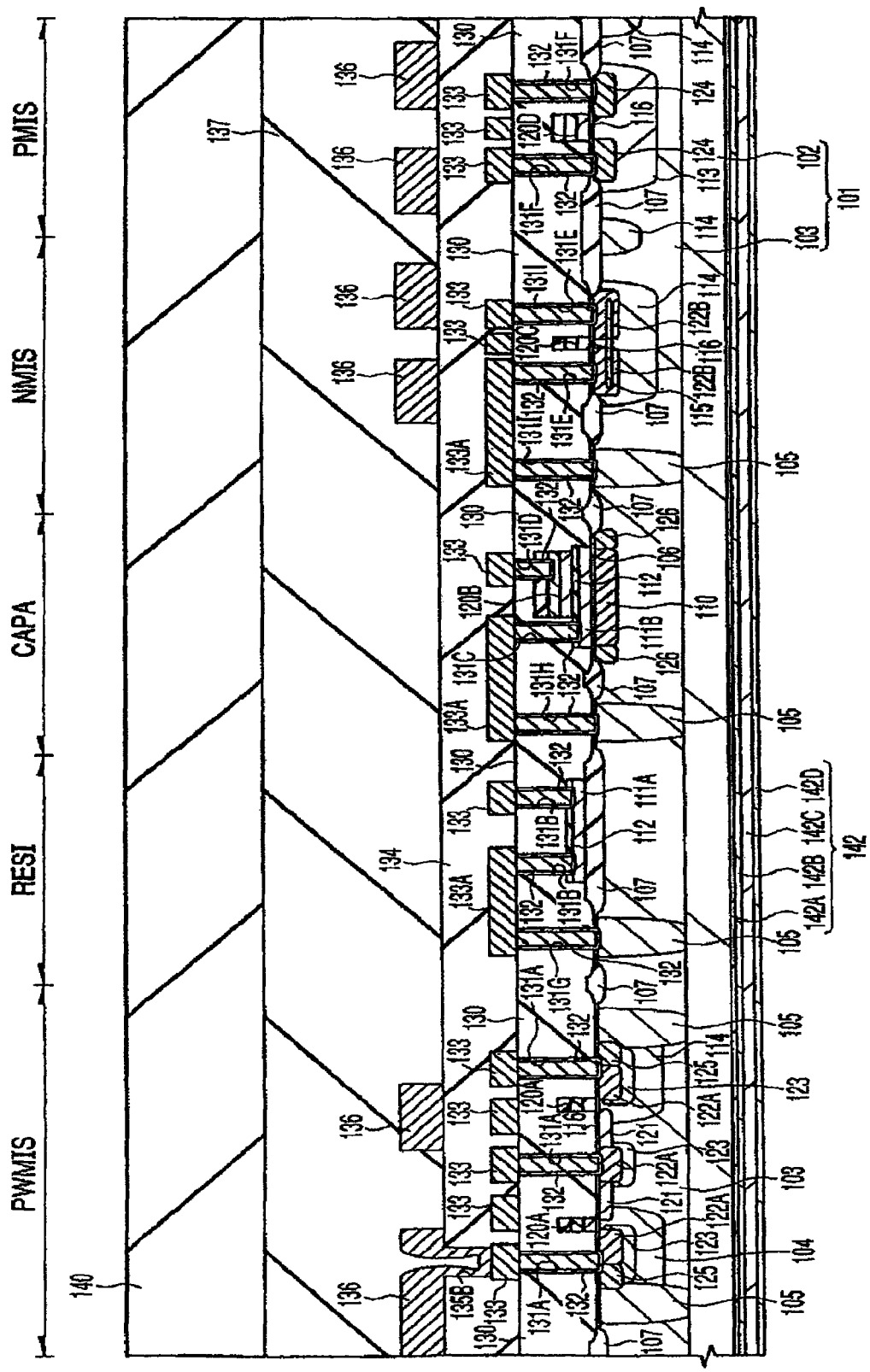
FIG. 53 is a plan view of the main portion of the semiconductor device during the manufacture of the semiconductor device according to the present invention.
Figure 54:
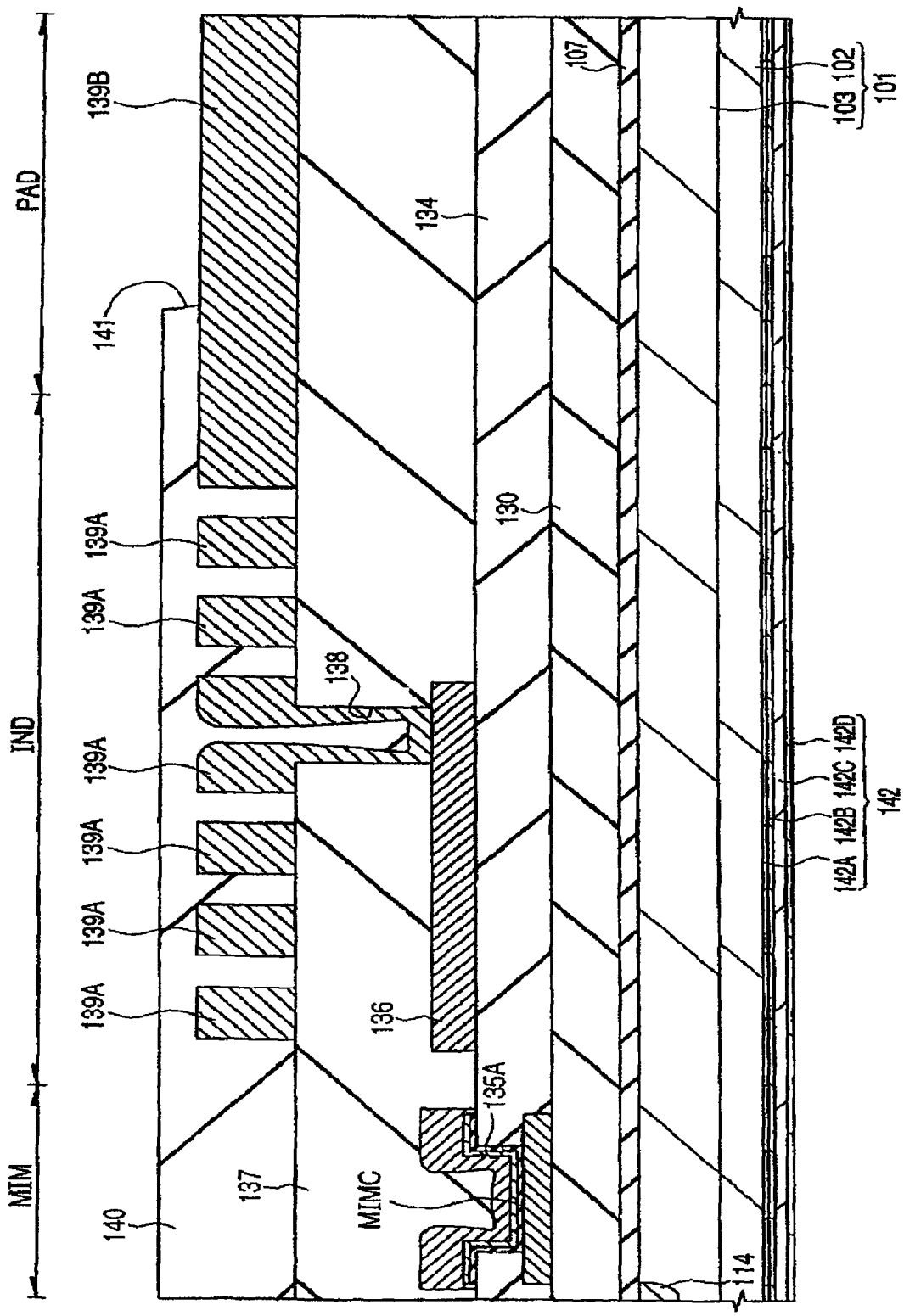
FIG. 54 is a cross sectional view of the main portion of the semiconductor device during a manufacturing step succeeding the step of FIG. 52.

Then, after removing the photoresist film used for forming the opening 141, as shown in FIG. 53 and FIG. 54, the rear face of the substrate 101 is ground to remove the silicon oxide film 104 that protected the rear face of the semiconductor substrate 102. Successively, an Ni (nickel) film 142A of about 50 nm thickness, a Ti film 142B of about 100 nm thickness, an Ni film 142C of about 200 nm thickness and an Au (gold) film 142D of about 100 nm thickness, for example, are deposited successively to the rear face of the substrate 101 by a sputtering method to form a rear face electrode (conductive film) 142D comprising the Ni film 142A, the Ti film 142B, the Ni film 142C and the Au film 142D and electrically connecting with the $p^{++}$-semiconductor region 105. Then, the substrate 101 is cut and divided into individual chips to manufacture the semiconductor device of this embodiment.

According to the embodiment described above, a fixed potential (ground potential) can be supplied to the source region of the n-channel type MISFET Qn ($n^+$-semiconductor region 122B) formed in the region NMIS from the rear face of the substrate 101 by way of the p++-semiconductor 105, the plug 132 and the wiring 133A. The fixed potential (ground potential) can be supplied also to the resistor element 111A formed in the region RESI and the capacitor element C formed in the region CAPA from the rear face of the substrate 101 by way of the plug 132 and the wiring 133A. Thus, since it is no longer necessary to extend the wiring for supplying the fixed potential to the source region of the n-channel type MISFET Qn, the resistor element 111A and the capacitor element C over the substrate 101, the size of the chip including the semiconductor device of this embodiment can be decreased. Further, since it is no longer necessary to extend the wiring for supplying the fixed potential on the substrate 101, this facilitates the layout of the arrangement of other wirings.

Further, according to the embodiment described above, the n-channel type power MISFET Qpw (refer to FIG. 35), the resistor element 111A (refer to FIG. 35), the capacitor element C used in the low frequency band circuit (refer to FIG. 35), the capacitor element MIMC used in the high frequency band circuit (refer to FIG. 47), the spiral coil used in the high frequency band circuit (wiring 139A (refer to FIG. 50)), the n-channel type MISFET Qn (refer to FIG. 35), and a p-channel type MISFET Qp (refer to FIG. 35) to form a switching element are formed in one chip. Accordingly, in a case of using the semiconductor device of this embodiment for the high frequency power amplifier, while forming the high frequency power amplifier with plural amplification stages and using the spiral coil and the capacitor element MIMC as the inter-stage matching circuit (resonance circuit) between the amplification stages, it is possible to eliminate the requirement of forming the spiral coil and the capacitor element MIMC as separate chips. That is, for the entire high frequency amplifier, the number of parts (chips) can be decreased. As a result, it is possible to reduce the cost of manufacturing the high frequency power amplifier.

Figure 55:
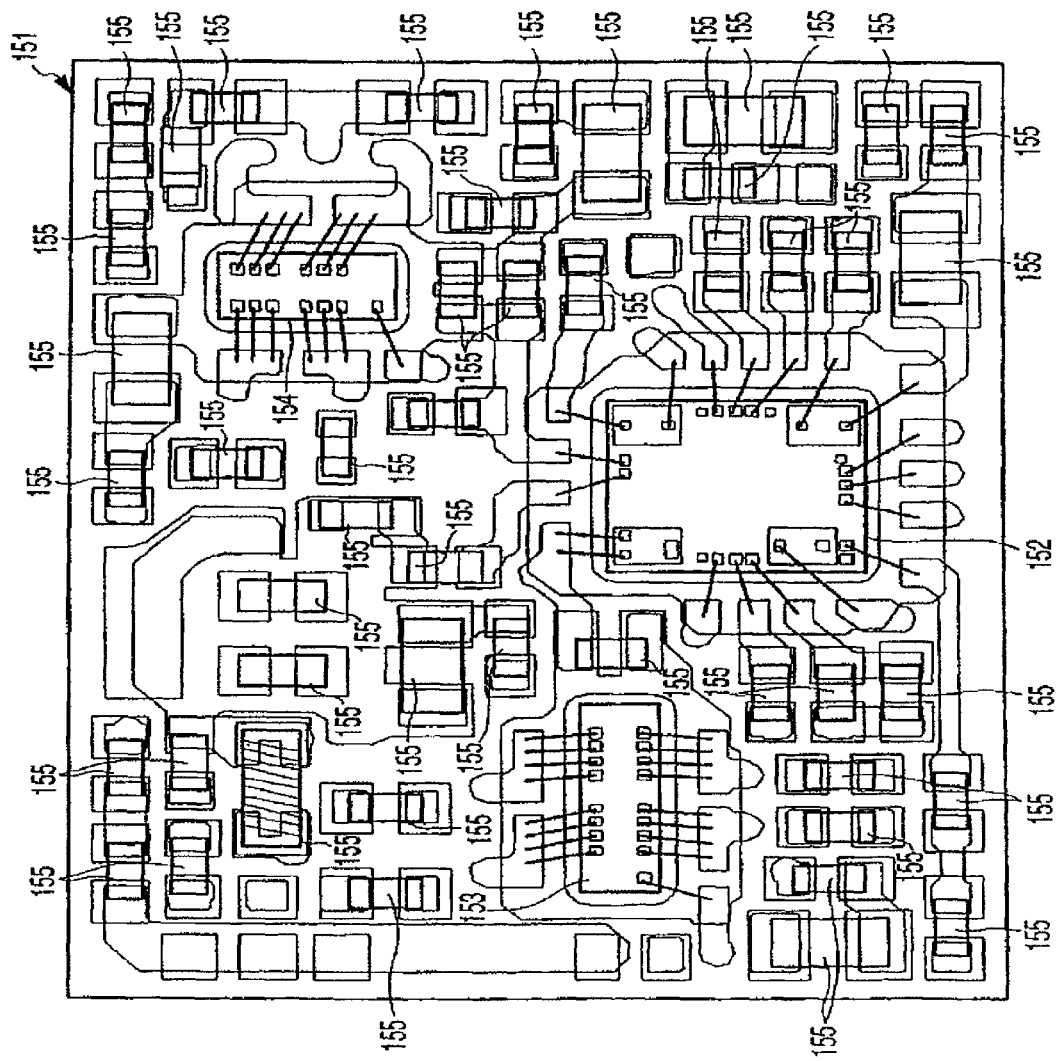
FIG. 55 is a plan view of the main portion of a high frequency power amplifier containing a semiconductor device according to the present invention.

FIG. 55 is a plan view for a main portion of a high frequency power amplifier including the semiconductor device of this embodiment. The high frequency power amplifier is a dual band type transmission power amplifier incorporated with two systems of a GSM system (Global System for Mobile Communication) at a working frequency of about 800 MHz to 900 MHz and a DCS system (Digital Cellular System) at a working frequency of about 1.8 GHz to 1.9 GHz.

As shown in FIG. 55, chips 152 formed with the semiconductor device of the embodiment described above, chips 153, 154 connected in cascade with the chips 152 and amplifying high frequency power in the same manner as the chips 152, and chips 155 such as for transistors, capacitance, resistors or coils are mounted on the wiring substrate 151. In this embodiment, the chips 53 are included in the first amplification system for the GSM system, while the chips 154 are included in the second amplification system for the DCS system.

Figure 56:
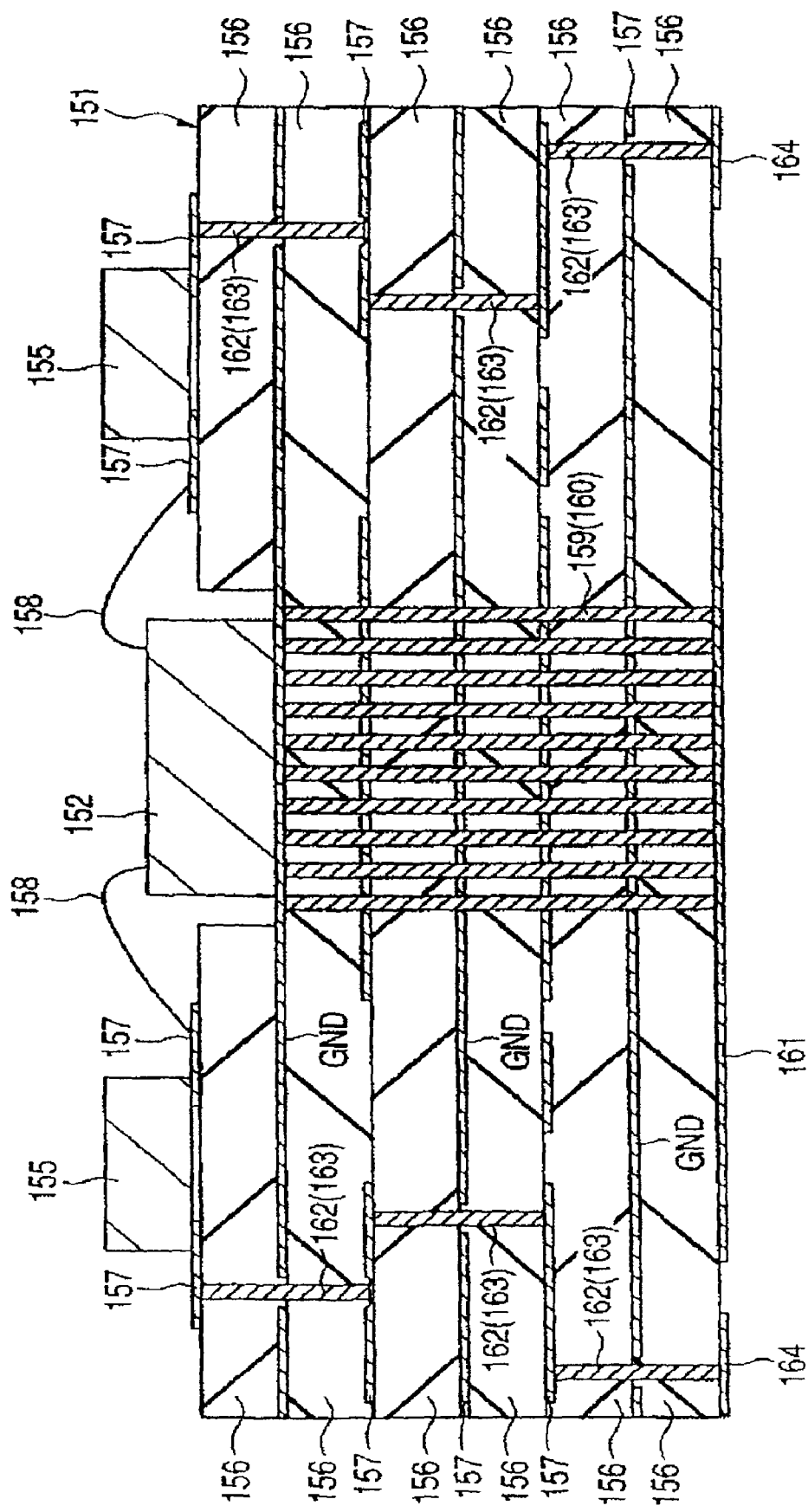
FIG. 56 is a cross sectional view of the main portion of a high frequency power amplifier containing a semiconductor device according to the present invention.

As shown in FIG. 56, the wiring substrate 151 is a build-up wiring board formed by stacking the dielectric layers 156 and the wiring layers 157 (or wiring layer GND) alternately.

The bonding pads (wiring 139B (refer to FIG. 54)) formed to the chip 152 in the semiconductor device of this embodiment and the wiring layer 157 formed to the uppermost layer of the wiring substrate 151 are electrically connected with bonding wires 158. The rear face electrode 142 formed to the rear face of the chip 152 (refer to FIG. 53 and FIG. 54) and the electrode 161 formed to the lower surface of the wiring substrate 151 are electrically connected by way of a conductive material 160 buried in plural via holes 159 formed so as to pass through the wiring substrate 151. Further, heat generated from the chip 152 during driving of the chip 152 can be dissipated through the conductive material 160 buried in the via hole 159 from the electrode 161 to the outside of the high frequency power amplifier.

The chip 155 is mounted by face down bonding directly to the wiring substrate 151. The wiring layer 157 connected with the chip 155 and formed to the uppermost layer of the wiring substrate 151 is electrically connected by way of the conductive material 163 buried in the via hole 162 formed in the insulation layer 156 with further lower wiring layer 157 and, further, connected electrically with the electrode 164 formed to the lower surface of the wiring substrate 151.

FIG. 57 is an equivalent circuit diagram of a main portion of the high frequency amplifier of this embodiment.

As shown in FIG. 57, the high frequency power amplifier of this embodiment has an amplification system e for the GSM system serving as a first amplification system and an amplification system f for the DCS system serving as a second amplification system. The amplification system e and the amplification system f each has an identical circuit structure, although the performance of electronic parts used in each of them is different. Accordingly, in the explanation of the amplification system e, identifiers for the parts in the amplification system f corresponding to the amplification system e are shown in brackets to relate the explanation to the amplification system f.

External electrode terminals in the amplification system e are Pin-GSM (Pin-DCS in amplification system f) serving as an input terminal, Pout-GSM (Pout-DCS in amplification system f) serving as an output terminal, Vdd-GSM (Vdd-DCS in amplification system f) serving as a first reference potential (power source potential), and Vapc-GSM (Vapc-DCS in amplification system f) serving as a bias terminal.

Three amplification stages are connected in cascade between Pin-GSM (Pin-DCS) and Pout-GSM (Pout-DCS). The first amplification stage, the second amplification stage and the third amplification stage (final amplification stage) are formed with circuit blocks (first circuit block, second circuit block) CB101, CB102, CB103 (CB104, CB105, CB106). Each of the transistors contained in each of the circuit blocks and constituting each of the amplification stages has a control terminal for receiving input signals and a bias potential (gate electrode) to the stage, a first terminal for sending the output signal of the stage (drain electrode) and a second terminal for receiving the fixed (reference) potential (ground potential) for the stage (source electrode).

Pin-GS (Pin-DCS) is connected with the gate electrode of the transistor Q101 (Q111) contained in the circuit block CB1. Further, the transistor Q101 (Q111) is connected with transistor Q102 (Q112) in cascade, and the transistor Q101 (Q111) and the transistor Q102 (Q112) form a dual gate power MISFET. The two transistors Q101 (Q111) and Q102 (Q112) conduct high frequency power amplification. Since the amplification system has a three stage constitution, gate electrodes for both of the transistors contained in the circuit block CB102 (CB105) serving as the second amplification stage and the transistors contained in the circuit block CB103 (CB106) serving as the third amplification stage are connected to the drain electrode of the preceding transistors by way of predetermined matching circuits. The drain electrode of the transistor Q104 (Q114) contained in the circuit block CB103 (CB106) serving as the output stage, which is a final amplification stage, is connected by way of a predetermined matching circuit to the Pout-GSN (Pout-DCS).

The gate electrodes for the transistors Q101, Q103 (Q111, Q113) are connected by way of resistors and circuit blocks CB107 (CB108) to Vapc-GSM (Vapc-DCS), respectively. In this embodiment, the circuit block CB107 (CB108) forms a current mirror circuit.

Figure 57A:
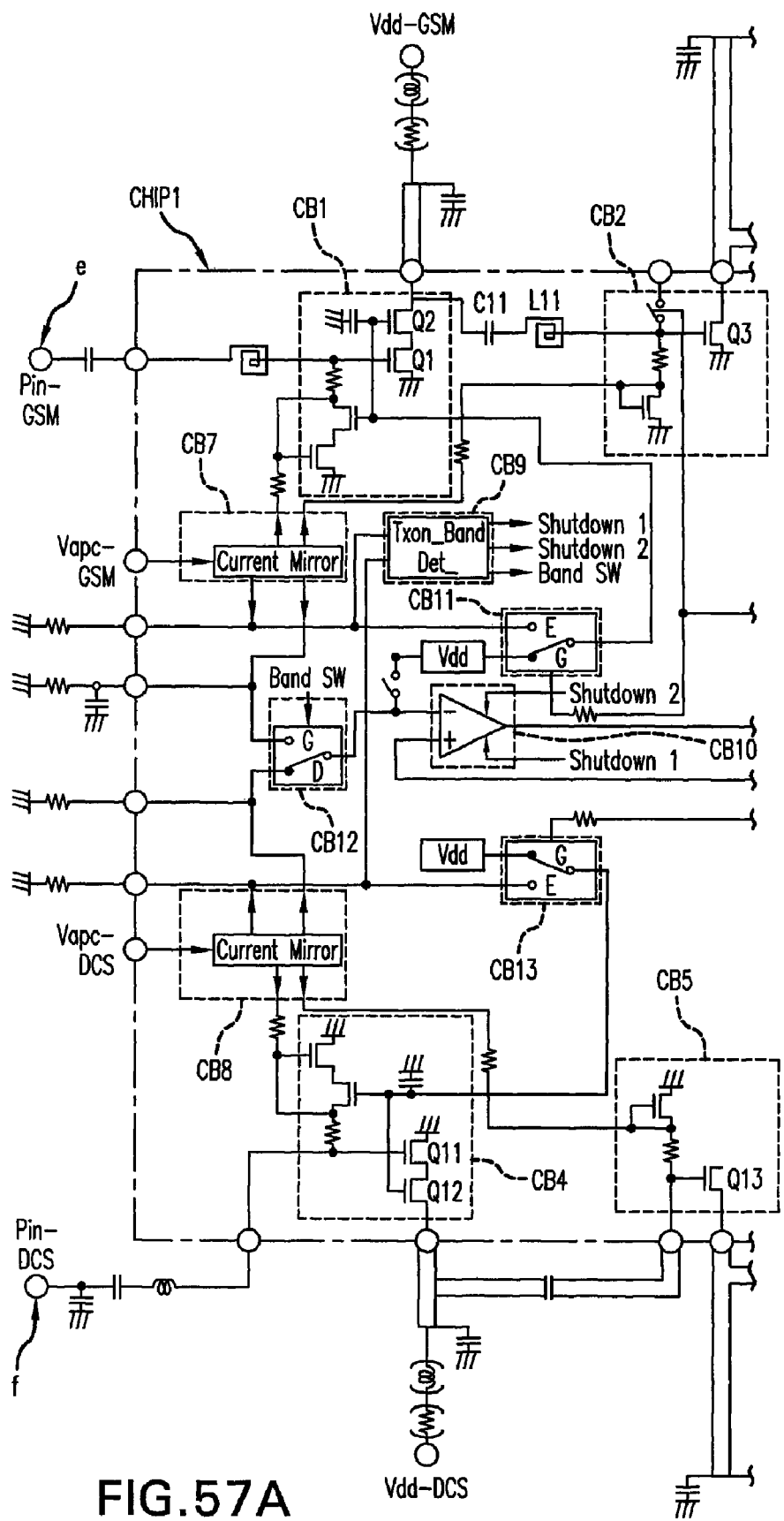
FIGS. 57A and 57B are schematic circuit diagrams of the main portion of a high frequency power amplifier containing a semiconductor device according to the present invention.
Figure 57B:
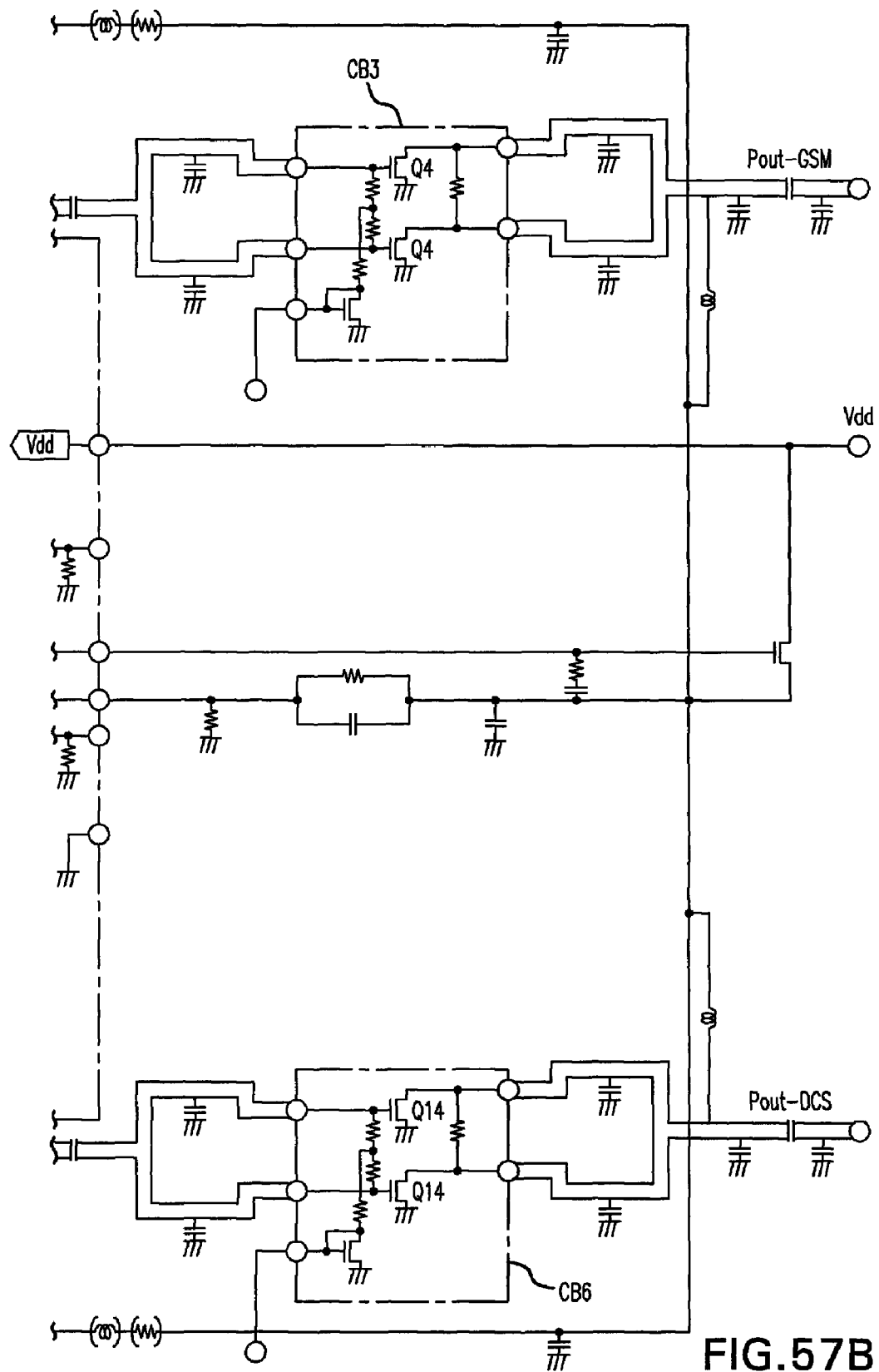

In FIGS. 57A and 57B, a region shown by CHIP1 is a chip 152 manufactured by the manufacturing method of this embodiment, as described above. That is, the transistors Q101, Q 102, Q103 (Q111, Q112, Q113) can be formed from the n-channel type power MISFET Qpw described above (refer to FIG. 35). Further, the inter-stage matching circuit disposed to the gate electrode of the transistor Q103 contained in the circuit block CB102 and the drain electrode of the transistor Q102 contained the circuit block CB101 is formed of the capacitor C111 and the inductor L111. The capacitor C111 and the inductor L111 can be formed from the capacitor element MIMC (refer to FIGS. 57A and 57B and FIG. 48) and the spiral coil formed of the wiring 139A, respectively (refer to FIG. 50 and FIG. 51).

Further, the circuit blocks (first circuit block, second block) CB107, CB108, CB109, CB110, CB111, CB112, and CB113 are controlling CMOS circuits (analog circuit), which include the resistor element 111A (refer to FIG. 35), the capacitor element C (refer to FIG. 35), the n-channel type MISFET Qn (refer to FIG. 35.) and the p-channel type MISFET Qp (refer to FIG. 35.) to form switching elements, which are formed by the manufacturing method of this embodiment, as described above. Further, the controlling CMOS circuits (analog circuit) conduct a switching operation (selection) for the amplification system e for GCM and the amplification system f for DCS.

Further, the circuit block CB103 (CB106) corresponds to the chip 153 (154) described above.

Figure 58:
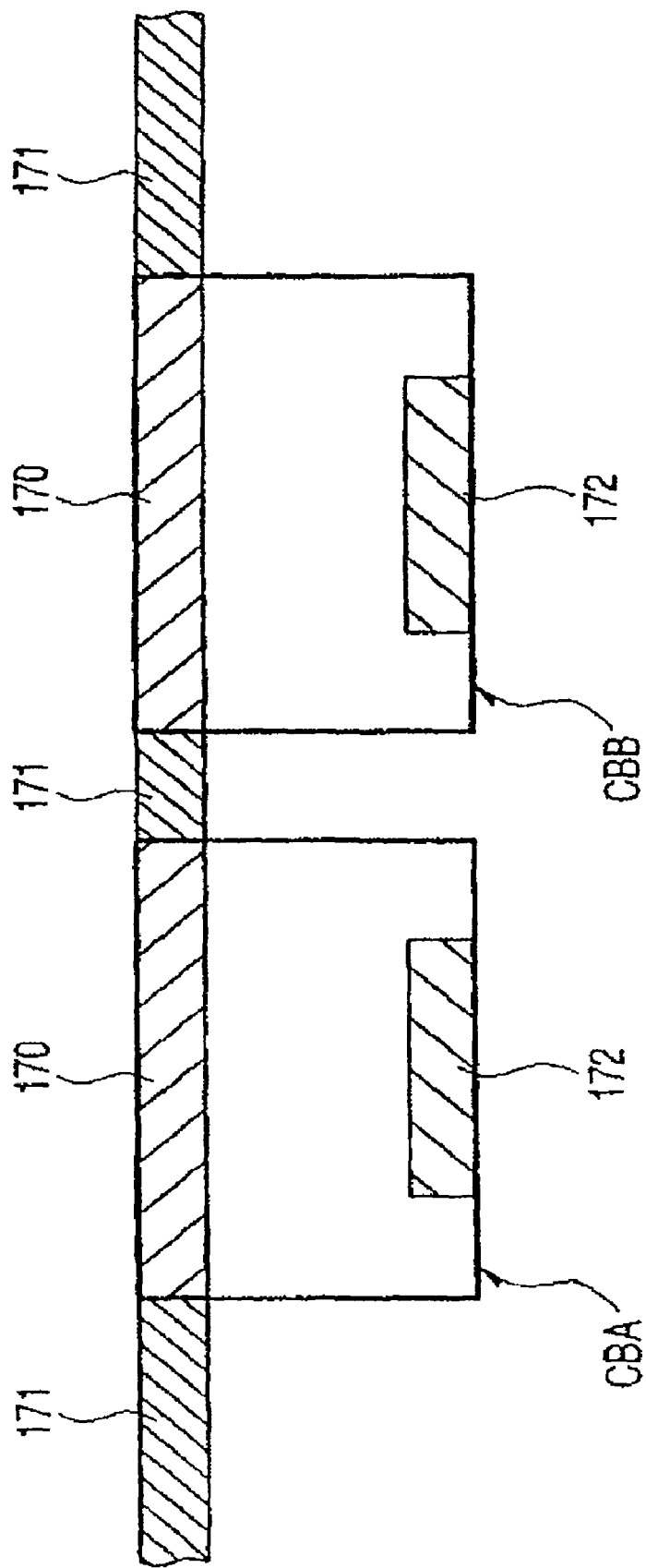
FIG. 58 is a diagram illustrating a main portion of a circuit of a high frequency power amplifier containing a semiconductor device as an embodiment according to the present invention.

FIG. 58 is a diagram showing the connection between the circuit blocks. The circuit block CBA, CBB in FIG. 58 corresponds to one of the circuit blocks CB101 to CB113 (excluding the circuit blocks CB 103, CB106), and no other circuit block is disposed between the circuit block CBA and the circuit block CBB.

As described above, in this embodiment, for the elements requiring the supply of the fixed (reference) potential (ground potential) in this embodiment, the fixed (reference) potential (ground potential) is supplied by way of the p'-semiconductor region 105 from the rear face of the substrate 101 (refer, for example, to FIG. 53 and FIG. 54). For this purpose, as shown in FIG. 58, while the wiring 171 is disposed for connecting terminals 170 for supplying the reference potential (power source potential) formed to the circuit block CBA and circuit block CBB, the wiring for connecting the ground potential supply terminal 172 formed to the circuit block CBA and the circuit block CBB over the substrate 101 can be saved. In each of the circuit blocks, a predetermined number of wirings for supplying the ground potential are formed. As a result, since extension of the wirings for electrically connecting the circuit block CBA and the circuit block CBB and supplying the ground potential to both of the circuit blocks (extension) over the substrate 101 can be saved, the size of the chip 152 formed with the semiconductor device of this embodiment (refer to FIG. 55) can be decreased.

The invention made by the present inventors has been described specifically with reference to various embodiments of the invention, but it will be apparent that the present invention is not restricted to the embodiments described above and it can be changed variously within a range not departing the gist of the invention.

The embodiment described above provides an example in which the gate length of the p-channel type MISFET is about 1 μm, but it may be about 1 μm or more.

For example, while the embodiment described above is directed to a case of electrically connecting the resistor element and the capacitor element forming the analog circuit to the electrode at the rearface of the substrate, such a connection may be taken only when it is necessary to supply a fixed potential (ground potential) to the resistor element and the capacitor element in view of the constitution of the circuit.

Further, while the embodiment described above is directed to an example of supplying the fixed potential (ground potential) to the source of the p-channel type MISFET forming the analog circuit by using the $p^{++}$-semiconductor region formed in the substrate, the fixed potential (ground potential) may be supplied to the source also by similar means in a power MISFET having a longitudinal structure (source situated above drain).

Advantageous effects obtained by representative features among the examples disclosed in the present application are described simply as below.

That is, since the lower electrodes for the resistor element and the capacitor element are formed of the first conductive film, and the gate electrode of the power MISFET, the upper electrode of the capacitor element, and the respective gate electrodes of the first MISFET of the first conduction type and the second MISFET of the second conduction type other than the power MISFET are formed of the first conductive film, the power MISFET, the resistor element, the capacitor element, the first MISFET and second MISFET of desired characteristics can be formed in one chip without increasing the number of manufacturing steps.

Since plural elements can be formed on one chip, the total number the chips to be formed with the semiconductor device can be decreased.

Since a fixed potential is supplied from the rear face of the semiconductor substrate to the element formed over the semiconductor substrate by way of the impurity layer formed to the semiconductor substrate, and it is no longer necessary to extend the wirings for supplying fixed a potential over the semiconductor substrate, whereby the size of the chip can be decreased.

What we claim is:

1. A semiconductor device comprising:
    a first capacitor element including a first lower electrode, a first upper electrode and a first insulating film formed between the first lower electrode and the first upper electrode, the first upper electrode being formed over a semiconductor substrate;
    a first interlayer insulating film formed over the first capacitor element and over the semiconductor substrate;
    an inductor formed over the first interlayer insulating film and an uppermost wiring layer among a plurality of wiring layers; and
    a second capacitor element formed over the first interlayer insulating film, the second capacitor element including a second lower electrode, a second upper electrode and a second insulating film formed between the second lower electrode and the second upper electrode,
    wherein a first circuit is arranged on the semiconductor substrate and includes the first capacitor element,
    wherein a second circuit is arranged on the semiconductor substrate and includes the second capacitor element, and the first circuit and the inductor are included in an analog circuit.

2. A semiconductor device according to claim 1, wherein the second circuit includes a first amplification stage and a second amplification stage, wherein the first amplification stage is electrically coupled to the second amplification stage through an inter-stage matching circuit, and wherein the inter-stage matching circuit includes the second capacitor element and the inductor.

3. A semiconductor device according to claim 2, wherein the first amplification stage and the second amplification stage constitutes a transmission power amplifier.

4. A semiconductor device according to claim 1, wherein a second interlayer insulating film is formed over the second upper electrode, and wherein the inductor is formed over the second interlayer insulating film.

5. A semiconductor device according to claim 4, wherein the first circuit includes an MISFET having a gate electrode, wherein the second circuit constitutes a transmission power amplifier and includes a power MISFET having a gate electrode, and wherein a gate length of the MISFET is greater than a gate length of the power MISFET.

6. A semiconductor device according to claim 1, wherein a thickness of the second insulating film is greater than a thickness of the first insulating film.

7. A semiconductor device according to claim 1, wherein each of the second lower electrode and the second upper electrode includes a metal film.

8. A semiconductor device comprising:

a first capacitor element including a first lower electrode, a first upper electrode and a first insulating film formed between the first lower electrode and the first upper electrode, the first upper electrode being formed over a semiconductor substrate;

a first interlayer insulating film formed over the first capacitor element and over the semiconductor substrate;

an inductor formed over the first interlayer insulating film and an uppermost wiring layer among a plurality of wiring layers;

a wiring line formed over the first interlayer insulating film and formed with the same level layer as the inductor;

a first insulating film formed over the inductor and the wiring line such that an opening is formed at a bonding pad area of the wiring line; and a second capacitor element formed over the first interlayer insulating film, the second capacitor element including a second lower electrode, a second upper electrode and a second insulating film formed between the second lower electrode and the second upper electrode, wherein a first circuit is arranged on the semiconductor substrate and includes the first capacitor element, wherein a second circuit is arranged on the semiconductor substrate and includes the second capacitor element, and wherein the first circuit and the inductor are included in an analog circuit.

9. A semiconductor device according to claim 8, wherein the second circuit includes a first amplification stage and a second amplification stage, wherein the first amplification stage is electrically coupled to the second amplification stage through an inter-stage matching circuit, and wherein the inter-stage matching circuit includes the second capacitor element and the inductor.

10. A semiconductor device according to claim 9, wherein the first amplification stage and the second amplification stage constitutes a transmission power amplifier.

11. A semiconductor device according to claim 8, wherein a second interlayer insulating film is formed over the second upper electrode, and wherein the inductor is formed over the second interlayer insulating film.

12. A semiconductor device according to claim 11, wherein the first circuit includes an MISFET having a gate electrode, wherein the second circuit constitutes a transmission power amplifier and includes a power MISFET having a gate electrode, wherein a gate length of the MISFET is greater than a gate length of the power MISFET.

13. A semiconductor device according to claim 8, wherein a thickness of the second insulating film is greater than a thickness of the first insulating film.

14. A semiconductor device according to claim 8, wherein each of the second lower electrode and the second upper electrode includes a metal film.

* * * * *